US008609257B2

(12) United States Patent
Ise et al.

(10) Patent No.: US 8,609,257 B2
(45) Date of Patent: Dec. 17, 2013

(54) ORGANIC ELECTROLUMINESCENCE DEVICE

(75) Inventors: Toshihiro Ise, Kanagawa (JP); Tetsu Kitamura, Kanagawa (JP); Saki Takada, Kanagawa (JP); Toru Watanabe, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 13/387,913

(22) PCT Filed: Jul. 30, 2010

(86) PCT No.: PCT/JP2010/063434
§ 371 (c)(1),
(2), (4) Date: Jan. 30, 2012

(87) PCT Pub. No.: WO2011/013859
PCT Pub. Date: Feb. 3, 2011

(65) Prior Publication Data
US 2012/0126691 A1    May 24, 2012

(30) Foreign Application Priority Data

Jul. 31, 2009  (JP) .................. 2009-180225
Sep. 25, 2009  (JP) .................. 2009-221664

(51) Int. Cl.
*H01L 51/54* (2006.01)
*C09K 11/06* (2006.01)

(52) U.S. Cl.
USPC ...... 428/690; 428/917; 548/103; 252/301.16; 313/504; 313/506; 257/40; 257/103; 257/E51.044; 257/E51.051

(58) Field of Classification Search
None
See application file for complete search history.

(56) References Cited

U.S. PATENT DOCUMENTS

| 2002/0028329 | A1* | 3/2002 | Ise et al. .............. 428/336 |
| 2004/0086745 | A1 | 5/2004 | Iwakuma et al. |
| 2005/0127823 | A1 | 6/2005 | Iwakuma et al. |
| 2005/0221124 | A1 | 10/2005 | Hwang et al. |
| 2005/0249976 | A1 | 11/2005 | Iwakuma et al. |
| 2006/0020136 | A1 | 1/2006 | Hwang et al. |
| 2006/0115680 | A1 | 6/2006 | Hwang et al. |
| 2006/0186796 | A1* | 8/2006 | Yabe et al. ............. 313/504 |
| 2007/0190359 | A1 | 8/2007 | Knowles et al. |
| 2007/0231503 | A1 | 10/2007 | Hwang et al. |
| 2008/0107919 | A1 | 5/2008 | Hwang et al. |
| 2008/0145699 | A1 | 6/2008 | Yabe et al. |
| 2008/0297033 | A1 | 12/2008 | Knowles et al. |
| 2010/0141125 | A1 | 6/2010 | Otsu et al. |
| 2010/0141126 | A1 | 6/2010 | Otsu et al. |
| 2011/0073849 | A1 | 3/2011 | Knowles et al. |
| 2011/0309338 | A1 | 12/2011 | Iwakuma et al. |

FOREIGN PATENT DOCUMENTS

| JP | 2005-290000 A | 10/2005 |
| JP | 2007-88433 A | 4/2007 |
| JP | 2008-147354 A | 6/2008 |
| JP | 2008-311608 A | 12/2008 |
| JP | 2009-099783 A | 5/2009 |
| JP | 2009-102533 A | 5/2009 |
| JP | 2009-141339 A | 6/2009 |
| JP | 2009-526071 A | 7/2009 |
| JP | 2009-266927 A | 11/2009 |
| WO | 03/078541 A1 | 9/2003 |
| WO | 03/080760 A1 | 10/2003 |
| WO | 2006/067976 A1 | 6/2006 |
| WO | 2008/140069 A1 | 11/2008 |
| WO | 2008/140114 A1 | 11/2008 |
| WO | 2008/140115 A1 | 11/2008 |
| WO | 2008/143059 A1 | 11/2008 |

OTHER PUBLICATIONS

International Search Report (PCT/ISA/210) previously filed Jan. 30, 2012.
Written Opinion (PCT/ISA/237) previously filed Jan. 30, 2012.
Japanese Office Action for JPO Application No. 2009-221664.

* cited by examiner

*Primary Examiner* — Michael H Wilson
(74) *Attorney, Agent, or Firm* — Morgan, Lewis & Bockius LLP

(57) ABSTRACT

The organic electroluminescence device has, on a substrate thereof, a pair of electrodes and at least one organic layer including a light emitting layer between the electrodes, wherein the light emitting layer contains a phosphorescent complex material containing a specific monoanionic bidentate ligand and the device contains, in a layer sandwiched between the light emitting layer and a cathode, a compound represented by the following formula (1):

$$(Cz)_p\text{-L-}(A)_q \qquad (1)$$

wherein, Cz represents a substituted or unsubstituted arylcarbazolyl or carbazolylaryl, L represents a single bond or a substituted or unsubstituted arylene, cycloalkylene, or aromatic heterocycle, A represents a substituted or unsubstituted nitrogen-containing 6-membered aromatic heterocycle, and each of p and q independently represents an integer from 1 to 6.

10 Claims, 1 Drawing Sheet

ORGANIC ELECTROLUMINESCENCE DEVICE

TECHNICAL FIELD

The present invention relates to an organic electroluminescence device (hereinafter, referred to also as "a device" or "an organic EL device"), and more specifically, an organic electroluminescence device which is excellent in durability at high luminance intensity.

BACKGROUND ART

Research and development of organic electroluminescence devices has been actively conducted in recent years because highly luminescent emission is obtained from these devices with low-voltage driving. In general, organic electroluminescence devices are constituted of an organic layer including a light-emitting layer, and a pair of electrodes between which the organic layer is sandwiched, and electrons injected from the cathode are recombined with holes injected from the anode in the light-emitting layer, to produce excitons, whose energy is utilized to luminescence.

Improvement in the efficiency of devices has recently made by using a phosphorescent materials. For instance, an organic electroluminescence device using iridium complexes or platinum complexes or the like as a phosphorescent material and therefore having improved luminous efficiency and heat resistance have been studied.

In addition, dope type devices using a light emitting layer obtained by doping a light emitting material in a host material have been adapted widely.

US 2008-297033 describes an invention using a condensed-ring type phosphorescent material with a view to obtaining a device capable of emitting blue light, having excellent durability, having a sharp emission spectrum, and low power consumption. However, such devices using the condensed-ring type phosphorescent material has a low external quantum efficiency.

On the other hand, development of host materials has been active. For instant, JP-A-2009-99783 discloses an invention using a condensed-ring type polycyclic aromatic material as a host material in order to fabricate a device with high efficiency and long lifespan. JP-A-2009-99783 also describes an invention using an electron transporting material having a carbazole structure. According to it, however, introduction of materials which can produce an unstable oxidized species having carbazolyl groups is not preferred because it leads to shortening of the lifespan of the device.

In addition, the conventional devices are required further improvement because they do not have a sufficient luminous efficiency and moreover, the luminous efficiency may depend on the thickness of their electron transporting layer.

As described in JP-A-2009-99783, it is known that the use of materials which can produce an unstable oxidized species having carbazolyl groups is unfavorable to durability of devices. In light of such common knowledge, embodiments of the present invention couldn't be expected to have effects on durability improvements.

In addition, conventional devices do not have a sufficient luminous efficiency and moreover, the luminous efficiency may depend on the thickness of the electron transporting layer so that they are required for further improvement.

The present inventors have however found that when a host material containing carbazolyl group according to the invention is used in combination with a specified condensed-ring type phosphorescent material, a device excellent in luminous efficiency can be obtained and moreover, dependence of the luminous efficiency on the film thickness of the electron transporting layer can be reduced.

SUMMARY OF INVENTION

An object of the invention is therefore to provide an organic electroluminescence device having an excellent luminous efficiency and has a small dependence of the luminous efficiency on the thickness of the electron transporting layer.

Another object of the invention is to provide a light emission apparatus having such an organic electroluminescence device.

The invention has been accomplished by the following means.

[1]

An organic electroluminescence device having, on a substrate, a pair of electrodes and at least one organic layer including a light emitting layer between the electrodes;

wherein the light emitting layer includes a metal having a molecular weight of 40 or greater and a phosphorescent metal complex containing a monoanionic bidentate ligand represented by the following formulas (A1) to (A4), and wherein the organic electroluminescence device further has another organic layer between the light emitting layer and a cathode, the another organic layer containing a compound represented by the following formula (1).

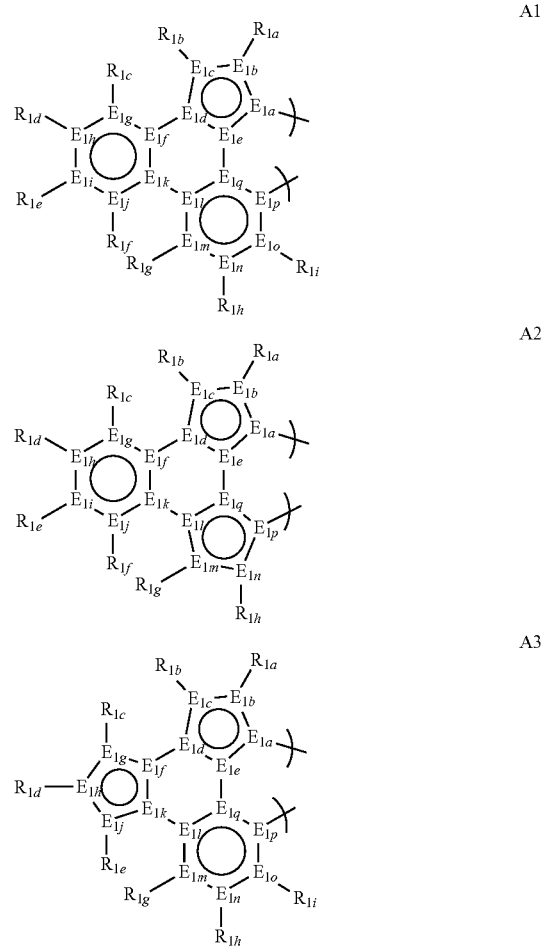

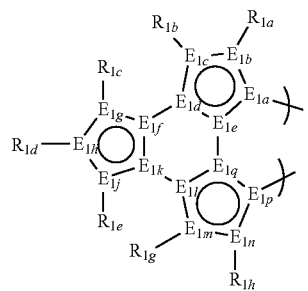

A4

(Each of $E_{1a}$ to $E_{1q}$; independently represents a carbon atom or a hetero atom, and each of $R_{1a}$ to $R_{1i}$ independently represents a hydrogen atom or a substituent.)

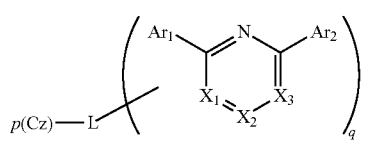
(1)

(wherein Cz represents a substituted or unsubstituted arylcarbazolyl group or a substituted or unsubstituted carbazolylaryl group, L represents a single bond, a substituted or unsubstituted arylene group, a substituted or unsubstituted cycloalkylene group, or a group derived from a substituted or unsubstituted heteroaromatic ring, A represents a group derived from a substituted or unsubstituted nitrogen-containing heteroaromatic 6-membered ring, and each of p and q independently represents an integer from 1 to 6.)

[2]

The organic electroluminescence device according to [1], wherein the compound represented by the formula (1) is a compound represented by the following formula (2).

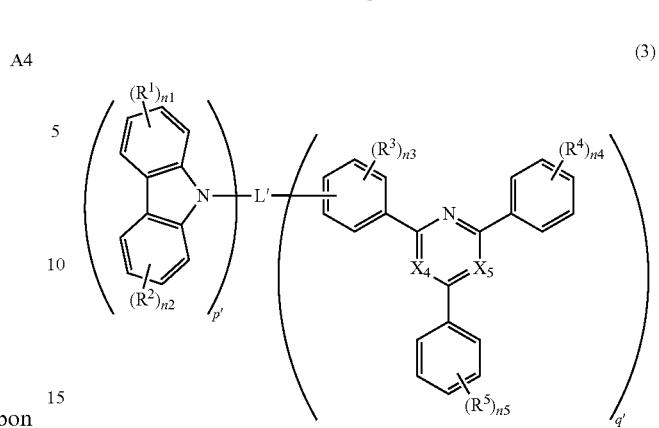
(2)

(Cz represents a substituted or unsubstituted arylcarbazolyl group or a substituted or unsubstituted carbazolylaryl group; L represents a single bond, a substituted or unsubstituted arylene group, a substituted or unsubstituted cycloalkylene group, or a group derived from a substituted or unsubstituted heteroaromatic ring, and L is linked to the carbon atom in $Ar_1$, $Ar_2$, $X_1$, $X_2$ or $X_3$; each of $Ar_1$ and $Ar_2$ independently represents a substituted or unsubstituted aryl group, a substituted or unsubstituted arylene group, or a group derived from a substituted or unsubstituted heteroaromatic ring; each of $X_1$, $X_2$ and $X_3$ independently represents a nitrogen atom or a carbon atom which may have a substituent; and each of p and q independently represents an integer from 1 to 6.)

[3]

The organic electroluminescence device according to [1], wherein the compound represented by the formula (1) is a compound represented by the following formula (3).

(3)

Each of $X_4$ and $X_5$ independently represents a nitrogen atom or a carbon atom which may have a substituent, provided that either $X_4$ or $X_5$ represents a nitrogen atom and the other represents a carbon atom which may have a substituent; L' represents a single bond, a substituted or unsubstituted arylene group, a substituted or unsubstituted cycloalkylene group, or a group derived from a substituted or unsubstituted heteroaromatic ring; each of $R^1$ to $R^5$ independently represents a substituent; each of n1 to n5 independently represents an integer from 0 to 5; and each of p' and q' independently represents an integer from 1 to 4.

[4]

The organic electroluminescence device according to [1], wherein the phosphorescent metal complex has the metal having a molecular weight of 40 or greater and a monoanionic bidentate ligand represented by the following formula (A1-1) or (A1-2).

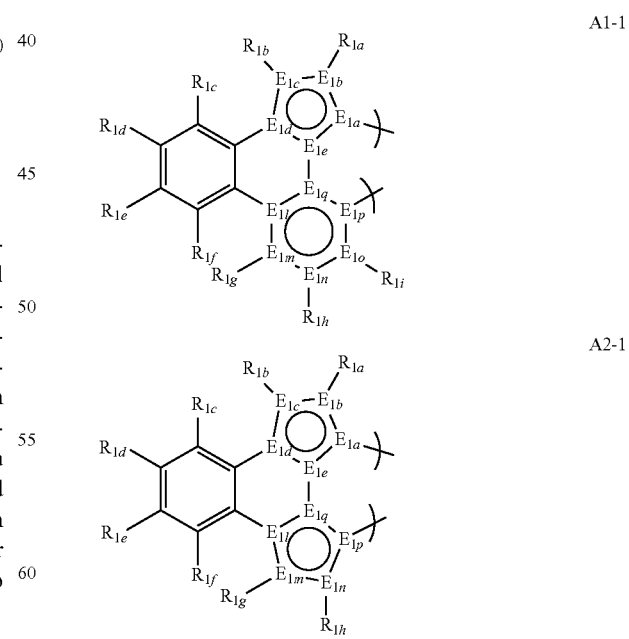

(Each of $E_{1a}$ to $E_{1q}$ independently represents a carbon atom or a hetero atom and each of $R_{1a}$ to $R_{1i}$ independently represents a hydrogen atom or a substituent.)

[5]

The organic electroluminescence device according to [4], wherein the phosphorescent complex material comprises the metal having a molecular weight of 40 or greater and a monoanionic bidentate ligand represented by the following formula (A1-2) or (A2-2).

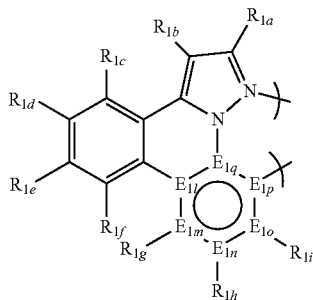

A1-2

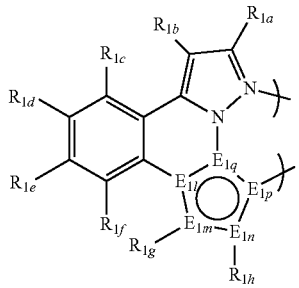

A2-2

(Each of $E_{1a}$ to $E_{1q}$ independently represents a carbon atom or a hetero atom and each of $R_{1a}$ to $R_{1i}$ independently represents a hydrogen atom or a substituent.)

[6]

The organic electroluminescence device according to [5], wherein the phosphorescent complex material has the metal having a molecular weight of 40 or greater and a monoanionic bidentate ligand represented by the following formula (A1-3) or (A2-3).

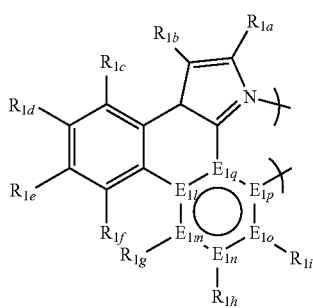

A1-3

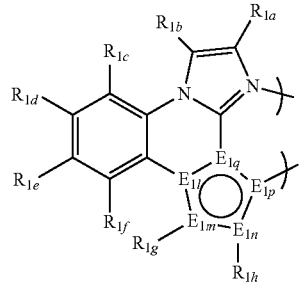

A2-3

(Each of $E_{1a}$ to $E_{1q}$ independently represents a carbon atom or a hetero atom and each of $R_{1a}$ to $R_{1i}$ independently represents a hydrogen atom or a substituent.)

[7]

The organic electroluminescence device according to [6], wherein the phosphorescent metal complex is an iridium complex represented by the following formula (A9).

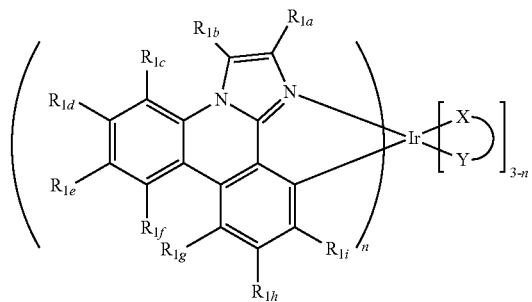

A9

(Each of $R_{1a}$ to $R_{1i}$ independently represents a hydrogen atom or a substituent, X-Y represents a monoanionic bidentate ligand, and n stands for an integer from 1 to 3.)

[8]

The organic electroluminescence device according to any one of [1] to [7], wherein the compound represented by the formula (1) is composed only of a carbon atom, a hydrogen atom, and a nitrogen atom.

[9]

The organic electroluminescence device according to any one of [1] to [8], wherein a molecular weight of the compound represented by the formula (1) is from 450 to 800.

[10]

The organic electroluminescence device according to any one of [1] to [9], wherein the compound represented by the formula (1) has the lowest triplet excited state $T_1$ energy of from 2.61 eV to 3.51 eV in a film state.

[11]

The organic electroluminescence device according to any one of [1] to [10], wherein the compound represented by the formula (1) is contained in a layer adjacent to the light emitting layer.

[12]

The organic electroluminescence device according to any one of [1] to [11], having a maximum emission wavelength of from 400 nm to 465 nm.

[13]
The organic electroluminescence device according to any one of [1] to [12], wherein the content of a light emitting material in the light emitting layer is from 10 to 30% by mass.

[14]
A laminated film obtained by laminating a thin film, which contains a phosphorescent metal complex containing a monoanionic bidentate ligand represented by the formulas (A1) to (A4) and a metal having a molecular weight of 40 or greater, and a thin film containing the compound represented by the formula (1).

[15]
A light emission apparatus using the organic electroluminescence device as claimed in any one of [1] to [13].

[16]
A display apparatus using the organic electroluminescence device as claimed in any one of [1] to [13].

An illumination apparatus using the organic electroluminescence device as claimed in any one of claims [1] to [13].

Advantage of the Invention

The invention can provide an organic electroluminescence device having an excellent luminous efficiency and having a small dependence of the luminous efficiency on the thickness of an electron transporting layer.

DESCRIPTION OF EMBODIMENTS

Figure 1:
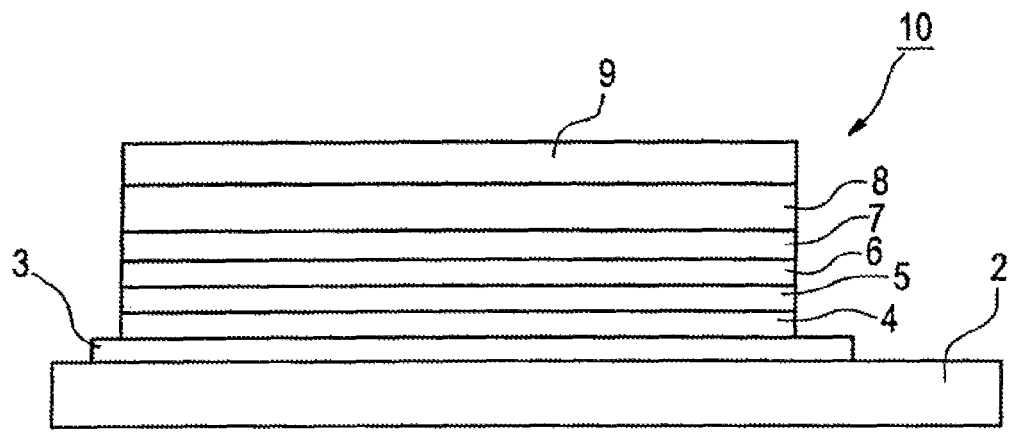
FIG. 1 is a schematic diagram showing an example of a layer structure of the organic EL device relating to a first embodiment of the invention.

The expression "hydrogen atom" in the description of the formulas of the invention includes isotopes thereof (such as a deuterium atom) and "atoms", which constitute a substituent, is intended to also include isotopes thereof.

In the invention, the expression "the number of carbon atoms" in a substituent such as an alkyl group is used in the sense that the substituent may further have other substituents and the carbon atoms contained in the other substituents are also counted as the carbon atoms of the substituent.

And the term "heteroalkyl group" refers to the alkyl group at least one carbon atom of which is replaced with O, NR or S.

The organic electroluminescence device of the invention contains a pair of electrodes on a substrate and, at least one organic layer including a light emitting layer is sandwiched between these electrodes, wherein the light emitting layer contains a phosphorescent complex material containing a monoanionic bidentate ligand represented by the following formulas (A1) to (A4) and a metal having a molecular weight of 40 or more, and wherein any of the organic layers contains a compound represented by the formula (1) described below.

An organic electroluminescence device having an excellent luminous efficiency and a small dependence of the luminous efficiency on the film thickness of an electron transporting layer can be obtained using a phosphorescent complex material containing a monoanionic bidentate ligand represented by the formulas (A1) to (A4) and a metal having a molecular weight of 40 or more (which complex may hereinafter be called "specified phosphorescent complex material").

When a light emitting layer containing the phosphorescent metal complex of the invention having a ligand represented by the formulas (A1) to (A4) and an electron transporting layer containing the compound of the invention represented by the formula (1) are used in combination, diffusion of an excitation energy generated in the light emitting layer can be prevented due to a high level of the lowest triplet excited state energy ($T_1$ energy) of the compound represented by the formula (1), leading to improvement in luminous efficiency. Further, the light emitting layer containing the phosphorescent complex material having a ligand represented by the formula (A1) to (A4) is presumed to achieve a good balance between holes and electrons when electrons are injected from a certain energy level. The conduction level of the electrons of a layer adjacent to the light emitting layer which are injected thereinto is important for controlling the carrier balance. On the other hand, the emission spectrum of the device tends to depend greatly on the carrier balance because wavelength enhanced by interference is determined by a light emitting position. It is therefore known that a change in spectrum occurs with a change in the thickness of an electron transporting layer. In the compound of the invention represented by the formula (1), an energy level at which electrons are effectively injected is presumed to coincide with a level at which the carrier balance of the light emitting layer of the invention can be controlled. As a result, the spectrum undergoes almost no change even with a change in the thickness of the electron transporting layer.

The bidentate ligands represented by the following formulas (A1) to (A4) will next be described.

[Bidentate Ligands Represented by the Formulas (A1) to (A4)]

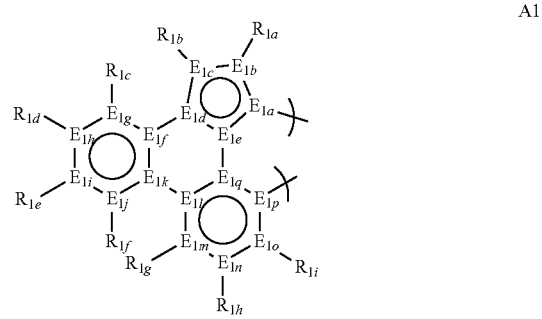

A1

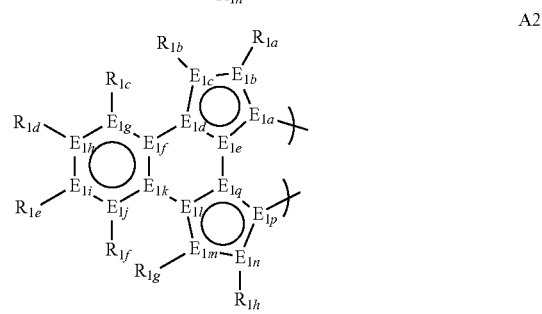

A2

-continued

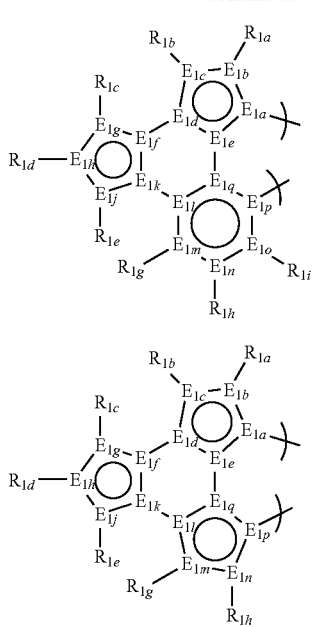

In the formulas (A1) to (A4), each of $E_{1a}$ to $E_{1q}$ independently represents a carbon atom or a hetero atom, and each of $R_{1a}$ to $R_{1i}$ independently represents a hydrogen atom or a substituent).

The bidentate ligand may be coupled to another ligand to form a tridentate, tetradentate, pentadentate, or hexadentate ligand.

$E_{1a}$ to $E_{1q}$ are selected from a carbon atom or hetero atoms, preferably a carbon atom or a nitrogen atom. $E_{1a}$ to $E_{1p}$ are preferably atoms different from each other. The metal complex has an $18\pi$ electron structure.

The ring composed of $E_{1a}$ to $E_{1q}$ represents a 5-membered heterocycle, more specifically, oxazole, thiazole, isoxazole, isothiazole, pyrrole, imidazole, pyrazole, triazole, or tetrazole, preferably imidazole or pyrazole, more preferably imidazole.

Each of the ring composed of $E_{1f}$ to $E_{1k}$ and the ring composed of $E_{1l}$ to $E_{1q}$ is independently selected from 6-membered aromatic hydrocarbon rings and 5- or 6-membered heterocycles, for instance, benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine.

Each of $R_{1a}$ to $R_{1i}$ is independently selected from substituent group Z which will be described later and is preferably a hydrogen atom, a hydrocarbon substituent, a cyano group, a fluoro group, $OR_{2a}$, $SR_{2a}$, $NR_{2a}R_{2b}$, $BR_{2a}R_{2b}$, or $SiR_{2a}R_{2b}R_{2c}$. Each of $R_{2a}$ to $R_{2c}$ independently represents a hydrocarbon substituent or a hydrocarbon substituent substituted with a hetero atom. Any two of $R_{1a}$ to $R_{1i}$ and $R_{2a}$ to $R_{2c}$ may be coupled to each other to form a saturated or unsaturated, aromatic or non-aromatic ring. When coupled to a nitrogen atom, each of $R_{1a}$ to $R_{1i}$ does not represent a hydrogen atom.

The term "heteroatom" as used herein means an atom other than a carbon atom and a hydrogen atom. Examples of the heteroatom include oxygen, nitrogen, phosphorus, sulfur, selenium, arsenic, chlorine, bromine, silicon, and fluorine.

Specific examples of substituents belonging to substituent group Z include alkyl groups, alkenyl groups, alkynyl groups, aryl groups, heteroaryl groups, amino groups, alkoxy groups, aryloxy groups, heterocyclic oxy groups, acyl groups, alkoxycarbonyl groups, aryloxycarbonyl groups, acyloxy groups, acylamino groups, alkoxycarbonylamino groups, aryloxycarbonylamino groups, sulfonylamino groups, sulfamoyl groups, carbamoyl groups, alkylthio groups, arylthio groups, heteroarylthio groups, sulfonyl groups, sulfinyl groups, ureido groups, phosphoric acid amide groups, a hydroxy group, a mercapto group, halogen groups, a cyano group, a sulfo group, a carboxyl group, a nitro group, a hydroxamic acid group, a sulfino group, a hydrazino group, an imino group, and heterocyclic groups other than heteroaryl groups, silyl groups, silyloxy groups, and deuterium. These substituents may be substituted further with another substituent.

The alkyl groups are preferably $C_{1-30}$, more preferably $C_{1-20}$, especially preferably $C_{1-10}$ alkyl groups. Examples include methyl group, ethyl group, n-propyl group, isopropyl group, n-butyl group, tert-butyl group, n-octyl group, n-nonyl group, n-decyl group, n-dodecyl group, n-octadecyl group, n-hexadecyl, cyclopropyl, cyclobutyl, cyclopentyl, cyclohexyl, cyclooctyl, 1-adamantyl, and trifluoromethyl.

The alkenyl groups are preferably $C_{2-30}$, more preferably $C_{2-20}$, especially preferably $C_{2-10}$ alkenyl groups. Examples include vinyl, allyl, 1-propenyl, 1-isopropenyl, 1-butenyl, 2-butenyl, and 3-pentenyl.

The alkynyl groups are preferably $C_{2-30}$, more preferably $C_{2-20}$, especially preferably $C_{2-10}$ alkynyl groups. Examples include ethynyl, propargyl, 1-propinyl, and 3-pentynyl.

The term "aryl group" means an aromatic hydrocarbon monoradical. When the aryl group is substituted, preferred examples of the substituent include a fluoro group, a hydrocarbon substituent, a hetero-substituted hydrocarbon substituent, and a cyano group. The aryl groups are preferably $C_{6-30}$, more preferably $C_{6-20}$, especially preferably $C_{6-12}$ aryl groups. Examples include phenyl, o-methylphenyl, m-methylphenyl, p-methylphenyl, 2,6-xylyl, p-cumenyl, mesityl, naphthyl, and anthranyl.

The term "heteroaryl group" means an aromatic heterocyclic monoradical. When it is substituted, preferred examples of the substituent include a fluoro group, a hydrocarbon substituent, a hetero-substituted hydrocarbon substituent, and a cyano group. Examples of the heterocyclic group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzthiazolyl, carbazolyl, and azepinyl.

The amino groups are preferably $C_{0-30}$, more preferably $C_{0-20}$, especially preferably $C_{0-10}$ amino groups. Examples include amino, methylamino, dimethylamino, diethylamino, dibenzylamino, diphenylamino, and ditolylamino. The alkoxy groups are preferably $C_{1-30}$, more preferably $C_{1-20}$, especially preferably $C_{1-10}$ alkoxy groups. Examples include methoxy, ethoxy, butoxy, and 2-ethylhexyloxy.

The aryloxy groups are preferably $C_{6-30}$, more preferably $C_{6-20}$, especially preferably $C_{6-12}$ aryloxy groups. Examples include phenyloxy, 1-naphthyloxy, and 2-naphthyloxy.

The heterocyclic oxy groups are preferably $C_{1-30}$, more preferably $C_{1-20}$, especially preferably $C_{1-12}$ heterocyclic oxy groups. Examples include pyridyloxy, pyrazyloxy, pyrimidyloxy, and quinolyloxy.

The acyl groups are preferably $C_{2-30}$, more preferably $C_{2-20}$, especially preferably $C_{2-12}$ acyl groups. Examples include acetyl, benzoyl, formyl, and pivaloyl.

The alkoxycarbonyl groups are preferably $C_{2-30}$, more preferably $C_{2-20}$, especially preferably $C_{2-12}$ alkoxycarbonyl groups. Examples include methoxycarbonyl and ethoxycarbonyl.

The aryloxycarbonyl groups are preferably $C_{7-30}$, more preferably $C_{7-20}$, especially preferably $C_{7-12}$ aryloxycarbonyl groups. Examples include phenyloxycarbonyl.

The acyloxy groups are preferably $C_{2-30}$, more preferably $C_{2-20}$, especially preferably $C_{2-10}$ acyloxy groups. Examples include acetoxy and benzoyloxy.

The acylamino groups are preferably $C_{2-30}$, more preferably $C_{2-20}$, especially preferably $C_{2-10}$ acylamino groups. Examples include acetylamino and benzoylamino.

The alkoxycarbonylamino groups are preferably $C_{2-30}$, more preferably $C_{2-20}$, especially preferably $C_{2-12}$ alkoxycarbonylamino groups. Examples include methoxycarbonylamino.

The aryloxycarbonylamino groups are preferably $C_{7-30}$, more preferably $C_{7-20}$, especially preferably $C_{7-12}$ aryloxycarbonylamino groups. Examples include phenyloxycarbonylamino.

The sulfonylamino groups are preferably $C_{1-30}$, more preferably $C_{1-20}$, especially preferably $C_{1-12}$ sulfonylamino groups. Examples include methanesulfonylamino and benzenesulfonylamino.

The sulfamoyl groups are preferably $C_{0-30}$, more preferably $C_{0-20}$, especially preferably $C_{0-12}$ sulfamoyl groups. Examples include sulfamoyl, methylsulfamoyl, dimethylsulfamoyl, and phenylsulfamoyl.

The carbamoyl groups are preferably $C_{1-30}$) more preferably $C_{1-20}$, especially preferably $C_{1-12}$ carbamoyl groups. Examples include carbamoyl, methylcarbamoyl, diethylcarbamoyl, and phenylcarbamoyl.

The alkylthio groups are preferably $C_{1-30}$, more preferably $C_{1-20}$, especially preferably $C_{1-12}$ alkylthio groups. Examples include methylthio and ethylthio.

The arylthio groups are preferably $C_{6-30}$, more preferably $C_{6-20}$, especially preferably $C_{6-12}$ arylthio groups. Examples include phenylthio.

The heteroarylthio groups are preferably $C_{1-30}$, more preferably $C_{1-20}$, especially preferably $C_{1-12}$ heteroarylthio groups. Examples include pyridylthio, 2-benzimidazolylthio, 2-benzoxazolylthio, and 2-benzthiazolylthio.

The sulfonyl groups are preferably $C_{1-30}$, more preferably $C_{1-20}$, especially preferably $C_{1-12}$ sulfonyl groups. Examples include mesyl, tosyl, and trifluoromethanesulfonyl.

The sulfinyl groups are preferably $C_{1-30}$, more preferably $C_{1-20}$, especially preferably $C_{1-12}$ sulfinyl groups. Examples include methanesulfinyl and benzenesulfinyl.

The ureido groups are preferably $C_{1-30}$, more preferably $C_{1-20}$, especially preferably $C_{1-12}$ ureido groups. Examples include ureido, methylureido, and phenylureido.

The phosphoric acid amide groups are preferably $C_{1-30}$, more preferably $C_{1-20}$, especially preferably $C_{1-12}$ phosphoric acid amide groups. Examples include diethylphosphoric acid amide and phenylphosphoric acid amide.

Examples of the halogen atoms include fluorine, chlorine, bromine, and iodine atoms.

The heterocyclic groups other than heteroaryl groups are preferably $C_{1-30}$, more preferably $C_{1-12}$ heterocyclic groups other than heteroaryl groups and having, as a heteroatom, a nitrogen atom, an oxygen atom, or a sulfur atom. Specific examples include piperidyl, morpholino, and pyrrolidyl.

The silyl groups are preferably $C_{3-40}$, more preferably $C_{3-30}$, especially preferably $C_{3-24}$ silyl groups. Examples include trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl, and tri-2-naphthylsilyl.

The silyloxy groups are preferably $C_{3-40}$, more preferably $C_{3-30}$, especially preferably $C_{3-24}$ silyloxy groups. Examples include trimethylsilyloxy and triphenylsilyloxy.

At least one of $R_{1a}$ to $R_{1i}$ represents preferably an aryl group. The aryl group has preferably a dihedral angle, with its main structure, of 70 degrees or greater. It is more preferably a substituent represented by the below-described formula ss-1, still more preferably a 2,6-disubstituted aryl group. In particular, $R_{ib}$ is preferably an aryl group, more preferably has a dihedral angle, with its main structure, of 70 degrees or greater, still more preferably a substituent represented by the below-described formula ss-1, most preferably a 2,6-disubstituted aryl group.

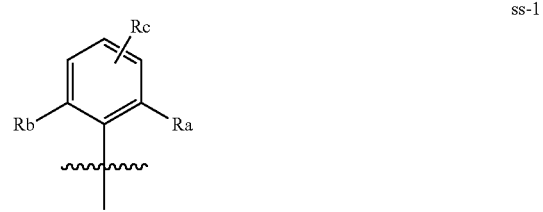

ss-1

(In the formula ss-1, each of Ra, Rb, and Rc independently represents any of a hydrogen atom, an alkyl group, and an aryl group).

The alkyl group represented by Ra, Rb, or Rc is preferably a $C_{1-30}$, more preferably $C_{1-20}$, especially preferably $C_{1-10}$ alkyl group. Examples include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl, and trifluoromethyl. Of these, methyl group and isopropyl group are preferred.

The aryl group represented by Ra, Rb, or Rc is preferably $C_{6-30}$, more preferably $C_{6-20}$, especially preferably $C_{6-12}$ aryl groups. Examples include phenyl, o-methylphenyl, m-methylphenyl, p-methylphenyl, 2,6-xylyl, p-cumenyl, mesityl, naphthyl, and anthranyl. Of these, a phenyl group is preferred.

At least one of Ra and Rb is selected from the alkyl groups and the aryl groups. It is preferred that at least one of Ra and Rb is selected from the alkyl groups, more preferred that both of Ra and Ra are selected from the alkyl groups, most preferred that both of Ra and Rb are methyl groups or isopropyl groups.

The 2,6-disubstituted aryl group is preferably 2,6-dimethylphenyl, 2,4,6-trimethylphenyl, 2,6-diisopropylphenyl, 2,4,6-triisopropylphenyl, 2,6-dimethyl-4-phenylphenyl, 2,6-dimethyl-4-(2,6-dimethylpyridin-4-yl)phenyl, 2,6-diphenylphenyl, 2,6-diphenyl-4-isopropylphenyl, 2,4,6-triphenylphenyl, 2,6-diisopropyl-4-(4-isopropylphenyl)phenyl, 2,6-diisopropyl-4-(3,5-dimethylphenyl)phenyl, 2,6-diisopropyl-4-(pyridin-4-yl)phenyl, or 2,6-di-(3,5-dimethylphenyl)phenyl On the other hand, it is preferred that at least one of $R_{1a}$ to $R_{1i}$ is an alkyl group, more preferred that $R_{1e}$ is an alkyl group. The alkyl group is preferably composed of four or more carbon atoms and branched at a site distant from the benzyl position, more preferably a methyl or neopentyl group, still more preferably a neopentyl group.

On the other hand, at least one of $R_{1a}$ and $R_{1b}$ is the alkyl group.

On the other hand, $R_{1a}$ is preferably an electron donating substituent, more preferably a methyl group.

The term "hydrocarbon substituent" means a monovalent or divalent, linear, branched, or cyclic substituent composed only of a carbon atom and a hydrogen atom. Examples of the monovalent hydrocarbon substituent include $C_{1-20}$ alkyl groups; $C_{1-20}$ alkyl groups substituted with at least one group selected from $C_{1-20}$ alkyl groups, $C_{3-8}$ cycloalkyl groups, and aryl groups; $C_{3-8}$ cycloalkyl groups; $C_{3-8}$ cycloalkyl groups substituted with at least one group selected from $C_{1-20}$ alkyl groups, $C_{3-8}$ cycloalkyl groups, and aryl groups; $C_{6-18}$ aryl groups; and aryl groups substituted with at least one group selected from $C_{1-20}$ alkyl groups, $C_{3-8}$ cycloalkyl groups, and aryl groups.

Examples of the divalent hydrocarbon group include —$CH_2$—, —$CH_2CH_2$—, —$CH_2CH_2CH_2$—, and 1,2-phenylene.

The metal is selected from nonradioactive metals having an atomic weight of 40 or greater. It is preferably any of Re, Ru, Os, Rh, Ir, Pd, Pt, Cu, and Au, more preferably Os, Ir, or Pt, still more preferably Ir or Pt. From the standpoint of high luminous efficiency, high complex stability, and control of a carrier balance upon hole/electron transporting in the light emitting layer, Ir is the most preferred.

In the invention, the metal complex having the ligand of the formula may be composed of a main ligand or a tautomer thereof and an ancillary ligand or a tautomer thereof. When n=0, all the ligands of the metal complex may be composed of a partial structure represented by the main ligand or tautomer thereof.

The metal complex may contain, as an ancillary ligand, ligands used for the formation of conventionally known metal complexes and known, as a so-called ligand, to those skilled in the art (which may also be called "coordination compounds") as needed.

In order to successfully gain the advantage described in the invention, the complex contains preferably one or two ligands, more preferably one ligand. When a reactive group is introduced into the molecule of the complex, using two ligands is also preferred from the standpoint of ease of synthesis.

As the ligands used for the formation of conventionally known metal complexes, there are various known ligands. Examples include those described in H. Yersin, *Photochemistry and Photophysics of Coordination Compounds*, Springer-Verlag A. G (1987) and Akio Yamamoto, *Organometallic Chemistry-Fundamental and Application*-Shokabo Publishing Co., Ltd. (1982) (for instance, halogen ligands, preferably a chlorine ligand, nitrogen-containing heteroaryl ligands such as bipyridyl and phenanthroline, and diketone ligands such as acetylacetone). Of these, diketones and picolinic acid derivatives are preferred.

The following are specific examples of the ancillary ligand but the present invention is not limited thereto.

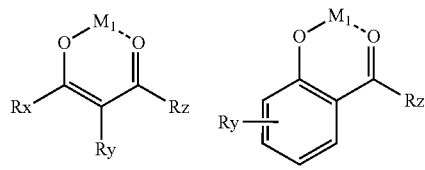

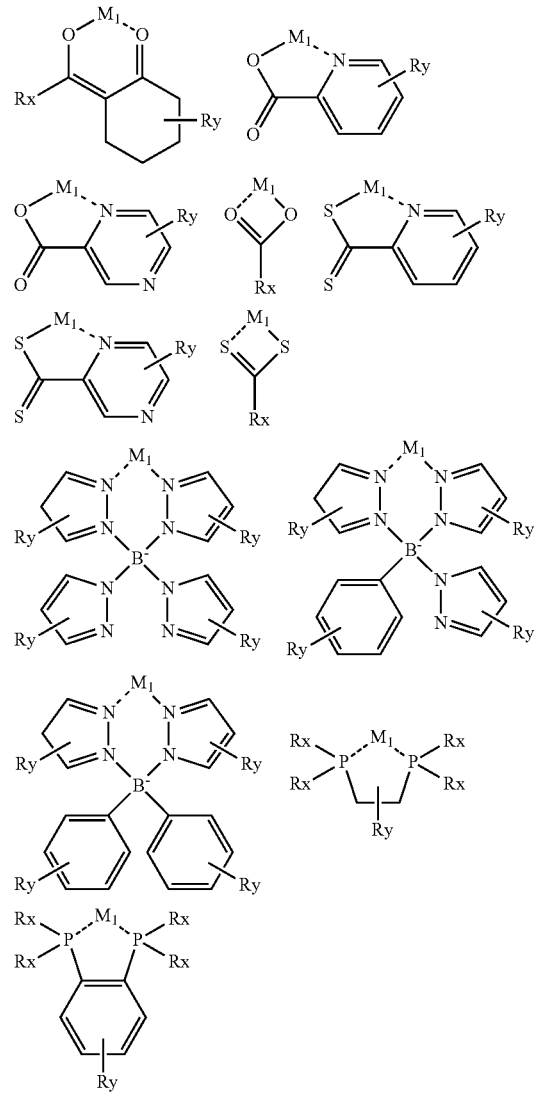

In the above examples of the ancillary ligand, $M_1$ represents a metal atom having a molecular weight of 40 or greater and each of Rx, Ry, and Rz independently represents a hydrogen atom or a substituent.

The monoanionic bidentate ligands represented by the formulas (A1) to (A4) is preferably monoanionic bidentate ligands represented by the following formula (A1) or (A2).

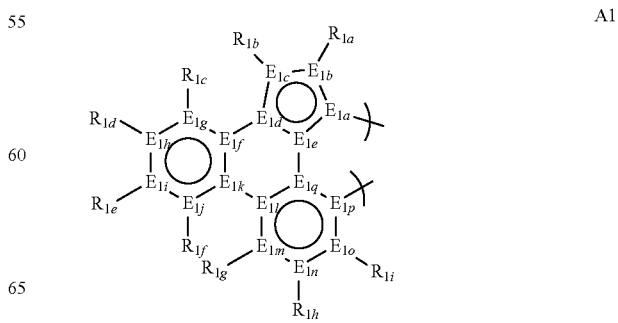

A1

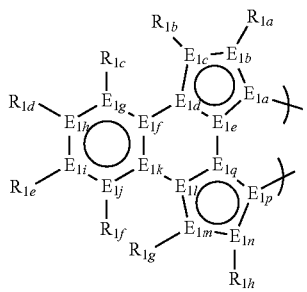

A2

(In the formulas (A1) and (A2), each of $E_{1a}$ to $E_{1q}$ independently represents a carbon atom or a hetero atom and each of $R_{1a}$ to $R_{1i}$ independently represents a hydrogen atom or a substituent).

The monoanionic bidentate ligands represented by the formula (A1) and (A2) are preferably monoanionic bidentate ligands represented by the following formulas (A1-1) and (A2-1):

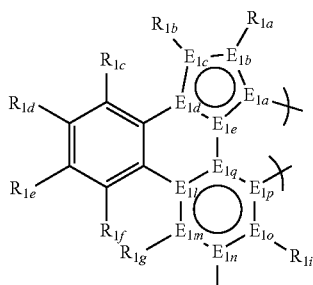

A1-1

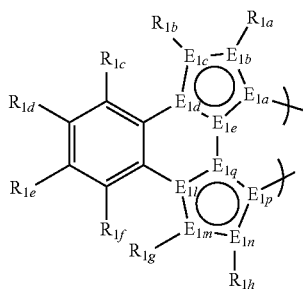

A2-1

(In the formulas (A1-1) and (A2-1), each of $E_{1a}$ to $E_{1e}$, $E_{1o}$ to $E_{1q}$, and $E_{1l}$ to $E_{1n}$ independently represents a carbon atom or a hetero atom and each of $R_{1a}$ to $R_{1i}$ independently represents a hydrogen atom or a substituent).

In the formulas (A1-1) and (A2-1), $E_{1a}$ to $E_{1e}$, $E_{1o}$ to $E_{1q}$, $E_{1l}$ to $E_{1n}$, and $R_{1a}$ to $R_{1i}$ respectively have the same meanings as $E_{1a}$ to $E_{1e}$, $E_{1o}$ to $E_{1q}$, $E_{1l}$ to $E_{1n}$, and $R_{1a}$ to $R_{1i}$ defined in the formulas (A1) and (A2). Preferred ranges of them are also the same.

The monoanionic bidentate ligands represented by the formulas (A1-1) and (A2-1) are preferably monoanionic bidentate ligands represented by the following formulas (A1-2) and (A2-2).

A1-2

A2-2

(In the formulas (A1-2) and (A2-2), each of $E_{1o}$ to $E_{1q}$ and $E_{1l}$ to $E_{1n}$ independently represents a carbon atom or a hetero atom and each of $R_{1a}$ to $R_{1i}$ independently represents a hydrogen atom or a substituent).

In the formulas (A1-2) and (A2-2), $E_{1o}$ to $E_{1q}$, $E_{1l}$ to $E_{1n}$ and $R_{1a}$ to $R_{1i}$ respectively have the same meanings as $E_{1o}$ to $E_{1q}$, $E_{1l}$ to $E_{1n}$, and $R_{1a}$ to $R_{1i}$ defined in the formulas (A1-1) and (A2-1). Preferred ranges of them are also the same.

The monoanionic bidentate ligands represented by the formulas (A1-1) and (A2-1) are preferably monoanionic bidentate ligands represented by the following formulas (A1-3) and (A2-3).

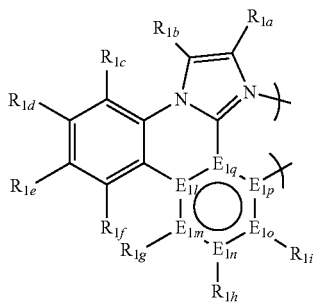

A1-3

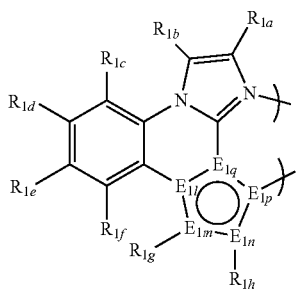

A2-3

(In the formulas (A1-3) and (A2-3), each of $E_{1o}$ to $E_{1q}$ and $E_{1l}$ to $E_{1n}$ independently represents a carbon atom or a hetero atom and each of $R_{1a}$ to $R_{1i}$ independently represents a hydrogen atom or a substituent).

In the formulas (A1-3) and (A2-3), $E_{1o}$ to $E_{1q}$, $E_{1l}$ to $E_{1n}$, and $R_{1a}$ to $R_{1i}$ respectively have the same meanings as $E_{1o}$ to $E_{1q}$, $E_{1l}$ to $E_{1n}$, and $R_{1a}$ to $R_{1i}$ defined in the formulas (A1-1) and (A2-1). Preferred ranges of them are also the same.

A phosphorescent metal complex containing the monoanionic bidentate ligands represented by the formula (A1-3) or (A2-3) and the metal having a molecular weight of 40 or greater is preferably a phosphorescent metal complex represented by the formula (A9).

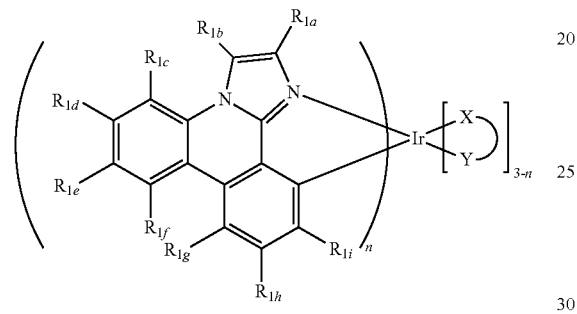

A9

(In the formula (A9), each of $R_{1a}$ to $R_{1i}$ independently represents a hydrogen atom or a substituent, X-Y represents an ancillary ligand, and n stands for an integer from 1 to 3).

In the formula (A9), $R_{1a}$ to $R_{1i}$ respectively have the same meanings as $R_{1a}$ to $R_{1i}$ defined in the formulas (A1-3) and (A2-3) and preferred ranges of them are also the same.

X-Y represents an ancillary ligand and n stands for an integer from 1 to 3, preferably 3. As the ancillary ligand, ligands similar to those described above in the specific examples are used suitably. Preferred examples include acetylacetonate ligands and substituted acetylacetonate ligand analogs.

The metal complex represented by the formula (A9) is a metal complex represented by the formula (A10).

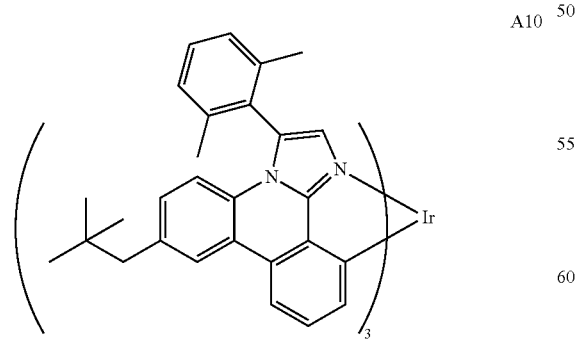

A10

More specifically, the formula (A1) or (A2) has preferably the following structures, the most preferably the following structures (X-64) to (X-68).

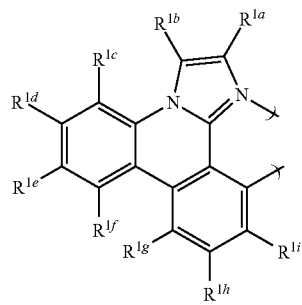

X-1

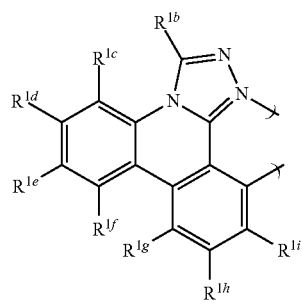

X-2

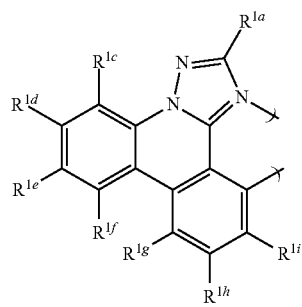

X-3

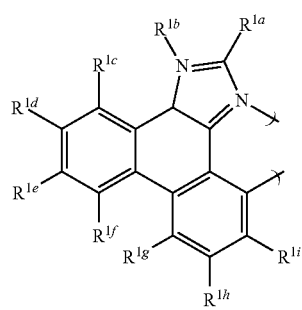

X-4

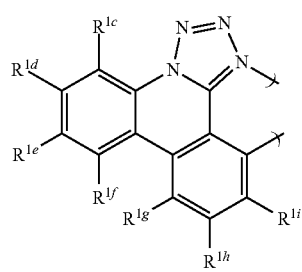

X-5

-continued
X-6
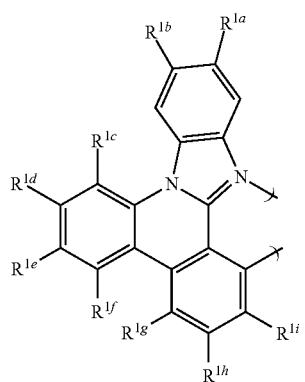
X-7
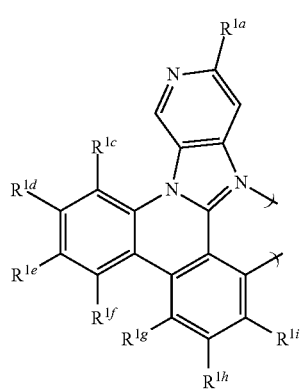
X-8
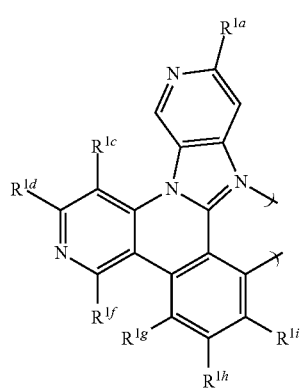
X-9
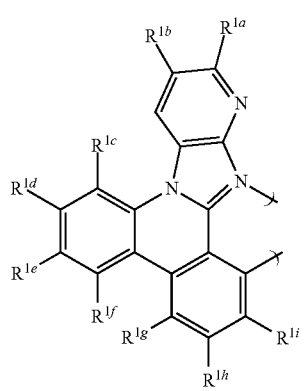
-continued
X-10
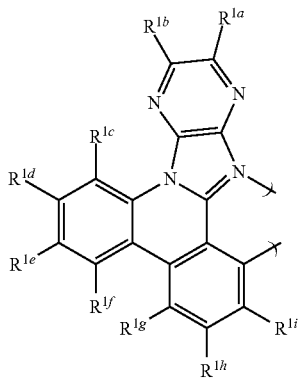
X-11
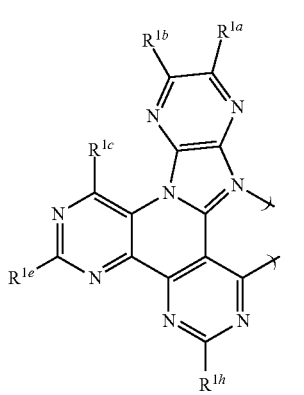
X-12
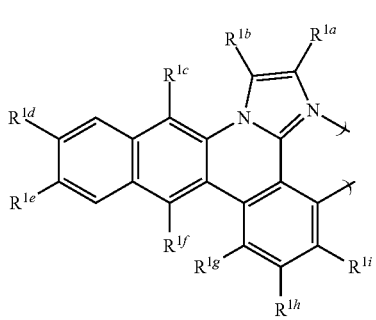
X-13
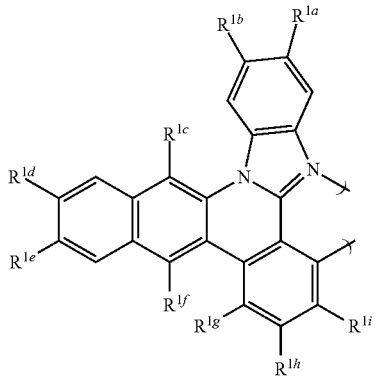

X-14
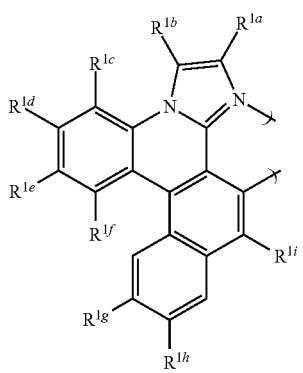
X-15
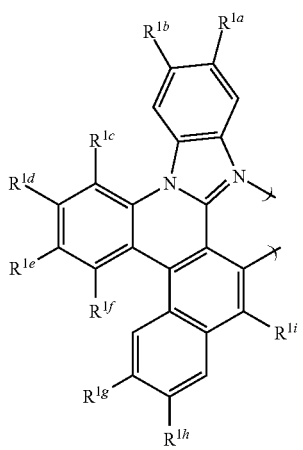
X-16
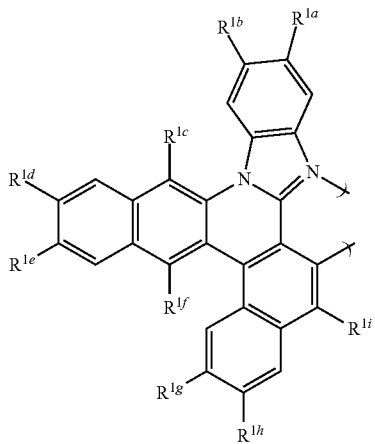
X-17
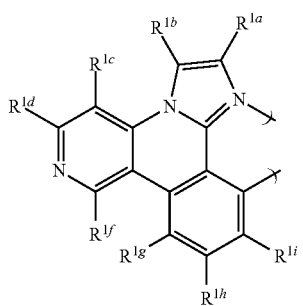
X-18
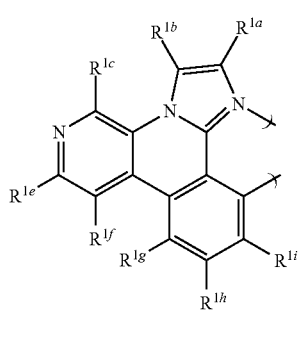
X-19
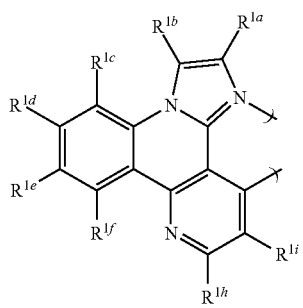
X-20
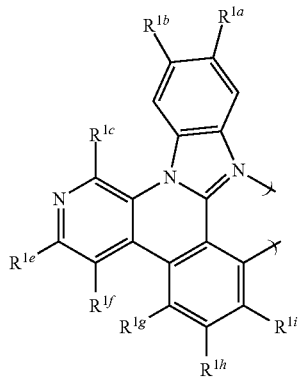
X-21
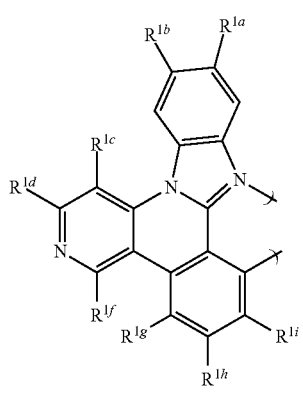

X-22
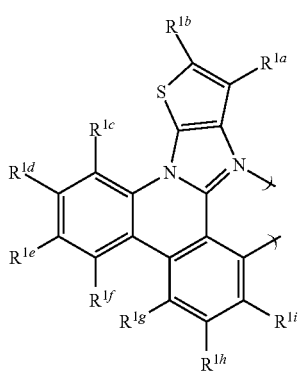
X-23
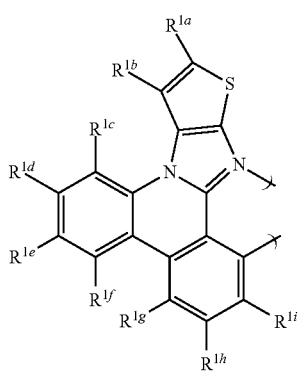
X-24
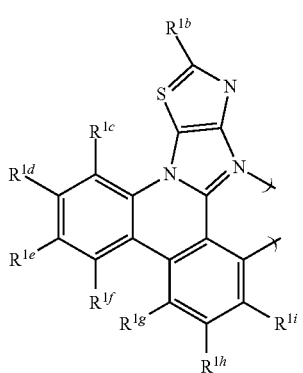
X-25
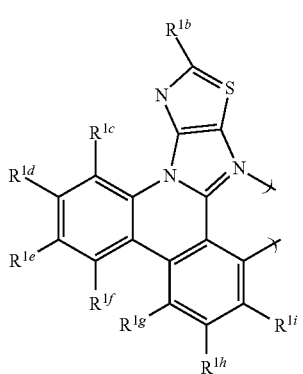
X-26
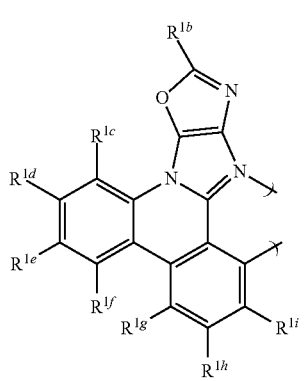
X-27
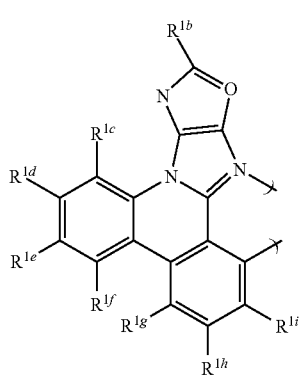
X-28
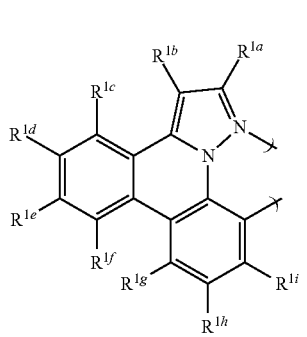
X-29
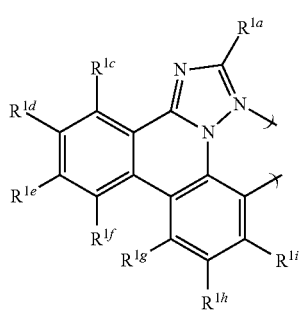

X-30 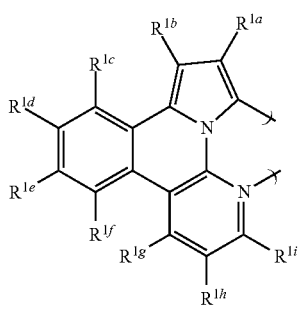
X-34 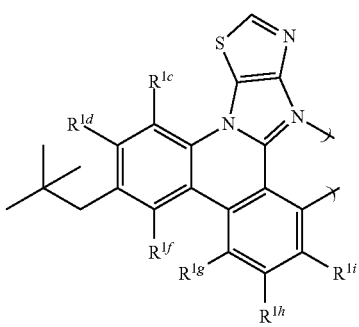
X-31 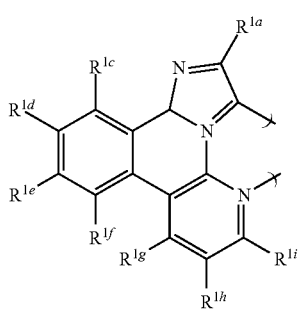
X-35 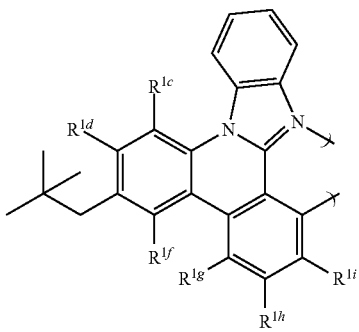
X-32 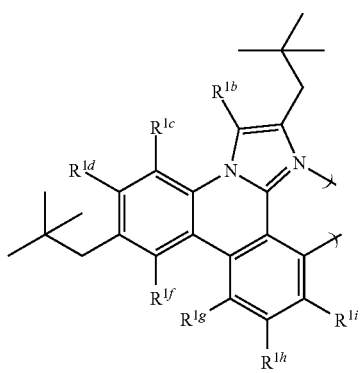
X-36 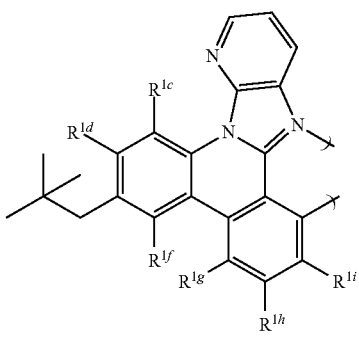
X-33 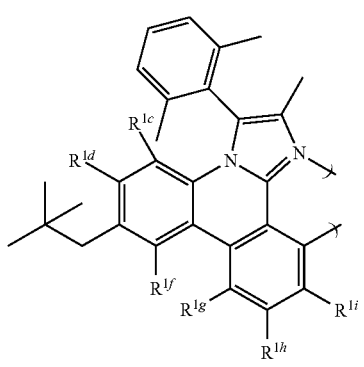
X-37

X-38
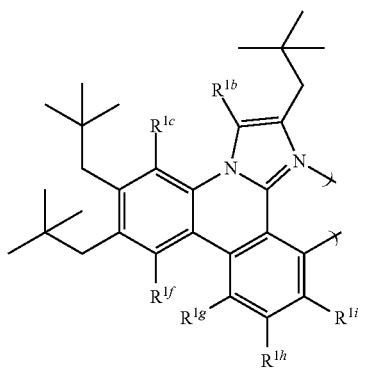
X-39
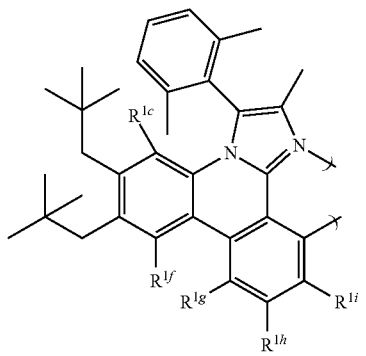
X-40
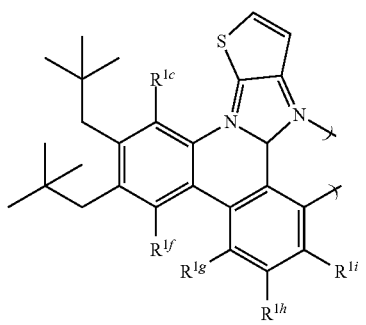
X-41
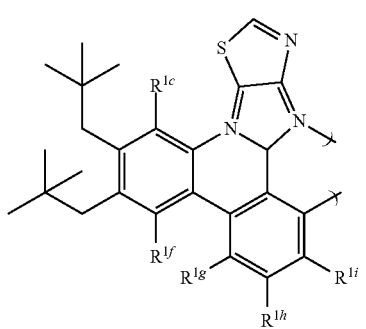
X-42
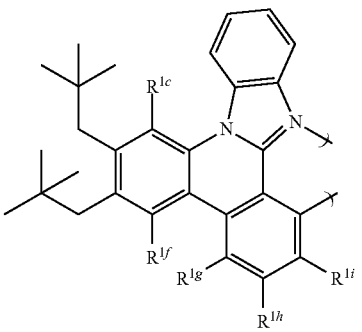
X-43
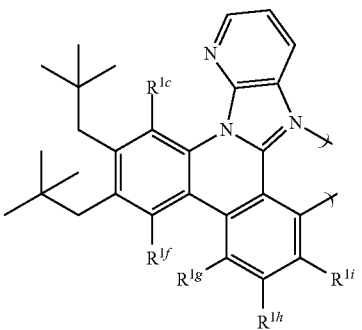
X-44
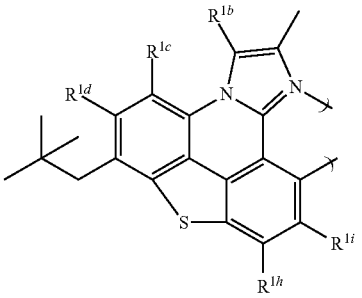
X-45
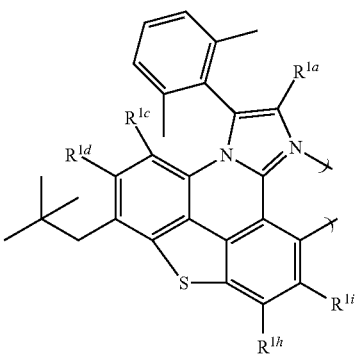
X-46
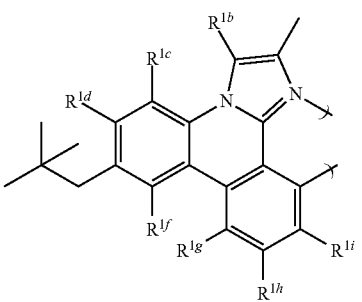

-continued
X-47
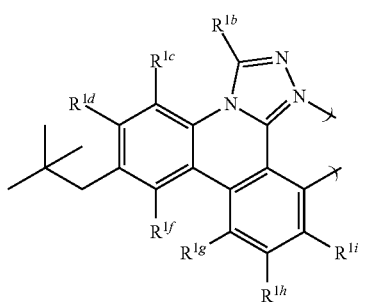
X-48
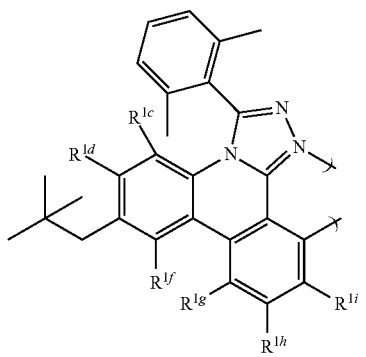
X-49
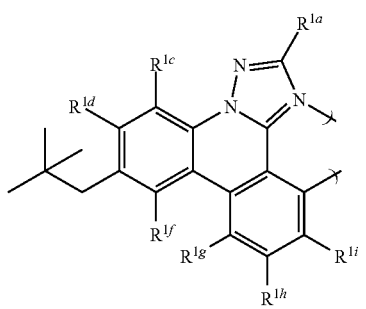
X-50
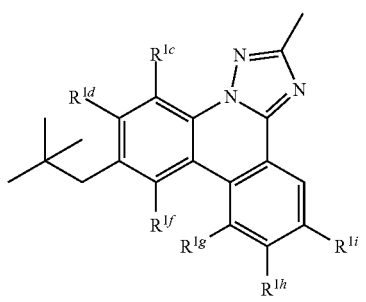
-continued
X-51
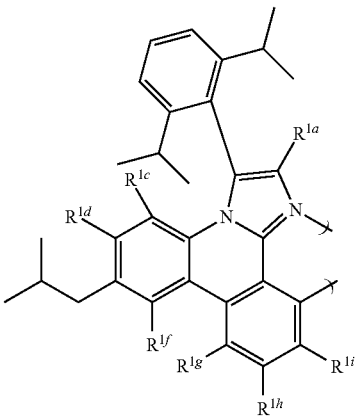
X-52
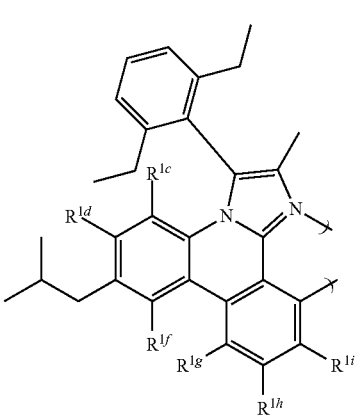
X-53
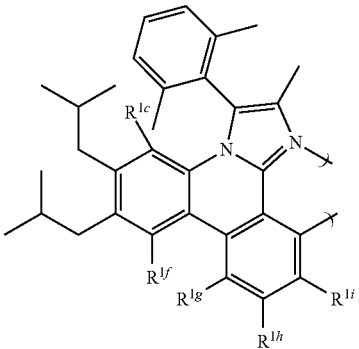
X-54
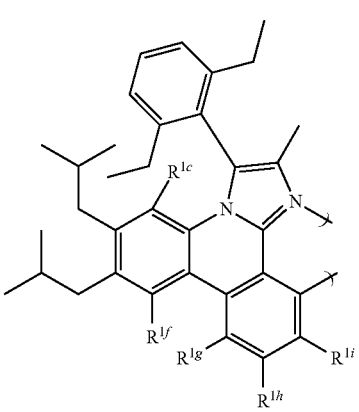

-continued
X-55
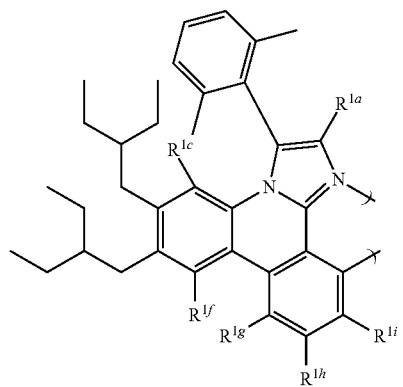
X-56
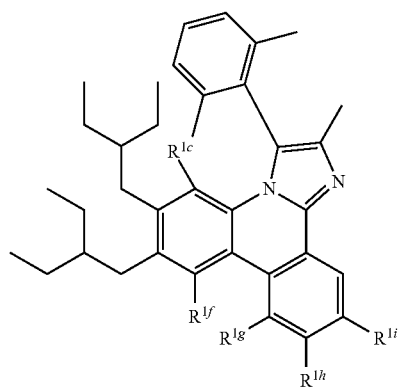
X-57
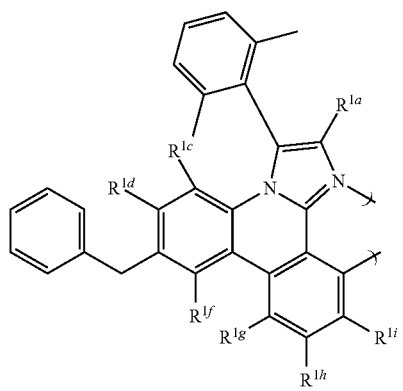
X-58
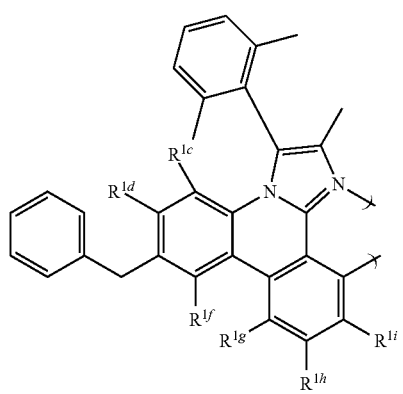
-continued
X-59
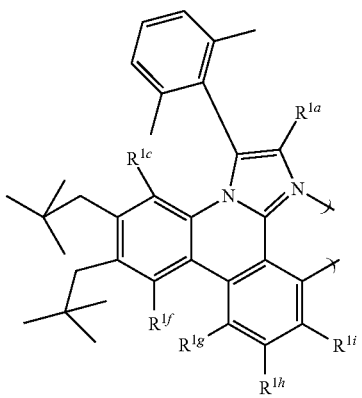
X-60
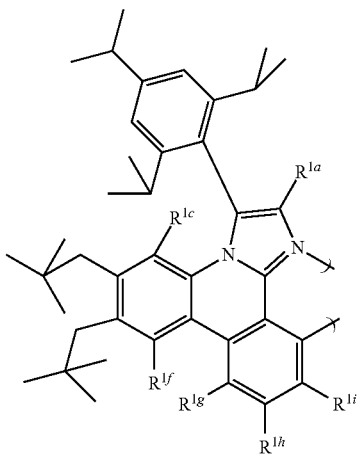
X-61
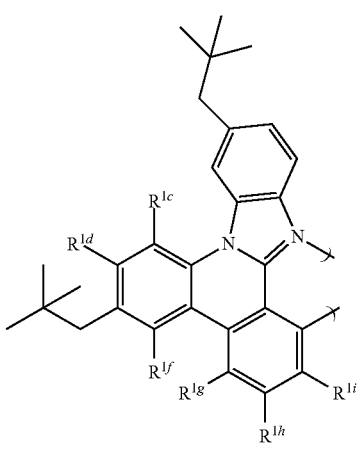
X-62
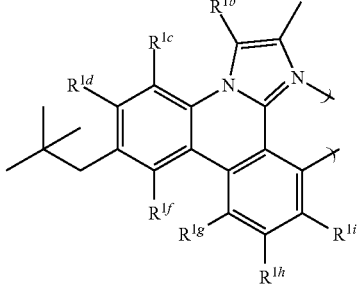

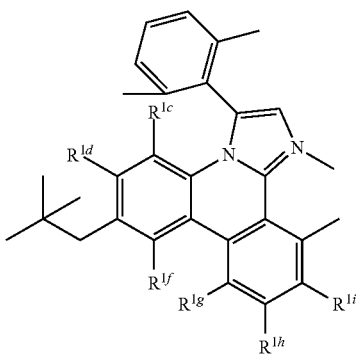

X-63

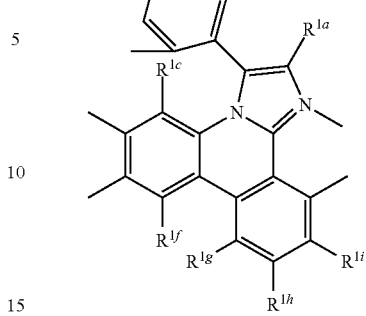

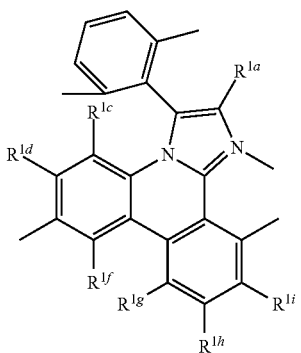

X-64

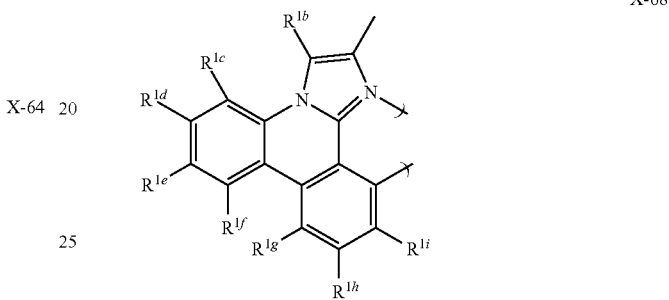

X-67

X-68

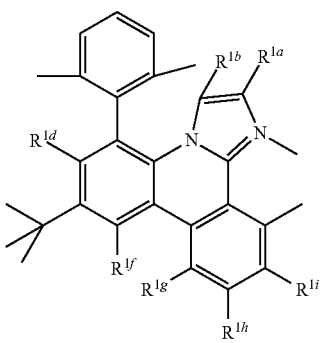

X-65

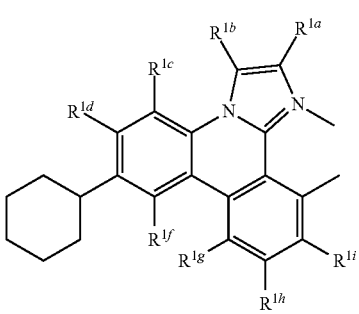

X-66

$R^{1a}$ to $R^{1i}$ have the same meanings as those defined in the formula (A1). It is preferred that all of them represent a hydrogen atom.

The phosphorescent metal complex containing the monoanionic bidentate ligand represented by the formulas (A1) to (A4) and the metal having a molecular weight of 40 or greater can be synthesized by various processes such as those described in US2007/0190359 or US2008/0297033.

For instance, it can be obtained by cooling, to a temperature not greater than room temperature, or heating (not only ordinary heating but also heating with microwaves is also effective) a ligand or dissociate thereof and a metal compound in a solvent (such as halogen solvent, alcohol solvent, ether solvent, ester solvent, ketone solvent, nitrile solvent, amide solvent, sulfone solvent, sulfoxide solvent, and water) or in a solventless manner in the presence or absence of a base (various inorganic or organic bases such as sodium methoxide, t-butoxy potassium, triethylamine, and potassium carbonate). More specifically, XM-64 can be synthesized by a process described in paragraphs of US2007/0190359 while using 7-methylimidazophenanthridine as a starting raw material. XM-63 can be synthesized by a process described in paragraphs of US2008/0297033.

An organic electroluminescence device having an excellent external quantum efficiency can be obtained by using the above-specified phosphorescent metal complex in combination with the compound represented by the formula (1). The content of the specified phosphorescent metal complex in the light emitting layer of the invention is preferably from 1 to 30 mass %, more preferably from 5 to 20 mass %, each in the light emitting layer.

The compound represented by the formula (1) will next be described.

[Compound Represented by the Formula (1)]

$$(Cz)_p\text{-L-}(A)_q \quad (1)$$

In the formula (1), Cz represents a substituted or unsubstituted arylcarbazolyl group or a substituted or unsubstituted carbazolylaryl group, L represents a single bond, a substituted or unsubstituted arylene group, a substituted or unsubstituted cycloalkylene group, or a group derived from a substituted or unsubstituted heteroaromatic ring, A represents a group derived from a substituted or unsubstituted nitrogen-containing heteroaromatic 6-membered ring, and each of p and q independently represents an integer from 1 to 6.

The formula (1) is explained below in detail.

Cz represents, a substituted or unsubstituted arylcarbazolyl group or a substituted or unsubstituted carbazolylaryl group.

The aryl group in each of the arylcarbazolyl group and the carbazolylaryl group is preferably from 6 to 30 in the number of carbons, with examples including a phenyl group, a naphthyl group, an anthryl group, a phenanthryl group, a naphthacenyl group, a pyrenyl group, a fluorenyl group, a biphenyl group and a terphenyl group. Of these groups, a phenyl group, a naphthyl group, a biphenyl group and a terphenyl group are preferable, a phenyl group and a biphenyl group are especially preferable.

The aryl group in each of the arylcarbazolyl group and the carbazolylaryl group is not particularly restricted as to its substitution position on the carbazole ring, but in terms of chemical stability and carrier-transporting capability, it is preferable that the aryl group substitutes for the hydrogen on the 2-position, 3-position, 6-position, 7-position or 9-position of the carbazole ring, it is more preferable that the aryl group substitutes for the hydrogen on the 3-position, 6-position and 9-position of the carbazole ring and it is the most preferable that the aryl group substitutes for the hydrogen on the 9-position (N-position) of the carbazole ring.

When Cz represents an arylcarbazolyl group, though there is no particular restriction on the Cz-L linking, the arylcarbazolyl group is preferably linked to L at the 2-position, 3-position, 7-position or 9-position (N-position) of the carbazole ring, far preferably linked to the L at the 3-position, 6-position, or 9-position (N-position) of the carbazole ring, especially preferably linked to the L at the 9-position (N-position) of the carbazole ring.

However, it is preferable that Cz is a carbazolylaryl group.

A represents a group derived from a substituted or unsubstituted nitrogen-containing heteroaromatic 6-membered ring, preferably a group derived from a nitrogen-containing heteroaromatic 6-membered ring in which the number of carbons is from 2 to 40. The group represented by A may have two or more substituents, and these substituents may combine with each other and form a ring or rings.

Examples of a nitrogen-containing heteroaromatic 6-membered ring or a nitrogen-containing heteroaromatic ring having a nitrogen-containing heteroaromatic 6-membered ring include pyridine, pyrimidine, pyrazine, pyridazine, triazine, azaindolizine, indolizine, purine, pteridine, P-carboline, naphthyridine, quinoxaline, terpyridine, bipyridine, acridine, phenanthroline, phenazine and imidazopyridine. Of these rings, pyridine, pyrimidine, pyrazine and triazine are preferable, pyridine and pyrimidine are far preferable, and pyrimidine is the most preferable.

L represents a single bond, a substituted or unsubstituted arylene group, a substituted or unsubstituted cycloalkylene group, or a group derived from a substituted or unsubstituted heteroaromatic ring. As the substituent which L has, those exemplified in Substituent group A can be used. Preferred examples include a methyl group, an ethyl group, a propyl group, a butyl group, a cyclohexyl group, a cyclopentyl group, a phenyl group, a tolyl group, a xylyl group, a pyridyl group, a pyrimidyl group, a thienyl group, a fluoro group, a cyano group, a trifluoromethyl group, a pentafluorophenyl group, a triphenylsilyl group, and a trimethylsilyl group. Of these, a methyl group, an ethyl group, a butyl group, a phenyl group, a pyridyl group, a pyrimidyl group, a fluoro group, a cyano group, and a trifluoromethyl group are more preferred, with a methyl group, a phenyl group, and a fluoro group being still more preferred.

The arylene group is preferably an arylene group in which the number of carbon atoms is from 6 to 30, with examples including a phenylene group, a biphenylene group, a terphenylene group, a naphthylene group, an anthranylene group, a phenanthrylene group, a pyrenylene group, a chrysenylene group, a fluoranthenylene group and a perfluoroarylene group. Of these groups, a phenylene group, a biphenylene group, a terphenylene group and a perfluoroarylene group are preferable to the others, a phenylene group, a biphenylene group and a terphenylene group are far preferable, and a phenylene group and a biphenylene group are further preferable.

The cycloalkylene group is preferably a cycloallylene group in which the number of carbon atoms is from 5 to 30, with examples including a cyclopentylene group, a cyclohexylene group and a cycloheptylene group. Of such groups, a cyclopentylene group and a cyclohexylene group are preferable to the others, and a cyclohexylene group is far preferable.

The group derived from a heteroaromatic ring is preferably a group derived from a heteroaromatic ring in which the number of carbon atoms is from 2 to 30, with examples including groups derived respectively from a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group and a 4-t-butyl-3-indolyl group. Of these groups, the groups derived respectively from a pyridinyl group, a quinolyl group, an indolyl group and a carbazolyl group are preferable to the others, and the groups derived respectively from a pyridinyl group and a carbazolyl group are far preferable.

L stands for preferably a single bond, a phenylene group, a biphenylene group, a cyclohexylene group, a pyridinylene group or a carbazolylene group, far preferably a single bond, a phenylene group or a biphenylene group, and further preferably a single bond or a phenylene group.

Examples of a substituent each of the groups represented by Cz and A in the formula (1) can include halogen atoms such as fluorine, chlorine, bromine and iodine, a carbazolyl group, a hydroxyl group, substituted or unsubstituted amino groups, a nitro group, a cyano group, a silyl group, a trifluoromethyl group, a carbonyl group, a carboxyl group, substituted or unsubstituted alkyl groups, substituted or unsubstituted alkenyl groups, substituted or unsubstituted arylalkyl groups, substituted or unsubstituted aryl groups, substituted or unsubstituted aromatic heterocyclic groups, substituted or unsubstituted aralkyl groups, substituted or unsubstituted aryloxy groups, and substituted or unsubstituted alkyloxy groups. Of these substituents, a fluorine atom, a methyl group, a perfluorophenylene group, a phenyl group, a naphthyl group, a pyridyl group, a pyrazyl group, a pyrimidyl group, an adamantyl group, a benzyl group, a nitro group, a cyano group, a silyl group, a trifluoromethyl group, a carbazolyl group and combinations of only these groups are preferable, a fluorine atom, a methyl group, a phenyl group, a pyridyl group, a pyrimidyl group, a cyano group, a silyl group, a carbazolyl group and combinations of only these groups are far preferable, a phenyl group, a pyridyl group, a pyrimidyl group, a carbazolyl group and combinations of only these groups are further preferable, and a phenyl group is the best. When the group represented by Cz or A has two or more substituents, these substituents may combine with each other and form a ring or rings.

Each of p and q in the formula (1) independently represents an integer from 1 to 6, preferably 1 to 4, far preferably 1 to 3, and further preferably 1 or 2.

The compound represented by the formula (1) is preferably a compound represented by the following formula (2).

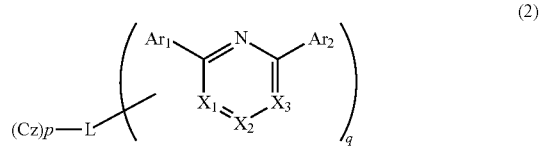

In the formula (2), Cz represents a substituted or unsubstituted arylcarbazolyl group or a substituted or unsubstituted carbazolylaryl group; L represents a single bond, a substituted or unsubstituted arylene group, a substituted or unsubstituted cycloalkylene group, or a group derived from a substituted or unsubstituted heteroaromatic ring, and L is linked to the carbon atom in $Ar_1$, $Ar_2$, $X_1$, $X_2$ or $X_3$; each of $Ar_1$ and $Ar_2$ independently represents a substituted or unsubstituted aryl group, a substituted or unsubstituted arylene group, or a group derived from a substituted or unsubstituted heteroaromatic ring; each of $X_1$, $X_2$ and $X_3$ independently represents a nitrogen atom or a carbon atom which may have a substituent; and each of p and q independently represents an integer from 1 to 6.

The formula (2) is explained below in detail.

Definitions of Cz, L, p and q in the formula (2) are the same as those in the formula (1), respectively, and preferable examples of Cz, L, p and q in the formula (2) are also the same as those in the formula (1).

Each of $Ar_1$ and $Ar_2$ independently represents a substituted or unsubstituted aryl group, a substituted or unsubstitued arylene group, or a group derived from a substituted or unsubstituted heteroaromatic ring.

The aryl group is preferably a substituted or unsubstituted aryl group in which the number of carbon atoms is from 6 to 30, with examples including a phenyl group, a biphenyl group, a terphenyl group, a naphthyl group, an anthranyl group, a phenanthryl group, a pyrenyl group, a chrysenyl group, a fluoranthenyl group and a perfluoroaryl group. Of these groups, a phenyl group, a biphenyl group, a terphenyl group and a perfluoroaryl group are preferabl, a phenyl group, a biphenyl group and a terphenyl group are far preferable, and a phenyl group and a biphenyl group are further preferable.

The arylene group is preferably an arylene group in which the number of carbon atoms is from 6 to 30, and examples thereof and groups for which the arylene group has preferences are the same as those recited in the explanation of L in the formula (1). And the group derived from a heteroaromatic ring is preferably a heteroaromatic ring which is substituted or unsubstituted group and the number of carbon atoms is from 2 to 30, and examples thereof and groups for which the group has preferences are the same as those recited in the explanation of L in the formula (1). When substituents are attached to those groups, examples of the substituents and groups preferred as the substituents are the same as those recited as the substituents of Cz and A in the formula (1).

Each of the ring members $X_1$, $X_2$ and $X_3$ independently represents a nitrogen atom or a carbon atom which may have a substituent. Cases where at most two of $X_1$, $X_2$ and $X_3$ are nitrogen atoms are preferable, cases where none or one of $X_1$, $X_2$ and $X_3$ is a nitrogen atom are far preferable, and cases where any one of $X_1$, $X_2$ and $X_3$ is a nitrogen atom are the most preferable. When any one of $X_1$, $X_2$ and $X_3$ is a nitrogen atom, it is preferred that either of $X_1$ and $X_3$ be a nitrogen atom. The ring containing $X_1$ to $X_3$ in the formula (2) is preferably pyridine or pyrimidine, far preferably pyrimidine. Examples of a substituent which can be bonded to the carbon atom and groups preferred as the substituent are the same as those recited as the substituents of Cz and A in the formula (1). Additionally, the linking position of L in the formula (2) has no particular restriction but, in terms of chemical stability and carrier-transporting capability, it is preferred that L be linked to a carbon atom in $Ar_1$.

The compound represented by the formula (1) is far preferably a compound represented by the following formula (3).

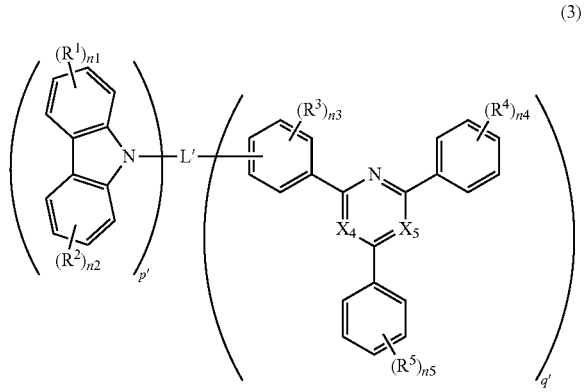

(3)

In the formula (3), each of $X_4$ and $X_5$ independently represents a nitrogen atom or a carbon atom which may have a substituent, it is preferable that either $X_4$ or $X_5$ represents a nitrogen atom and the other represents a carbon atom which may have a substituent; L' represents a single bond, a substituted or unsubstituted arylene group, a substituted or unsubstituted cycloalkylene group, or a group derived from a substituted or unsubstituted heteroaromatic ring; each of $R^1$ to $R^5$ independently represents a substituent; each of n1 to n5 independently represents an integer from 0 to 5; and each of p' and q' independently represents an integer from 1 to 4.

The formula (3) is explained below in detail.

Each of $X_4$ and $X_5$ independently represents a nitrogen atom or a carbon atom which may have a substituent. Herein, it is preferable that either $X_4$ or $X_5$ represents a nitrogen atom and the other represents a carbon atom which may have a substituent. In the formula (3), the ring containing $X_4$ and $X_5$ is preferably pyridine or pyrimidine, far preferably pyrimidine. Examples of a substituent bonded to the carbon atom and groups preferred as the substituent are the same as those recited as the substituents of Cz and A in the formula (1).

The definition of L' in the formula (3) is the same as that of L in the formula (1), and groups preferred as L' are the same as those preferred as L. And L' is linked to a benzene ring in the nitrogen-containing heteroaromatic ring structure drawn in the formula (3).

Each of $R^1$ to $R^5$ independently represents a substituent. Examples of the substituent and preferred substituent are the same as those recited as the substituents of Cz and A in the formula (1). $R^1$ to $R^5$ are each preferably a fluorine atom, a methyl group, a t-butyl group, a phenyl group, a pyridyl group, a pyrazyl group, a pyrimidyl group, an adamantyl group, a cyano group, a trimethylsilyl group, a triphenylsilyl group, a trifluoromethyl group, or a carbazolyl group; more preferably a fluorine atom, a methyl group, a t-butyl group, a phenyl group, a pyridyl group, a cyano group, a trimethylsilyl group, a triphenylsilyl group, a trifluoromethyl group, or a carbazolyl group; still more preferably a fluorine atom, a methyl group, a t-butyl group, a phenyl group, a cyano group, a silyl group, a triphenylsilyl group, a trifluoromethyl group, or a carbazolyl group, still more preferably efluorine atom, a t-butyl group, a phenyl group, a cyano group, a triphenylsilyl group, or a carbazolyl group. When more than one $R^1$, $R^2$, $R^3$, $R^4$ or $R^5$ are present, each $R^1$, $R^2$, $R^3$, $R^4$ or $R^5$ may be the same as or different from every other $R^1$, $R^2$, $R^3$, $R^4$ or $R^5$, respectively.

Each of n1 to n5 independently represents an integer from 0 to 5. And each is preferably 0, 1 or 2, far preferably 0 or 1, further preferably 0.

Each of p' and q' independently represents an integer from 1 to 4. And each is preferably 1, 2 or 3, far preferably 1 or 2.

The compound represented by the formula (1) is most preferably composed only of a carbon atom, a hydrogen atom, and a nitrogen atom.

The molecular weight of the compound represented by the formula (1) is preferably from 400 to 1,000, far preferably from 450 to 800, and further preferably from 500 to 700.

The lowest triplet excited state (T1) energy that the compound represented by the formula (1) has in the form of film is preferably from 2.61 eV (62 kcal/mol) to 3.51 eV (80 kcal/mol), far preferably from 2.69 eV (63.5 kcal/mol) to 3.51 eV (80 kcal/mol), further preferably from 2.76 eV (65 kcal/mol) to 3.51 eV (80 kcal/mol).

The glass transition temperature (Tg) of the compound represented by the formula (1) is preferably from 80° C. to 400° C., far preferably from 100° C. to 400° C., further preferably from 120° C. to 400° C.

Hydrogen atoms in the formula (1) may also include isotopic atoms of hydrogen (such as deuterium atoms). In such a case, the compound may be in a state that all the hydrogen atoms are replaced with isotopic atoms of hydrogen, or it may be a mixture of the compounds that have differing degrees of partial replacement of hydrogen atoms with isotopic atoms of hydrogen.

Examples of the compound represented by the formula (1) are illustrated below, but the invention should not be construed as being limited to these examples. Additionally, Ph in the following examples represents a phenyl group.

41
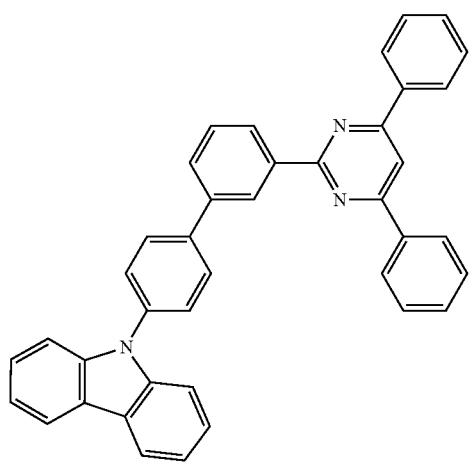
1
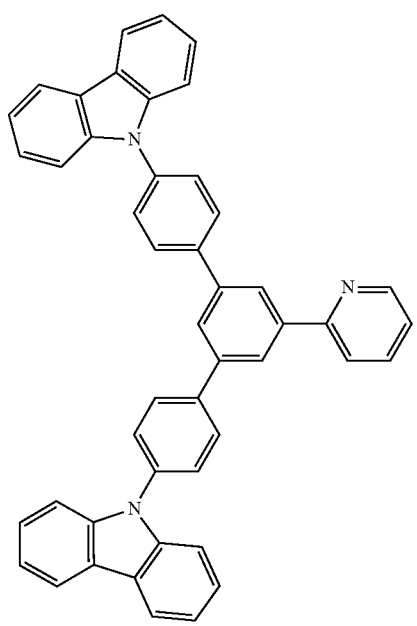
2
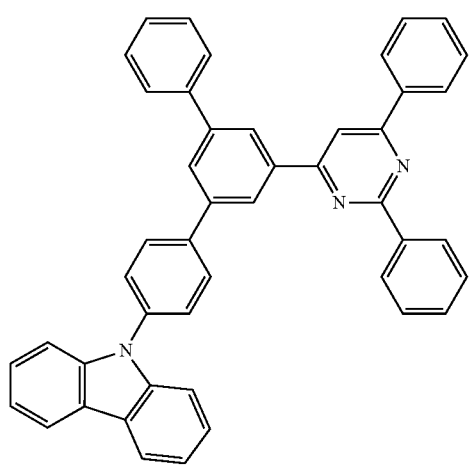
3
42
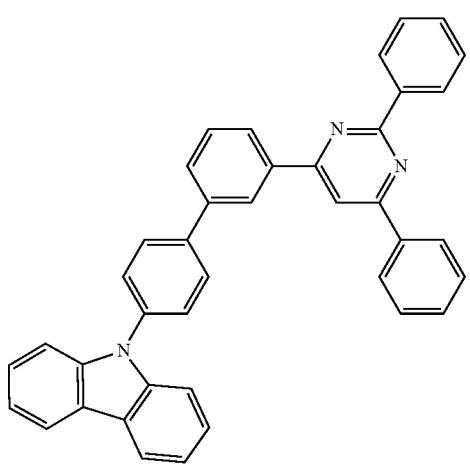
4
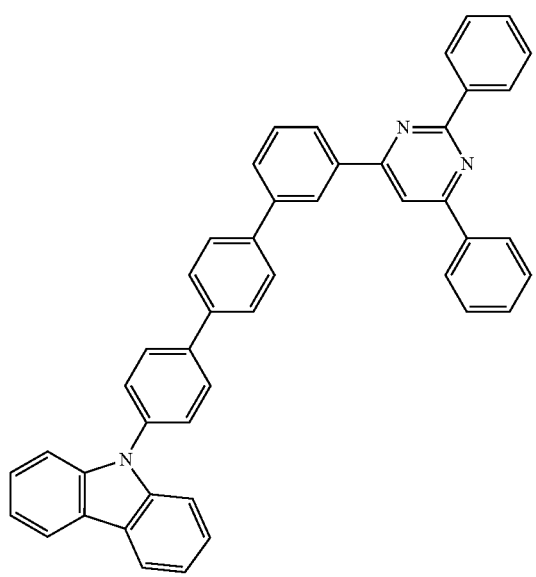
5
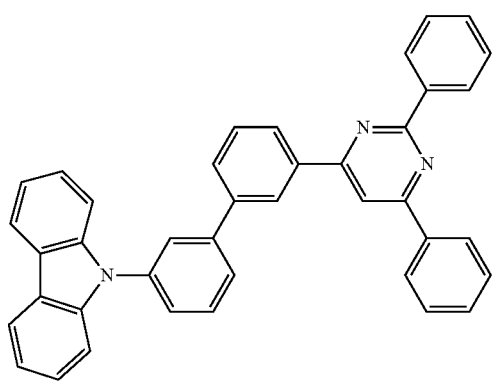
6

-continued
7
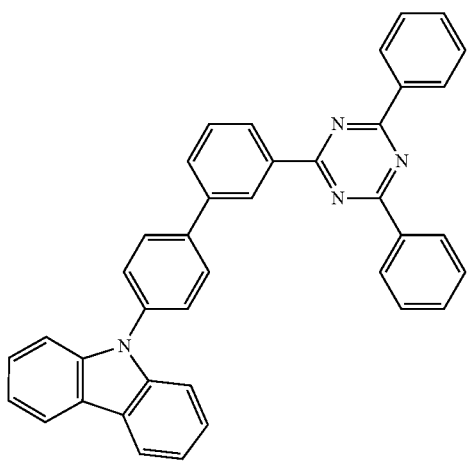
8
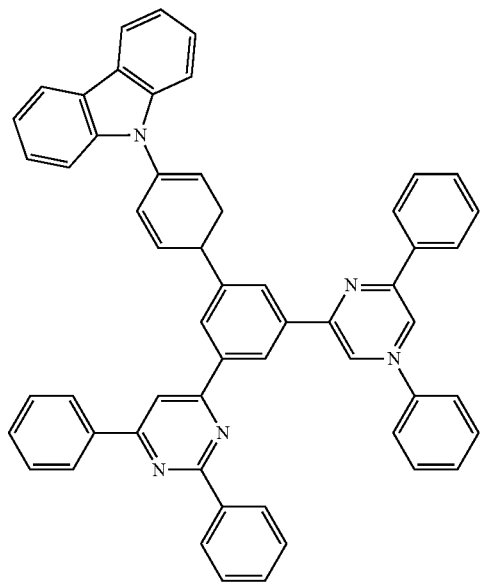
9
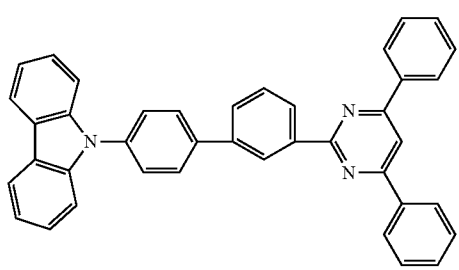
10
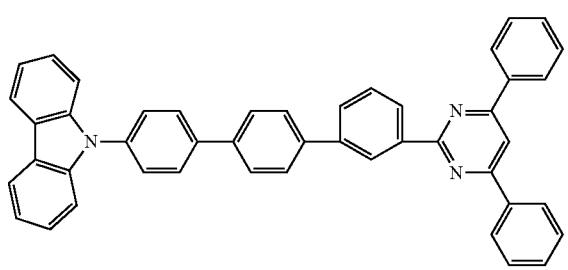
11
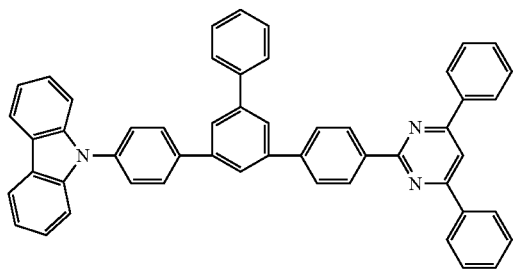
12
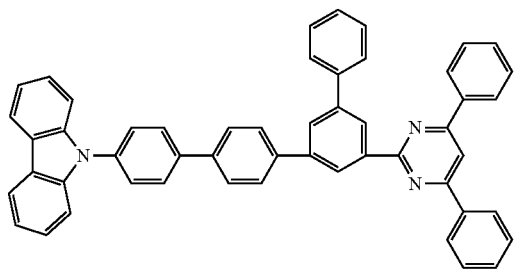
13
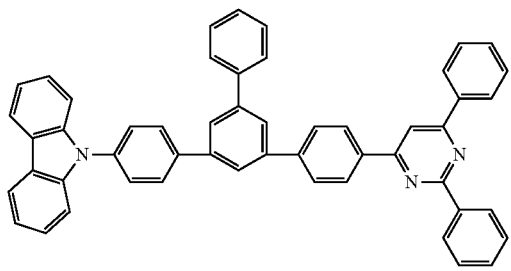
14
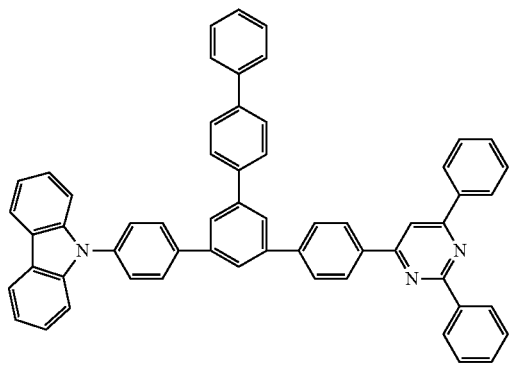

-continued
15
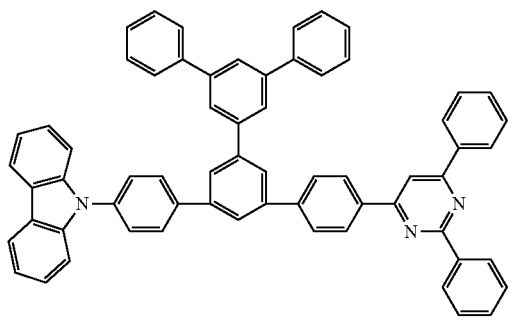
16
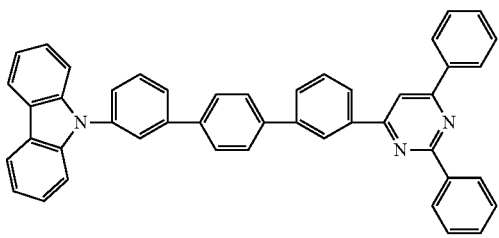
17
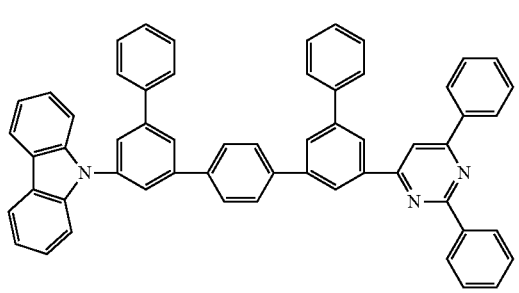
18
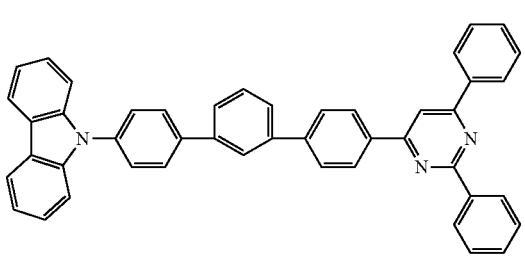
19
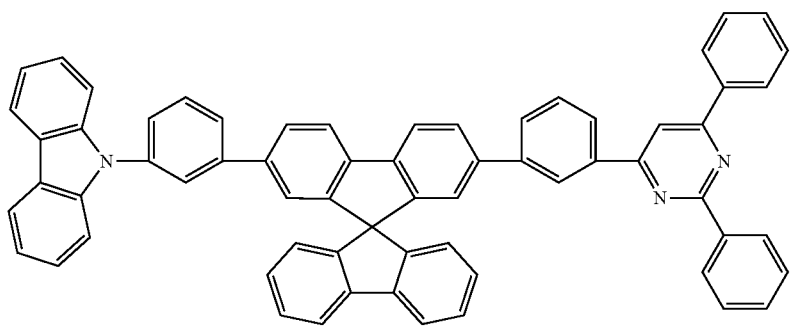
20
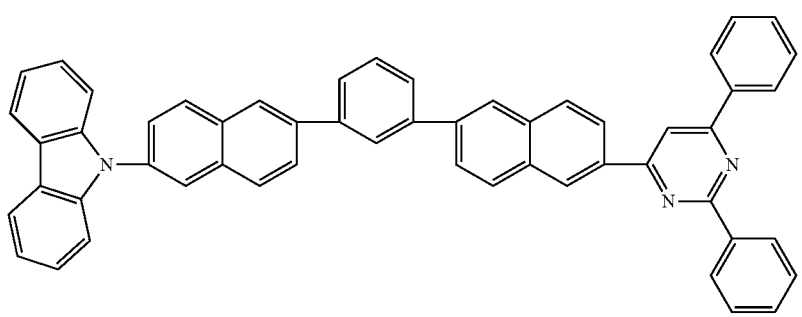
21
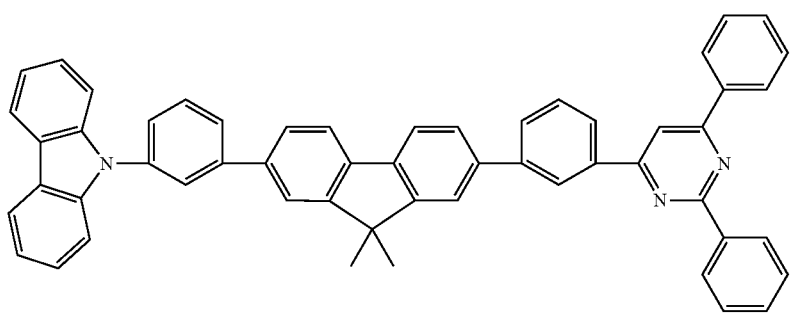

22
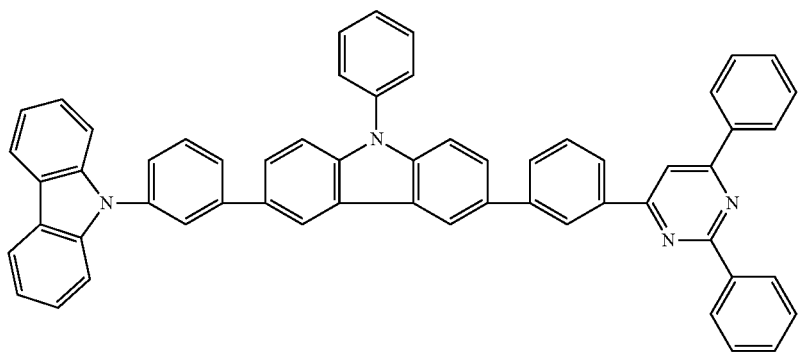
23
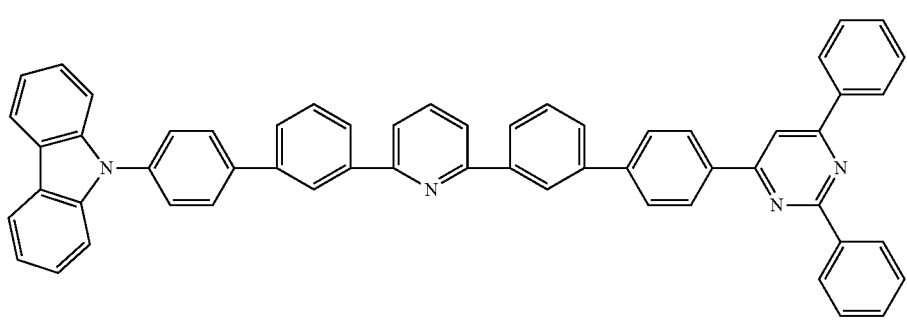
24
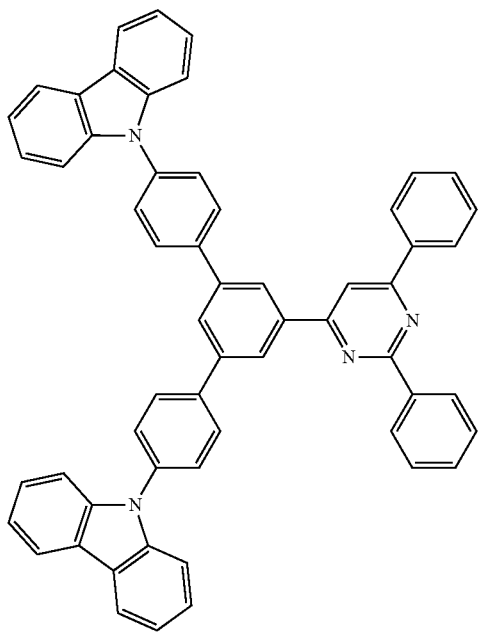
25
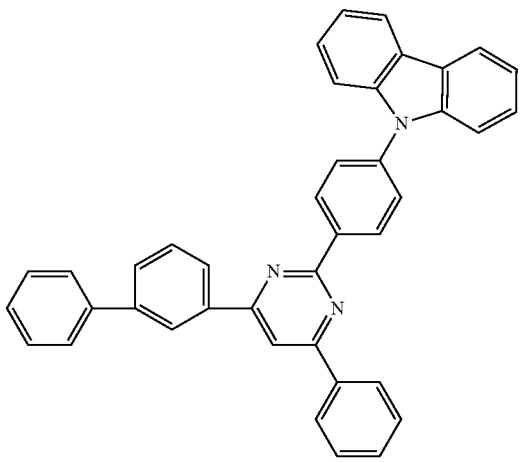
26
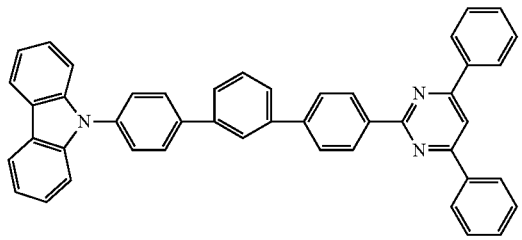
27
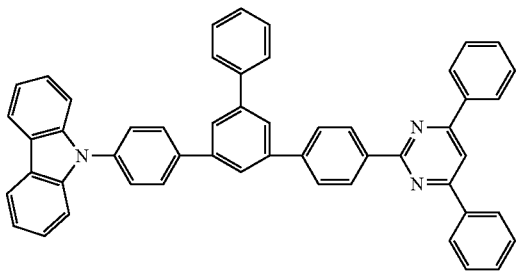

-continued
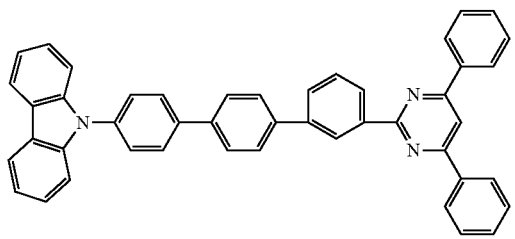
28
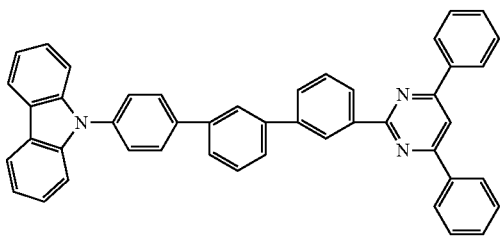
29
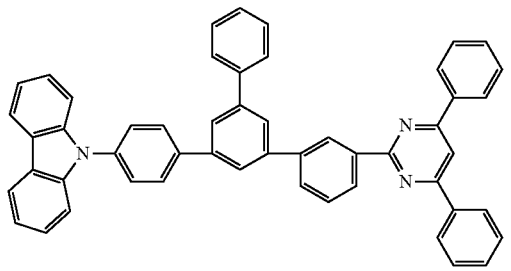
30
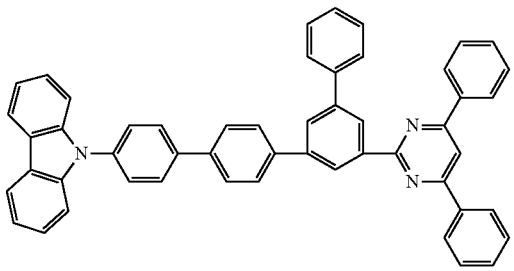
31
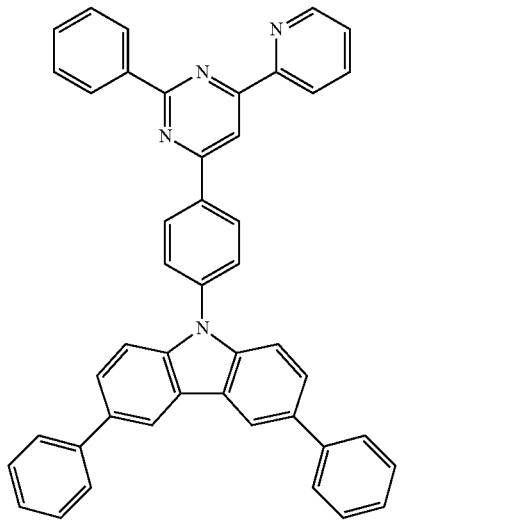
32
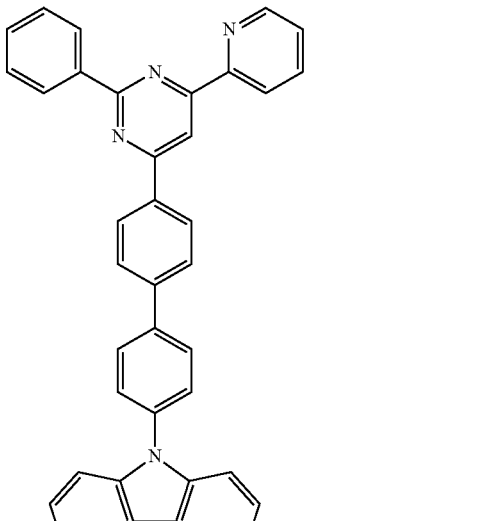
34
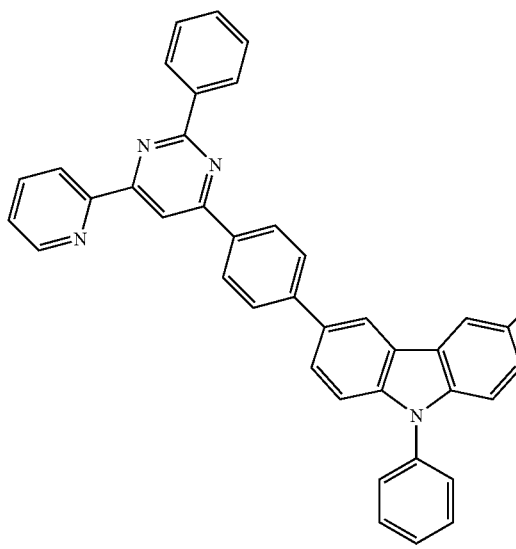
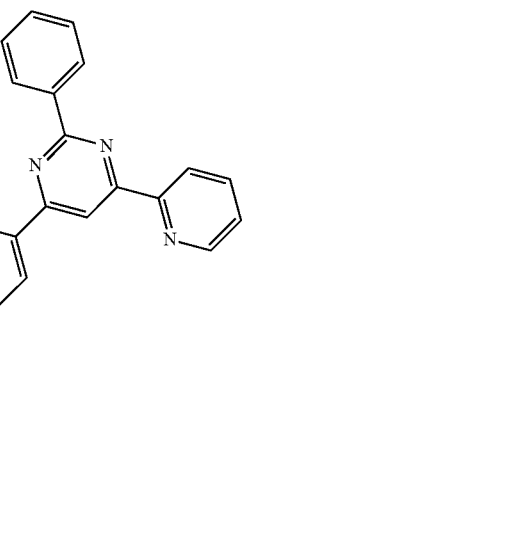
35

-continued
37
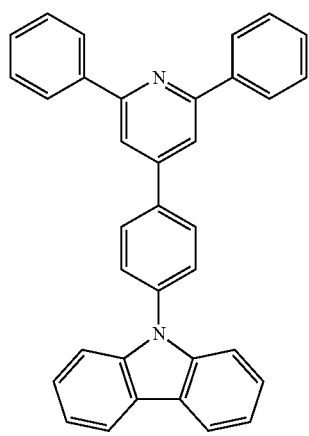
38
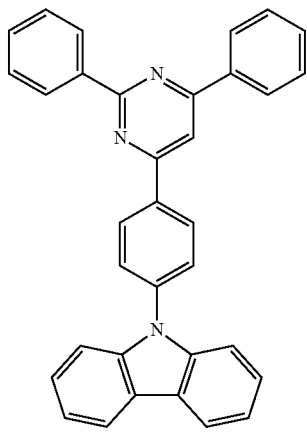
39
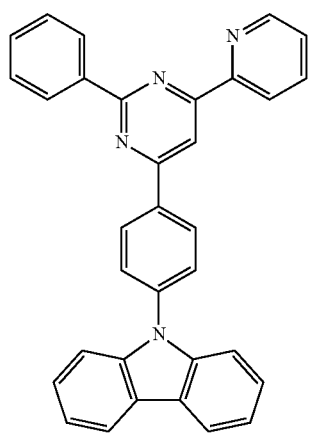
40
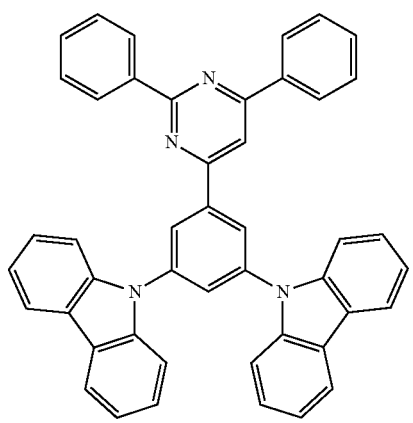
41
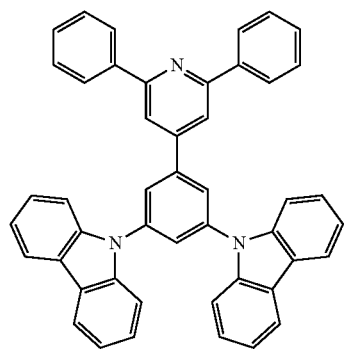
42
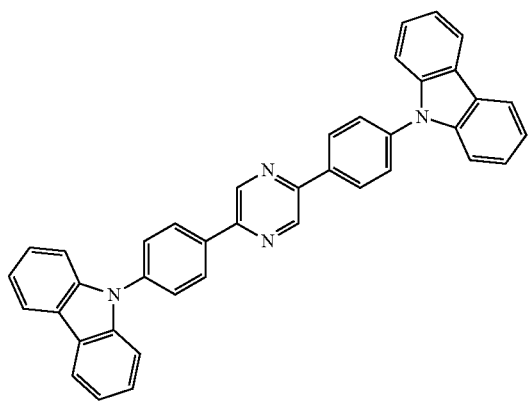

-continued
43
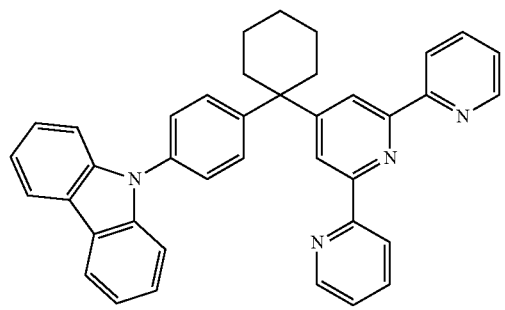
44
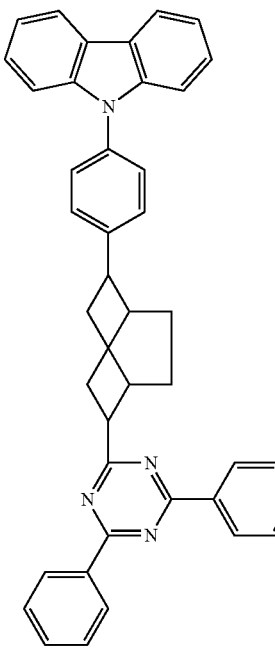
45
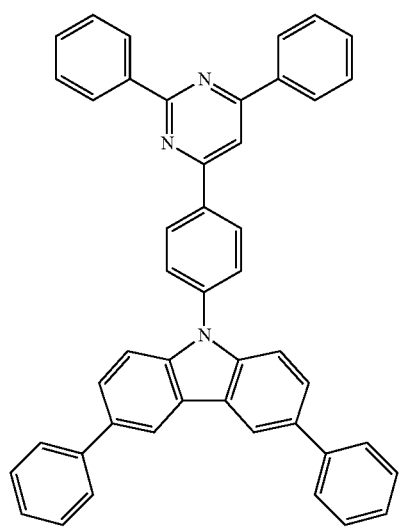
46
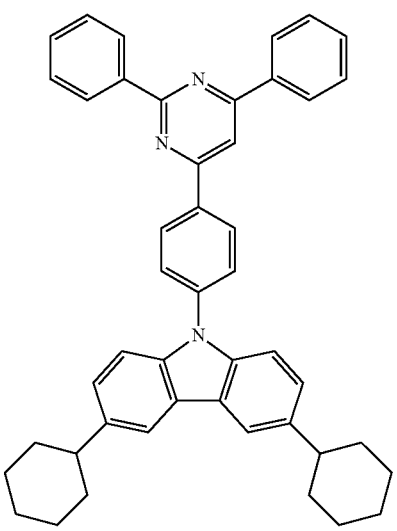
47
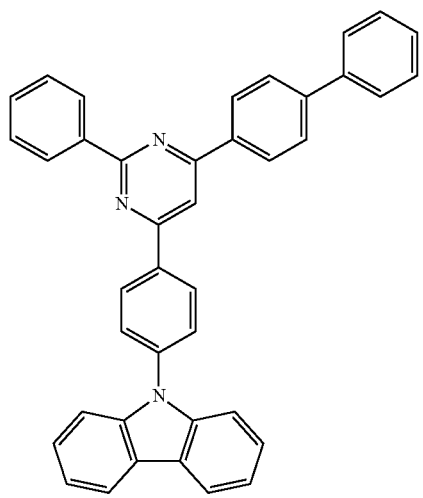
48
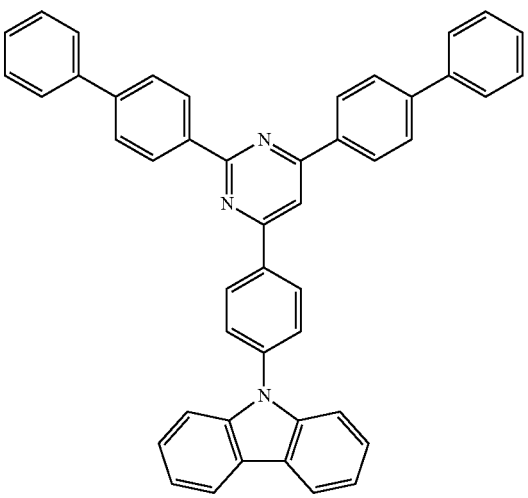

-continued
49
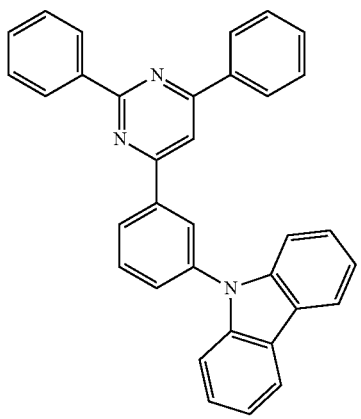
50
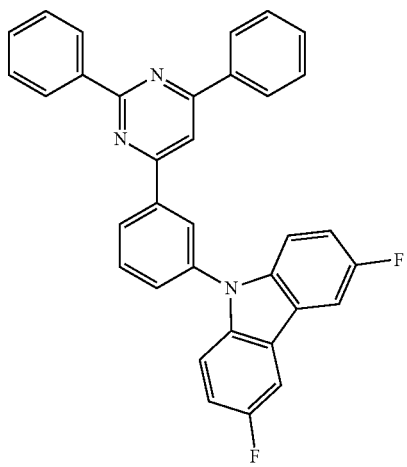
51
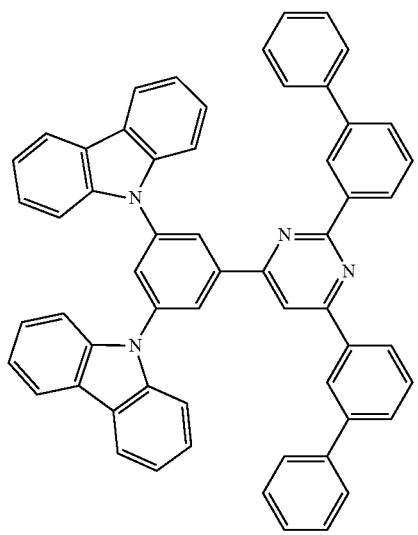
52
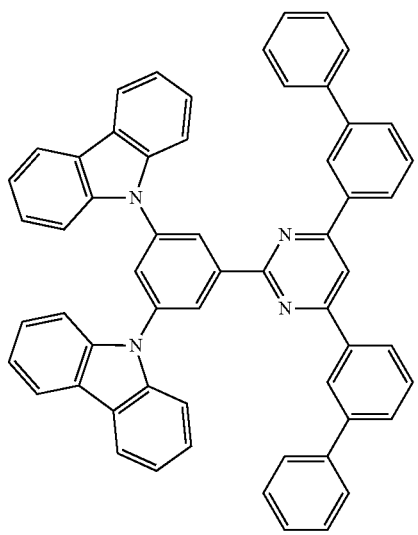
53
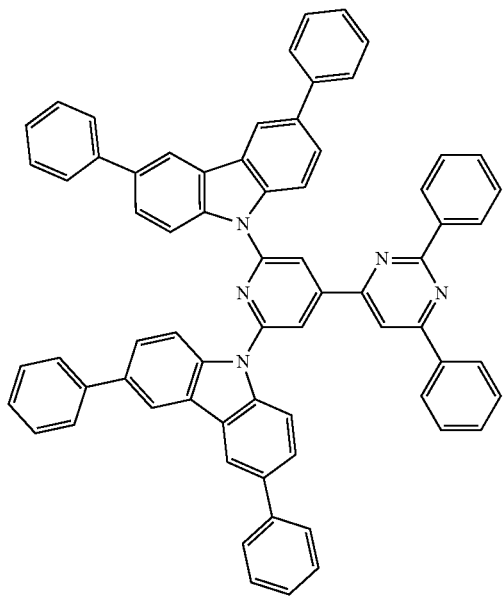
54
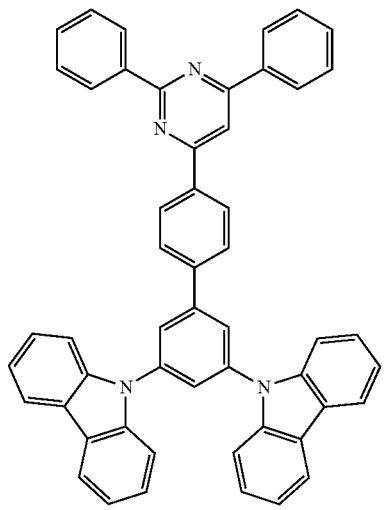

-continued
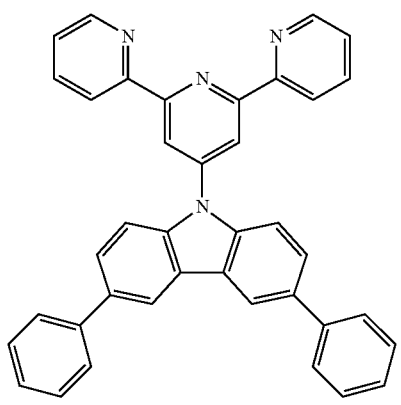
56
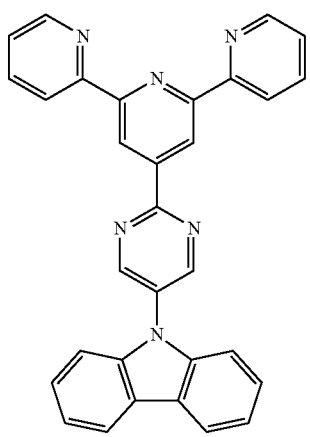
57
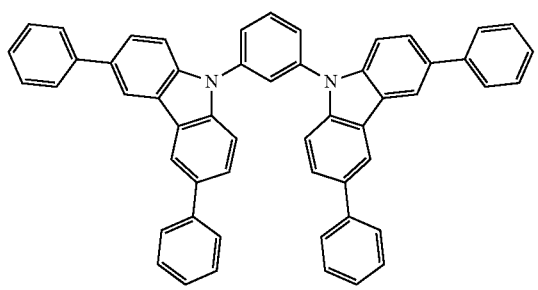
58
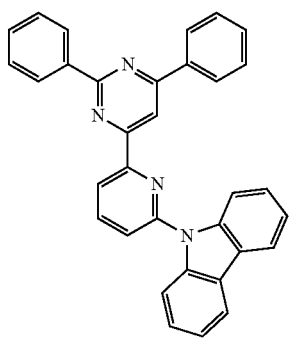
59
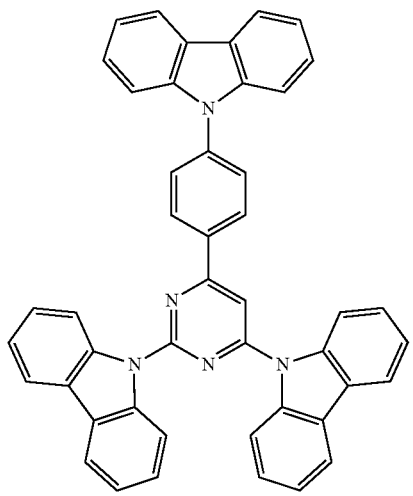
60
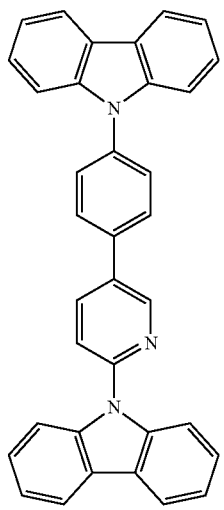
61

-continued
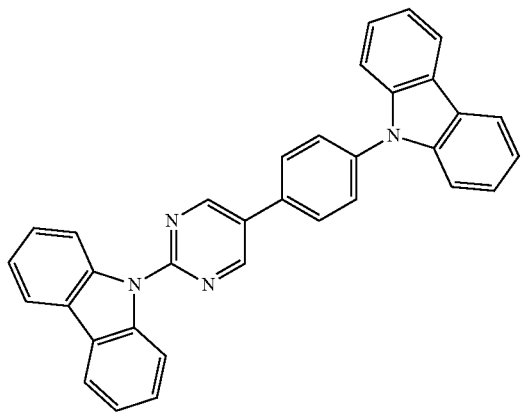
62
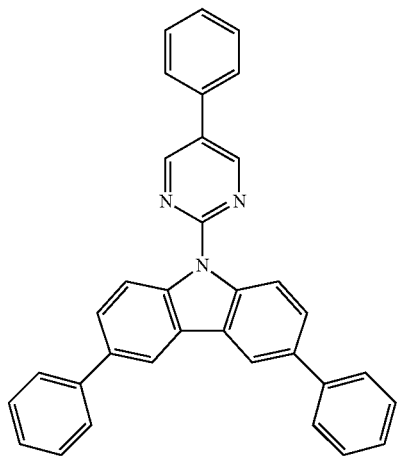
63
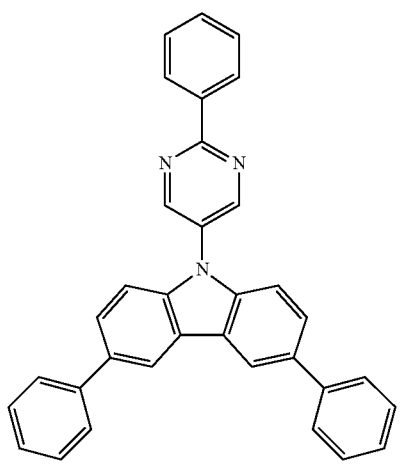
64
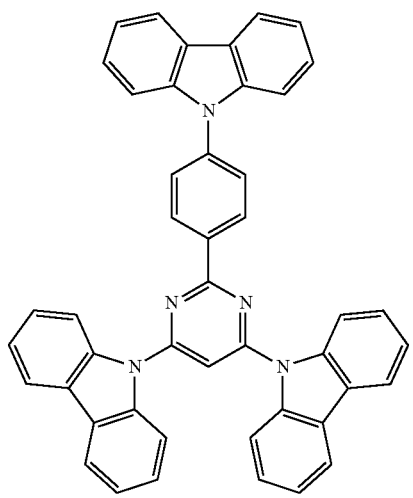
65
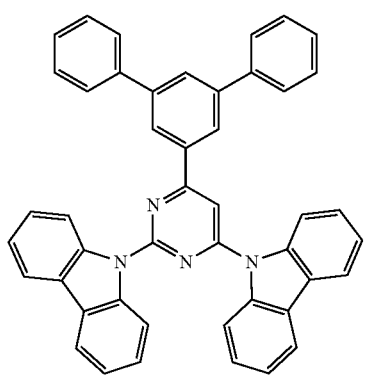
66
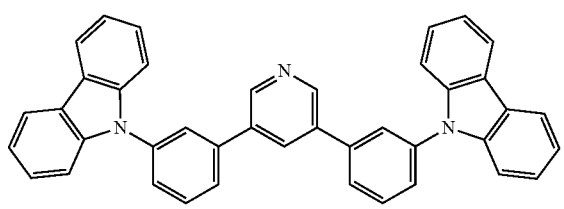
67

-continued
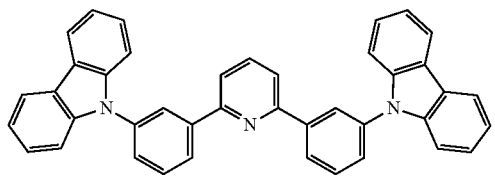
68
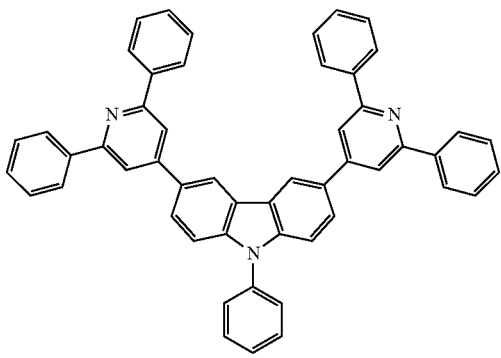
69
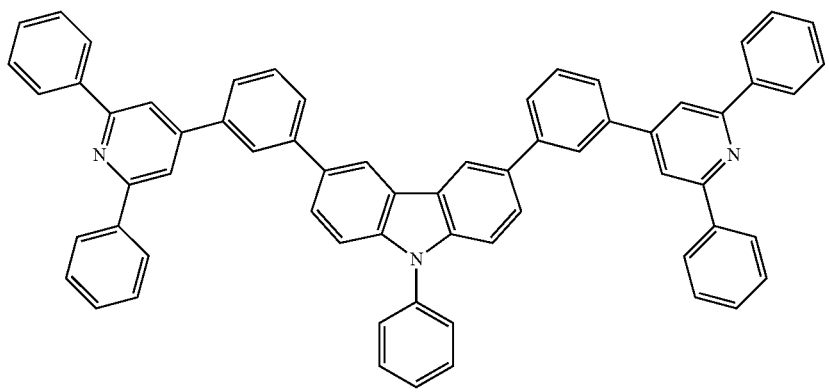
70
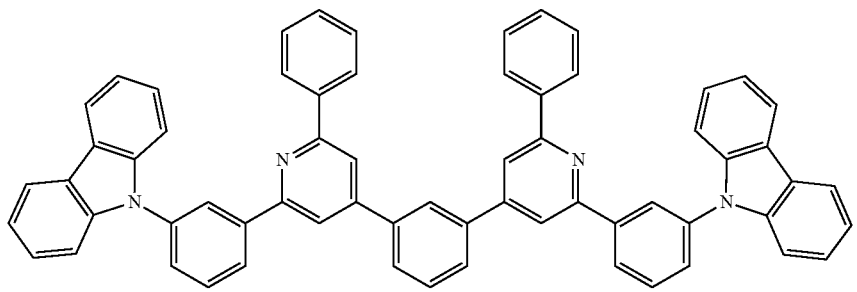
71
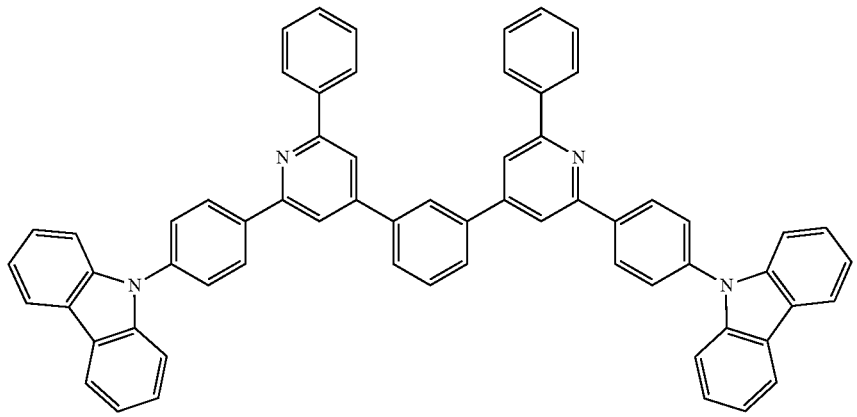
72

-continued
73
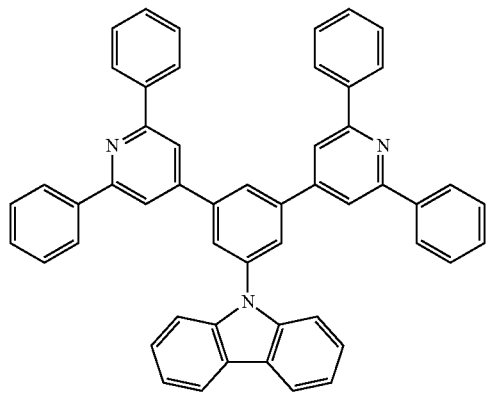
74
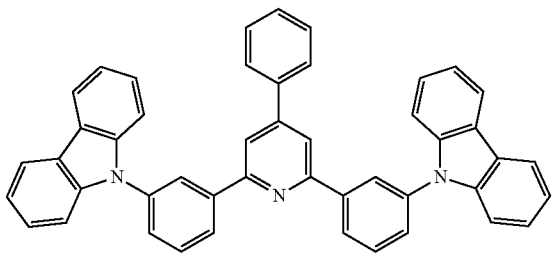
75
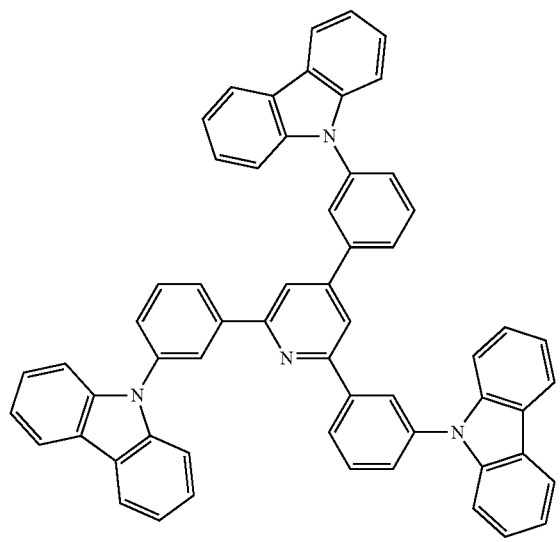
76
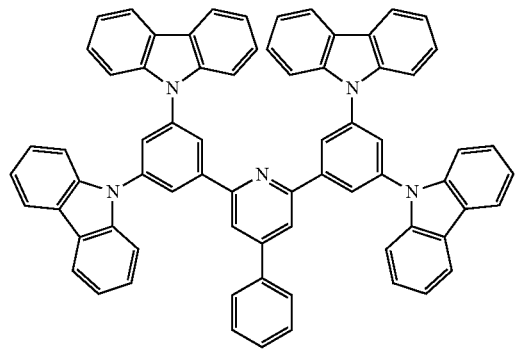
77
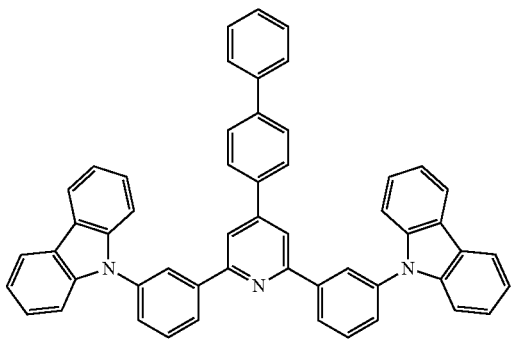

-continued
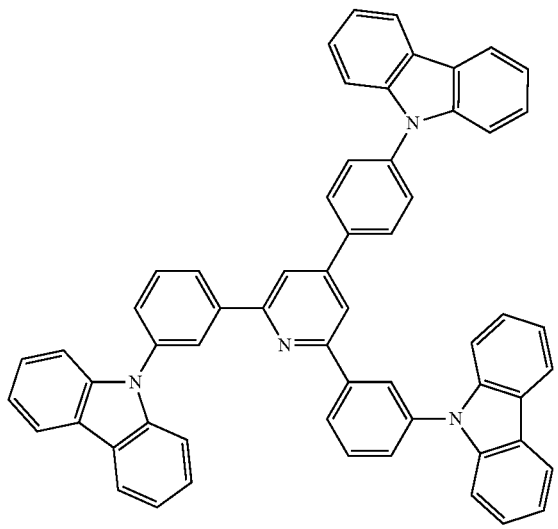
78
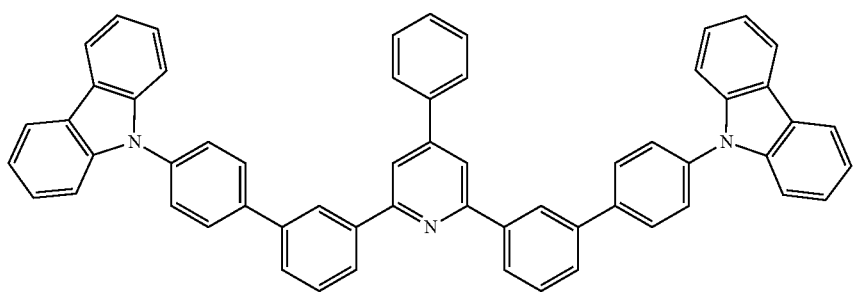
79
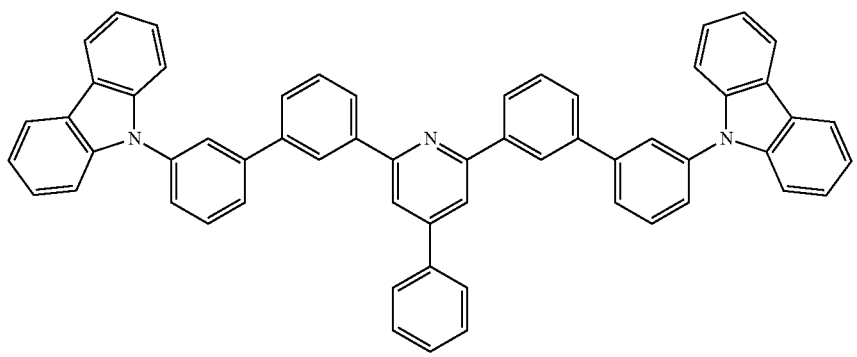
80
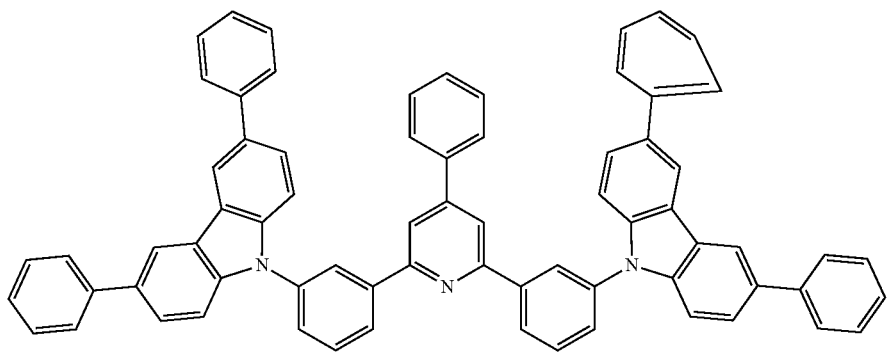
81

-continued
82
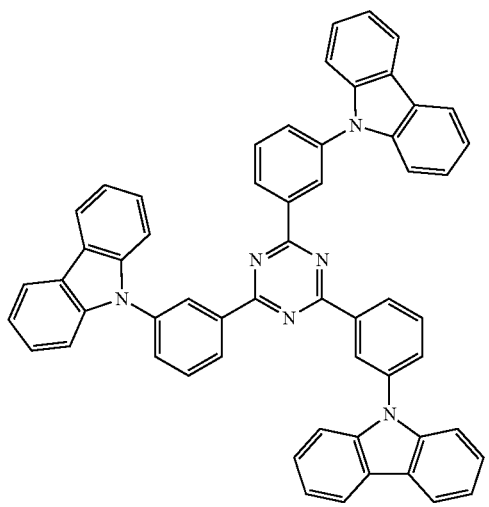
83
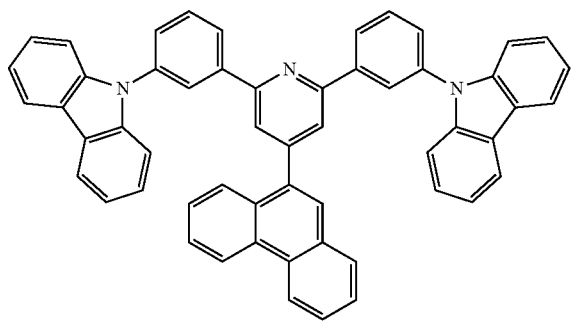
84
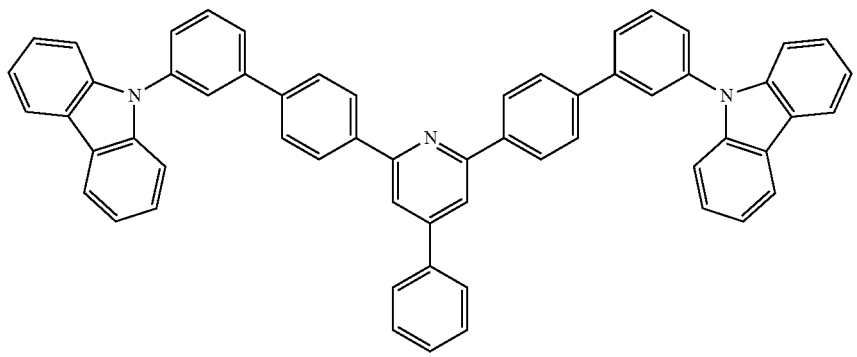
85
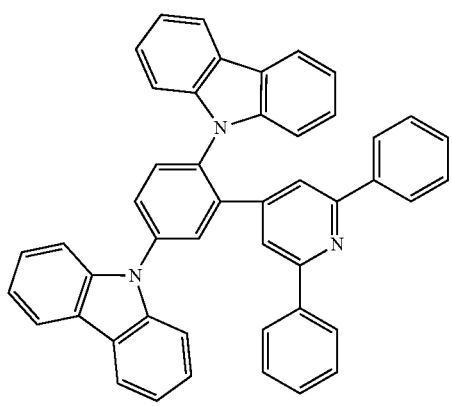
86
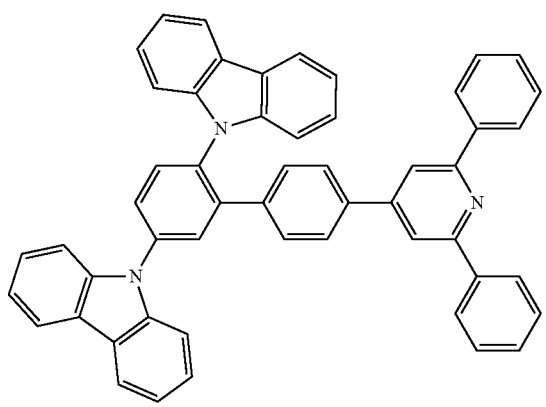

-continued
87
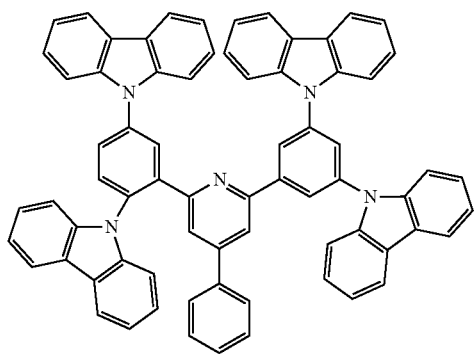
88
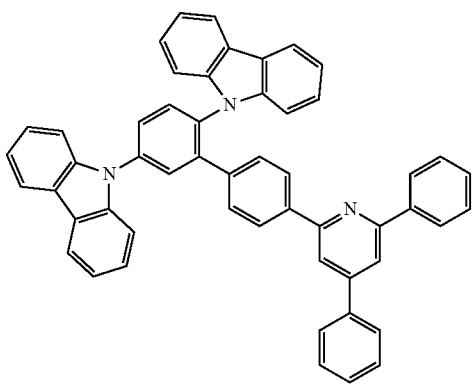
89
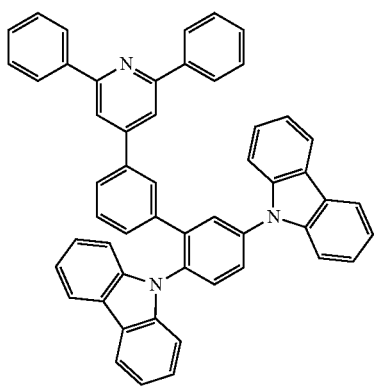
90
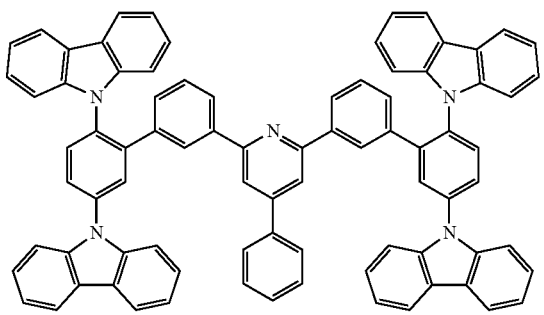
91
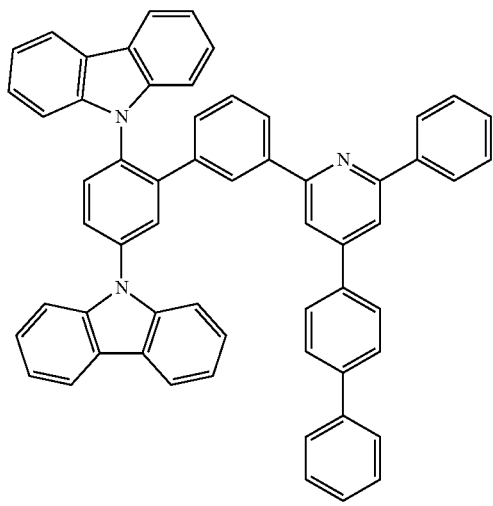
92
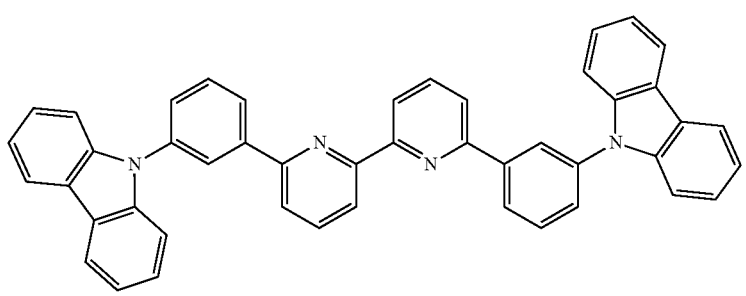

-continued
93
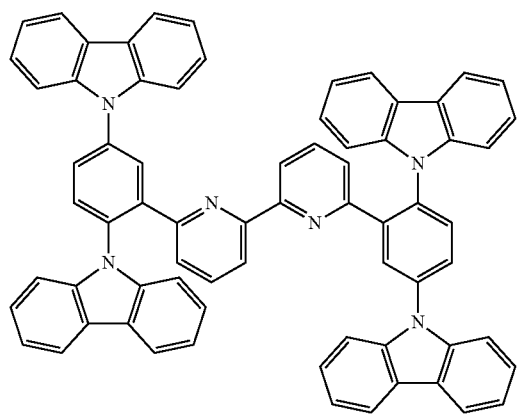
94
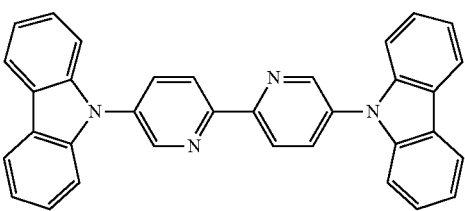
95
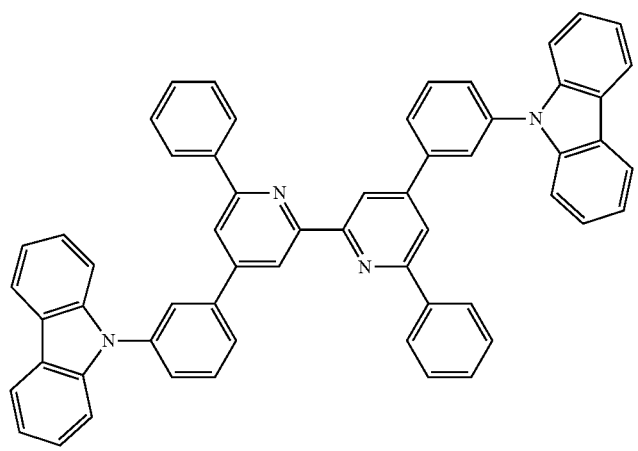
96
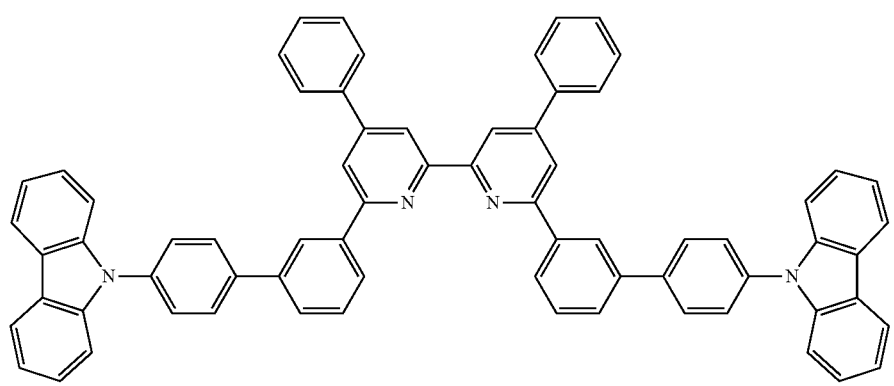
97
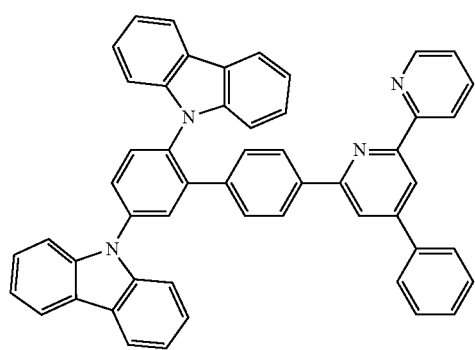
98
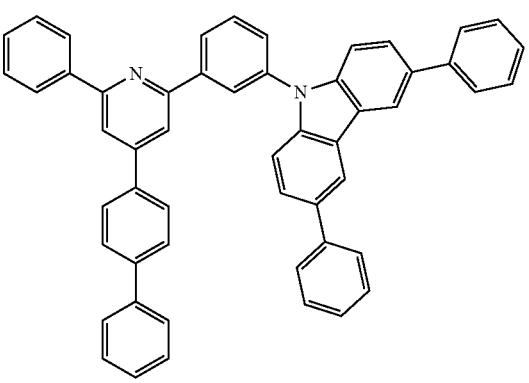

-continued
99
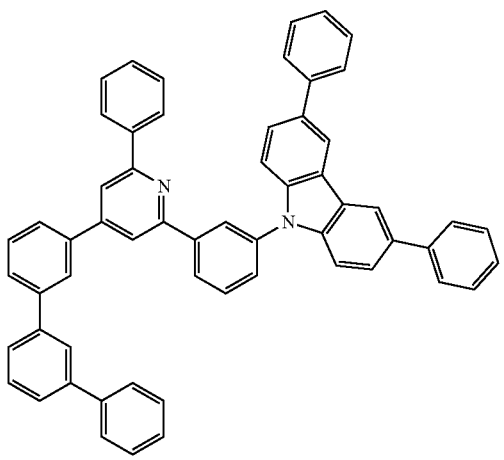
100
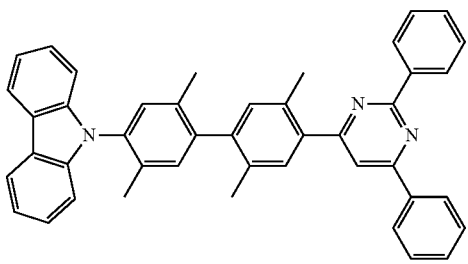
101
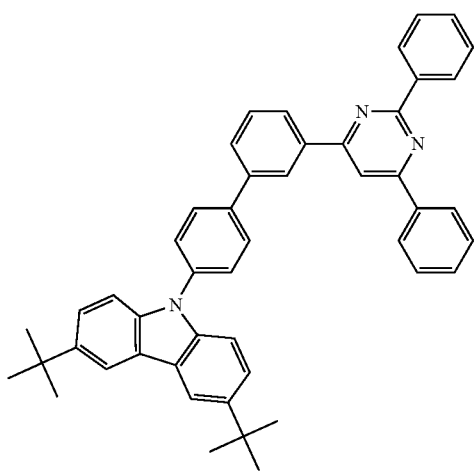
102
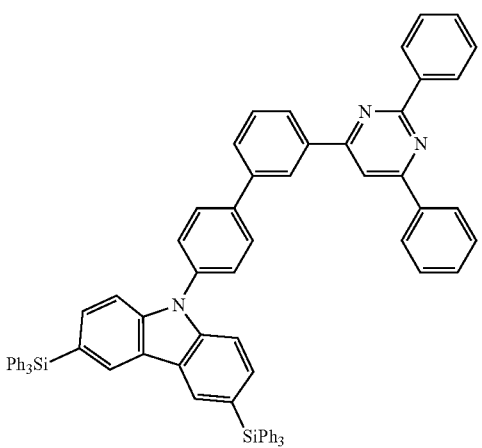
103
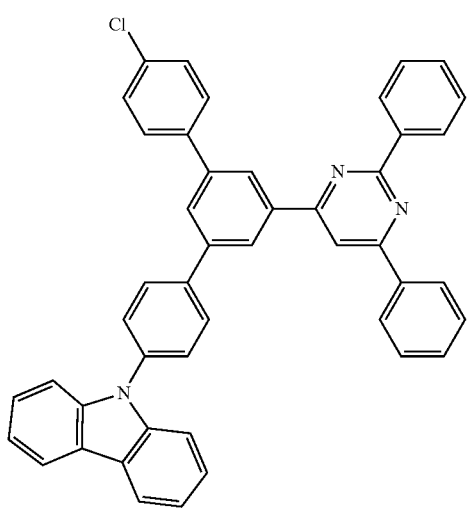
104
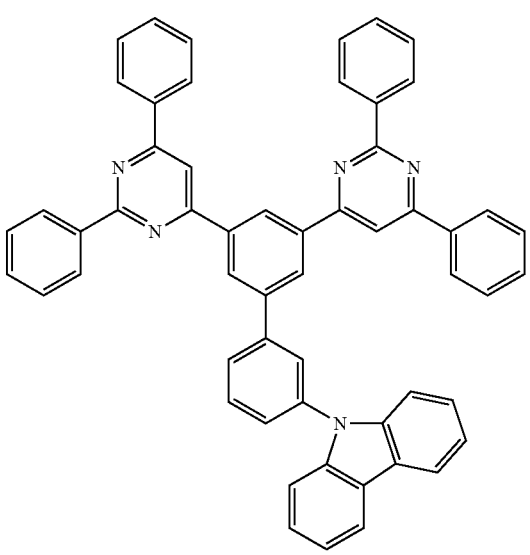

-continued
105
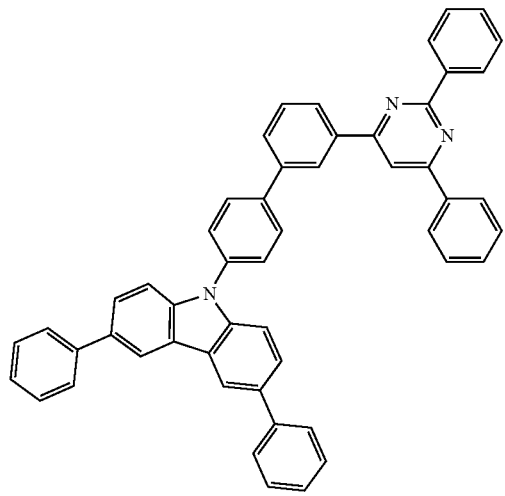
106
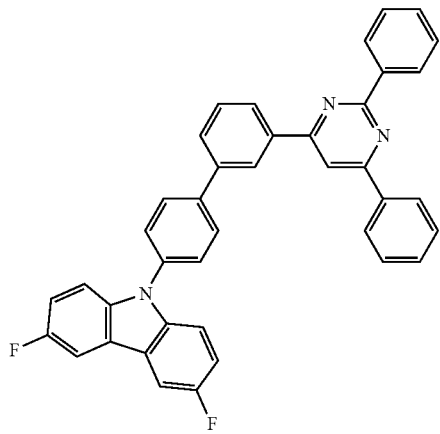
107
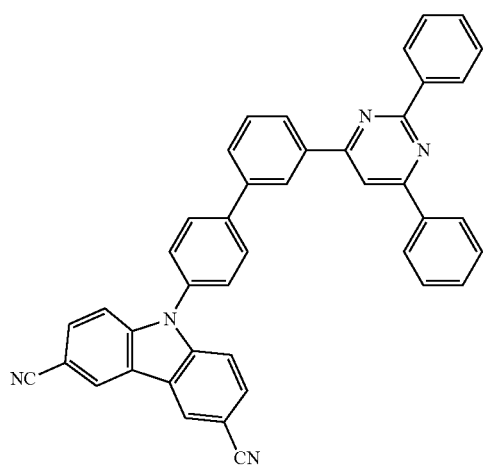
108
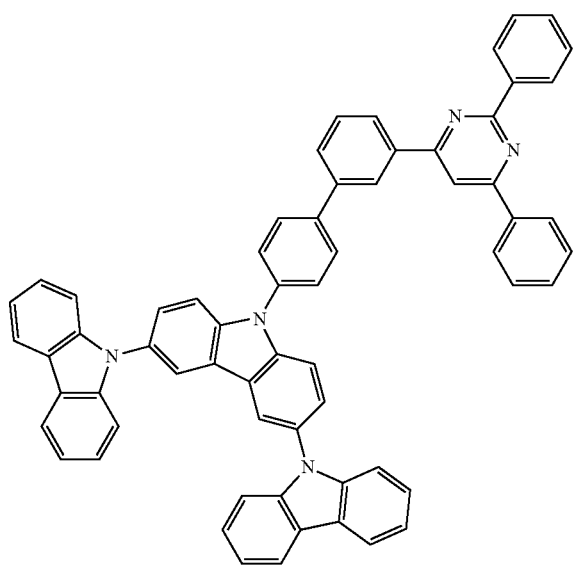
109
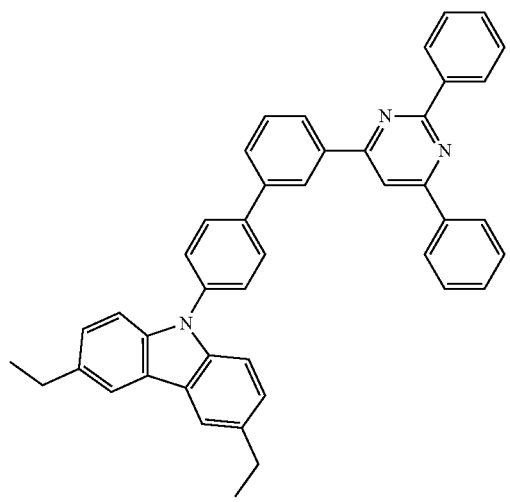
110
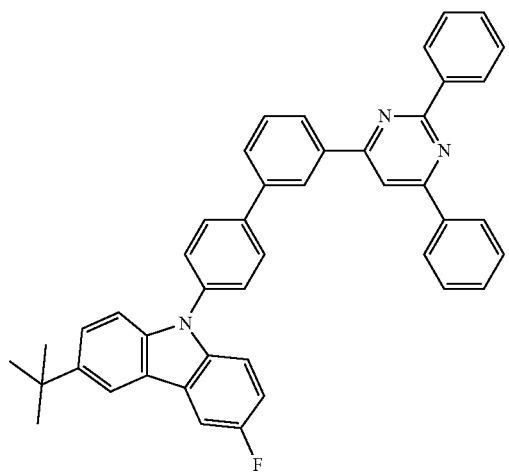

-continued

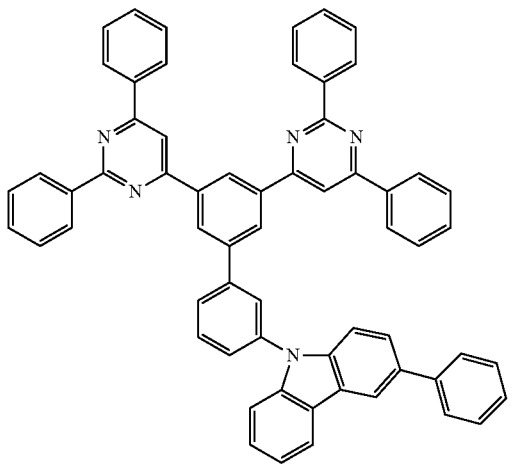
111

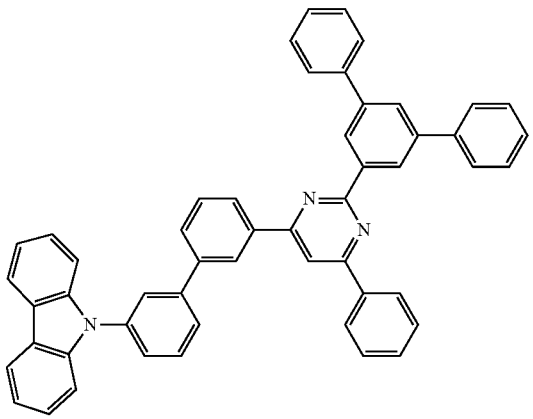
112

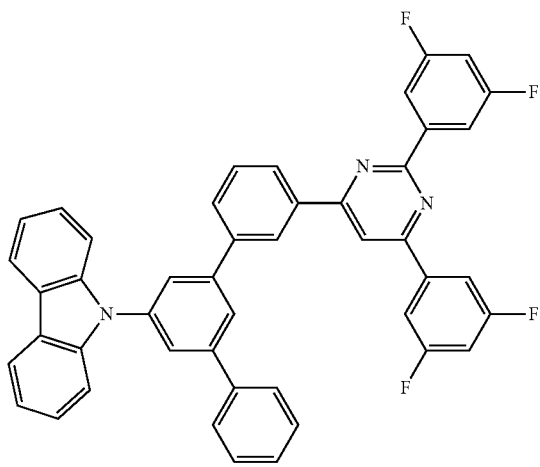
113

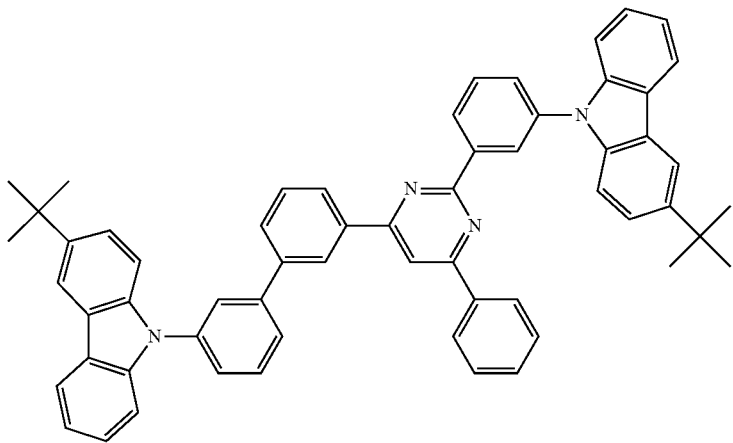
114

The above compounds which exemplify the compound represented by the formula (1) can be synthesized according to various methods, such as the methods disclosed in WO 03/080760, WO 03/078541 and WO 05/085387 brochures.

For example, the compound of Exemplified Compound 4 can be synthesized using m-bromobenzaldehyde as a starting material in accordance with the method disclosed in WO 05/085387 brochure, paragraph numbers to (from page 45, line 11, to page 46, line 18). The compound of Exemplified Compound 45 can be synthesized using 3,5-dibromobenzaldehyde as a starting material in accordance with the method disclosed in WO 03/080760 brochure, page 46, line 9 to line 12. In addition, the compound of Exemplified Compound 68 can be synthesized using N-phenylcarbazole as a starting material in accordance with the method disclosed in WO 05/022962 brochure, page 137, line 10, to page 139, line 9.

In the invention, the compound represented by the formula (1) is not limited in its usage and may be incorporated in any of the organic layers. Examples of a layer suitable for introduction of the compound represented by the formula (1) include a light emitting layer, a hole injection layer, a hole transporting layer, an electron transporting layer, an electron injection layer, an exciton blocking layer and a charge blocking layer. It is preferable that the compound represented by the formula (1) may be introduced into one or any one or more of those layers.

In the invention, in order to suppress a chromaticity change upon high-temperature drive, the compound represented by the formula (1) is introduced into preferably either one of a light emitting layer or a layer adjacent thereto, more preferably a layer adjacent to a light emitting layer. The compound represented by the formula (1) may be introduced into both of a light emitting layer and a layer adjacent thereto.

When the compound represented by the formula (1) is incorporated into a light emitting layer, the compound content is preferably from 0.1% to 99% by mass, far preferably from 1% to 95% by mass, further preferably from 10% to 95% by mass, with respect to the total mass of the light emitting layer.

The invention also relates to a lamination of a thin film containing the phosphorescent metal complex having the monoanionic bidentate ligand represented by the formulas (A1) to (A4) and the metal having a molecular weight of 40 or greater and a thin film containing the compound represented by the formula (1). By using such a laminated film, an organic electroluminescence device showing an excellent luminous efficiency and having a small dependence of luminous efficiency on the film thickness.

[Organic Electroluminescence Device]

The device of the invention will next be described in detail.

The organic electroluminescence device of the invention has, on a substrate thereof, a pair of electrodes and one or more organic layers including a light emitting layer between the electrodes, wherein:

the light emitting layer contains a phosphorescent metal complex containing a monoanionic bidentate ligand represented by the formulas (A1) to (A4) and a metal having a molecular weight of 40 or greater; and any of the organic layers sandwiched between the light emitting layer and the cathode contains the compound represented by the formula (1).

In the organic electroluminescence device of the invention, the light emitting layer is an organic layer, and the organic electroluminescence device has, between the light emitting layer and the cathode, at least one organic layer. It may contain a plurality of organic layers further.

In terms of properties of the luminescence device, it is preferred that at least either of the two electrodes, an anode and a cathode, be transparent or translucent.

FIG. 1 shows one example of structures of the present organic electroluminescence devices. The present organic electroluminescence device 10 shown in FIG. 1 has, on a supporting substrate 2, a light emitting layer 6 sandwiched between an anode 3 and a cathode 9. More specifically, between an anode 3 and a cathode 9, a hole injection layer 4, a hole transporting layer 5, a light emitting layer 6, a hole blocking layer 7 and an electron transporting layer 8 are stacked on in the order of mention.

<Constitution of Organic Layers>

The organic layer has no particular restriction on its layer structure, and the layer structure thereof can be selected appropriately according to purposes of using the organic electroluminescence device. However, it is preferred that the organic layer be formed on the transparent electrode or the back electrode. In such a case, the organic layer is formed on the front of or all over the transparent electrode or the back electrode.

The organic layer has no particular limitations e.g. on its shape, size and thickness, and these factors can be selected as appropriate according to purposes given to the organic layer.

The following are specific examples of a layer structure, but these layer structures should not be construed as limiting the scope of the invention.

Anode/hole transporting layer/light emitting layer/electron transporting layer/cathode Anode/hole transporting layer/light emitting layer/blocking layer/electron transporting layer layer/cathode Anode/hole transporting layer/light emitting layer/blocking layer/electron transporting layer/electron injection layer/cathode Anode/hole injection layer/hole transporting layer/light emitting layer/blocking layer/electron transporting layer/cathode Anode/hole injection layer/hole transporting layer/light emitting layer/blocking layer/electron transporting layer/electron injection layer/cathode The structure, substrate, cathode and anode of an organic electroluminescence device are described e.g. in JP-A-2008-270736, and the items described in such a reference can also be applied to the invention.

<Substrate>

The substrate used in the invention is preferably a substrate which causes neither scattering nor damping of light emitted from the organic layer. When the substrate is made from an organic material, it is preferable that the organic material has excellent heat resistance, dimensional stability, solvent resistance, electrical insulation and workability.

<Anode>

In ordinary cases, it is essential only that the anode should function as an electrode for supplying holes into the organic layer, and there is no particular limitation e.g. on anode's shape, structure and size. And the electrode material can be selected from heretofore known ones as appropriate according to uses and purposes of the luminescence device. As mentioned above, the anode is usually provided in a state of being transparent.

<Cathode>

In ordinary cases, it is essential only that the cathode should function as an electrode for supplying electrons into the organic layer, and there is no particular limitation e.g. on anode's shape, structure and size. And the electrode material can be selected from heretofore known ones as appropriate according to uses and purposes of the luminescence device.

With respect to the substrate, the anode and the cathode, the matters described in JP-A-2008-270736 are applicable in the invention.

<Organic Layer>

The organic layer of the invention will next be described.

—Formation of Organic Layer—

Each organic layer in the present organic electroluminescence device can be suitably formed in accordance with any of a dry film-formation method, such as a vapor deposition method or a sputtering method, a transfer method, a printing method and the like.

(Light Emitting Layer)

—Light Emitting Material—

The light emitting material in the invention is preferably the above-specified phosphorescent complex material.

The light emitting material content in the light emitting layer is generally from 0.1% to 50% by mass with respect to the total mass of compounds constituting the light emitting layer, but from the viewpoints of durability and external quantum efficiency, the content is preferably from 1% to 50% by mass, far preferably from 2% to 40% by mass.

The thickness of the light emitting layer, though not particularly limited, is preferably from 2 nm to 500 nm in ordinary cases. From the viewpoint of external quantum efficiency in particular, the thickness is far preferably from 3 nm to 200 nm, further preferably from 5 nm to 100 nm.

The light emitting layer in the present device may be constituted of only a light emitting material or a mixture of a light emitting material with a host material. The light emitting material may be either a fluorescent material or a phosphorescent material, and one or two or more types of dopant may be added thereto. The host material is preferably a charge transport material. One type of host material or two or more types of host materials may be used. For instance, the host material may be constituted of a mixture of an electron transporting host material and a hole transporting host material. Further, the light emitting layer may contain a material which neither has a charge transporting property nor emits light.

Additionally, the light emitting layer may be a single layer, or it may include multiple (two or more) constituent layers. When the light emitting layer includes multiple constituent layers, each of the multiple constituent layers may emit light different in luminescent color.

—Host Material—

The host material used in the invention may contain the following compounds. Examples thereof include pyrrole, indole, carbazole (including CBP (4,4'-di(9-carbazolyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin compounds, polysilane compounds, poly(N-vinylcarbazole), aniline copolymers, thiophene oligomers, oligomers of conductive polymers like polythiophene, organic silanes, carbon film, pyridine, pyrimidine, triazine, anthraquinodimethane, anthrone, diphenylquinone, thiopyran dioxide, carbodiimide, fluorelenylidenemethane, distyrylpyrazine, fluoro-substituted aromatic compounds, tetracarboxylic acid anhydrides of condensed aromatic ring compounds such as naphthalene and perylene, phthalocyanine, various kinds of metal complexes, typified by metal complexes of 8-quinolinol derivatives and metal complexes whose ligands are metallo-phthalocyanines, benzoxazole or benzothiazole molecules, and derivatives of the above-recited metal complexes (e.g. those replaced with substituents or those condensed with other rings).

In the light emitting layer according to the invention, it is preferable that the lowest triplet-state excitation energy ($T_1$ energy) of the host materials is higher than $T_1$ energy of the phosphorescent materials in terms of color purity, luminous efficiency and durability under driving.

The host-compound content in the invention is not particularly limited, but in terms of luminous efficiency and drive voltage it is preferably from 15% to 98% by mass with respect to the total mass of all compounds constituting the light emitting layer.

—Fluorescent Material—

Examples of a fluorescent material usable in the invention include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various kinds of complexes typified by complexes of 8-quinolinol derivatives and complexes of pyrromethene derivatives, polymeric compounds such as polythiophene, polyphenylene and polyphenylenevinylene, and compounds like organic silane derivatives.

—Phosphorescent Material—

Examples of a phosphorescent material usable in the invention include the compounds represented by the formula (T-1), and besides, they include the phosphorescent compounds as disclosed in U.S. Pat. Nos. 6,303,238B1, 6,097,147, WO 00/57676, WO 00/70655, WO 01/08230, WO 01/39234A2, WO 01/41512A1, WO 02/02714A2, WO 02/15645A1, WO 02/44189A1, WO 05/19373A2, JP-A-2001-247859, JP-A-2002-302671, JP-A-2002-117978, JP-A-2003-133074, JP-A-2002-235076, JP-A-2003-123982, JP-A-2002-170684, EP 1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635 and JP-A-2007-96259. Examples of luminescent dopants which are far preferred among those compounds include the Ir complexes, the Pt complexes, the Cu complexes, the Re complexes, the W complexes, the Rh complexes, the Ru complexes, the Pd complexes, the Os complexes, the Eu complexes, the Tb complexes, the Gd complexes, the Dy complexes and the Ce complexes. Of these complexes, Ir complexes, the Pt complexes and the Re complexes are particularly preferable, notably Ir complexes, the Pt complexes and the Re complexes each having at least one kind of coordination bond selected from metal-carbon, metal-nitrogen, metal-oxygen and metal-sulfur coordinate bonds. In terms of luminous efficiency, durability under driving, chromaticity and so on, the Ir complexes, the Pt complexes and the Re complexes each having a polydentate ligand, including a tridentate ligand or higher, are preferred over the others.

The content of phosphorescent materials in the light emitting layer is preferably in a range from 0.1% to 50% by mass, far preferably from 0.2% to 50% by mass, further preferably from 0.3% to 40% by mass, especially preferably from 10% to 30% by mass, with respect to the total mass of the light emitting layer.

The content of the phosphorescent materials usable in the invention (the specified phosphorescent metal complex and/or the phosphorescent material to be used in combination) is preferably in a range from 0.1% to 50% by mass, far preferably from 1% to 40% by mass, especially preferably from 5% to 30% by mass, with respect to the total mass of the light emitting layer. In the range from 5% to 30% by mass in particular, luminescence chromaticity of the organic electroluminescence device has small dependence on the concentration of added phosphorescent materials.

It is the best for the present organic electroluminescence device to incorporate at least one of the specified phosphorescent metal complexes in an amount of 5% to 30% by mass with respect to the total mass of the light emitting layer.

The organic electroluminescence devices preferably contain a hydrocarbon compound, notably in their respective light emitting layers.

And the hydrocarbon compound is preferably a compound represented by the following formula (VI).

The proper use of the compound represented by the formula (VI) in combination with the light emitting materials makes it possible to appropriately control interactions between molecules of the material and to render energy-gap interaction between neighboring molecules uniform, thereby allowing further reduction in drive voltage.

Moreover, the compound which is represented by the formula (VI) and usable in organic electroluminescence devices has excellent chemical stability, and slightly causes degradation, such as decomposition, in materials under driving of the devices, and therefore the organic electroluminescence devices containing the compound of the formula (VI) can avoid reduction in their efficiency and lifespan through decomposition of the materials.

The compound represented by the formula (VI) is explained below

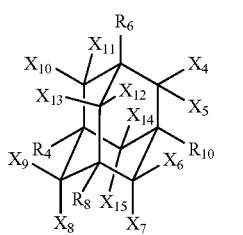

(VI)

In the formula (VI), each of $R_4$, $R_6$, $R_8$, $R_{10}$ and $X_4$ to $X_{15}$ independently represents a hydrogen atom, an alkyl group or an aryl group.

The alkyl group represented by each of $R_4$, $R_6$, $R_8$, $R_{10}$ and $X_4$ to $X_{15}$ in the formula (VI) may have as a substituent an adamantane structure or an aryl structure, and the number of carbon atoms in the alkyl group is preferably from 1 to 70, far preferably from 1 to 50, further preferably from 1 to 30, still further preferably from 1 to 10, especially preferably from 1 to 6. And the most preferable alkyl groups are linear alkyl groups having 2 to 6 carbon atoms.

Examples of the alkyl group represented by each of $R_4$, $R_6$, $R_8$, $R_{10}$ and $X_4$ to $X_{15}$ in the formula (VI) include an n-$C_{50}H_{101}$ group, an n-$C_{30}H_{61}$ group, 3-(3,5,7-triphenyladamantane-1-yl)propyl group (number of carbon atoms: 31), a trityl group (number of carbon atoms: 19), 3-(adamantane-1-yl)propyl group (number of carbon atoms: 13), 9-decalyl group (number of carbon atoms: 10), a benzyl group (number of carbon atoms: 7), a cyclohexyl group (number of carbon atoms: 6), a n-hexyl group (number of carbon atoms: 6), an n-pentyl group (number of carbon atoms: 5), an n-butyl group (number of carbon atoms: 4), an n-propyl group (number of carbon atoms: 3), a cyclopropyl group (number of carbon atoms: 3), an ethyl group (number of carbon atoms: 2) and a methyl group (number of carbon atoms: 1).

The aryl group represented by each of $R_4$, $R_6$, $R_8$, $R_{10}$ and $X_4$ to $X_{15}$ in the formula (VI) may have as a substituent an adamantane structure or an alkyl structure, and the number of carbon atoms the aryl group has is preferably from 6 to 30, far preferably from 6 to 20, further preferably from 6 to 15, especially preferably from 6 to 10, the most preferably is 6.

Examples of the aryl group represented by each of $R_4$, $R_6$, $R_8$, $R_{10}$ and $X_4$ to $X_{15}$ in the formula (VI) include a 1-pyrenyl group (number of carbon atoms: 16), a 9-anthracenyl group (number of carbon atoms: 14), a 1-naphthyl group (number of carbon atoms: 10), a 2-natphthyl group (number of carbon atom: 10), a p-t-butylphenyl group (number of carbon atoms: 10), a 2-m-xylyl group (number of carbon atoms: 8), a 5-m-xylyl group (number of carbon atoms: 8), an o-tolyl group (number of carbon atoms: 7), a m-tolyl group (number of carbon atoms: 7), a p-tolyl group (number of carbon atoms: 7) and a phenyl group (number of carbon atoms: 6).

Although each of $R_4$, $R_6$, $R_8$ and $R_{10}$ in the formula (VI) may be either a hydrogen atom, or an alkyl group, or an aryl group, from the viewpoint that high glass transition temperatures are preferable, it is preferable that at least one of them is an aryl group, it is far preferable that at least two of them are aryl groups, and it is particularly preferable that 3 or 4 of them are aryl groups.

Although each of $X_4$ to $X_{15}$ in the formula (VI) may be either a hydrogen atom, or an alkyl group, or an aryl group, it is preferable that each are a hydrogen atom or an aryl group, especially a hydrogen atom.

The organic electroluminescence devices are made using a vacuum deposition process or a solution coating process, and therefore, in terms of vacuum deposition suitability and solubility, the molecular weight of the compounds represented by the formula (VI) in the invention is preferably 2,000 or below, far preferably 1,200 or below, especially 1,000 or below. Also, from the viewpoint of vacuum deposition suitability, the molecular weight is preferably 250 or above, far preferably 350 or above, particularly preferably 400 or above. This is because, when the compounds have too low molecular weight, their vapor pressure becomes low and change from a vapor phase to a solid phase does not occur, and it is therefore difficult for the compounds to form organic layers.

The compound represented by the formula (VI) is preferably in solid phase at room temperature (25° C.), far preferably solid phase in a range from room temperature to 40° C., especially preferably solid phase in a range from room temperature to 60° C.

In the case of using the compound which, though represented by the formula (VI), is not in solid phase at room temperature, it is possible to form a solid phase at ordinary temperatures by combining the compound with other substances.

Uses of the compound represented by the formula (VI) are not limited, and the compound may be incorporated into any of the organic layers. The layer into which the compound represented by the formula (VI) in the invention is introduced is preferably a layer selected from a light emitting layer, a hole injection layer, a hole transporting layer, an electron transporting layer, an electron injection layer, an exciton blocking layer and a charge blocking layer, or a combination of two or more of these layers, far preferably a layer selected from the light emitting layer, the hole injection layer, the hole transporting layer, the electron transporting layer and the electron injection layer, or a combination of two or more of these layers, especially preferably a layer selected from the light emitting layer, the hole injection layer and the hole transporting layer, or a combination of at least two of these layers, the most preferably the light emitting layer.

When the compound represented by the formula (VI) is used in an organic layer, its content is required to be limited so as not to inhibit charge transportability, and therefore it is preferable from 0.1% to 70% by mass, far preferable from 0.1% to 30% by mass, especially preferable from 0.1% to 25% by mass.

When the compound represented by the formula (VI) is used in two or more organic layers, its content in each organic layer is preferably in the range specified above.

Into any one of the organic layers, only one among the compounds represented by the formula (VI) may be incorporated, or any two or more of the compounds represented by the formula (VI) may be combined in arbitrary proportions and incorporated.
Examples of the hydrocarbon compound are illustrated below, but the invention should not be construed as being limited to these examples.
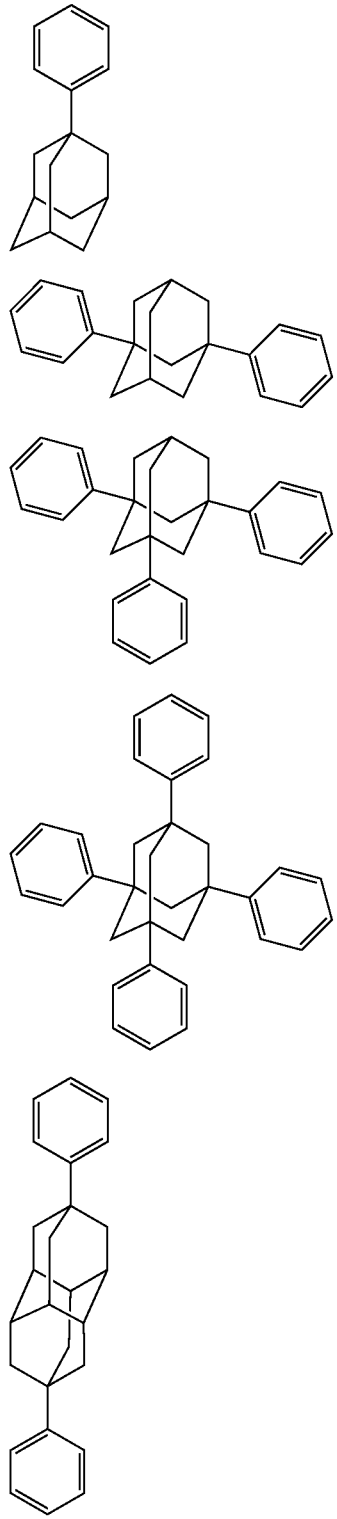
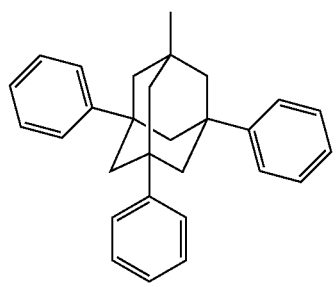
(1-6)
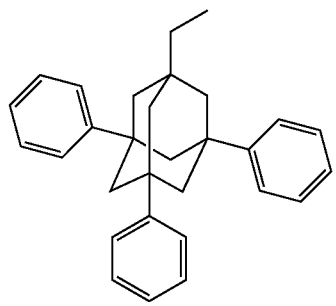
(1-7)
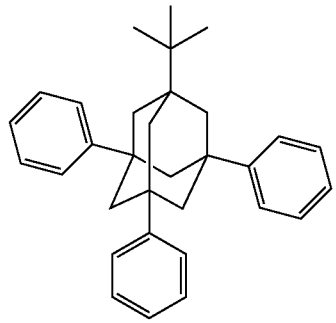
(1-8)
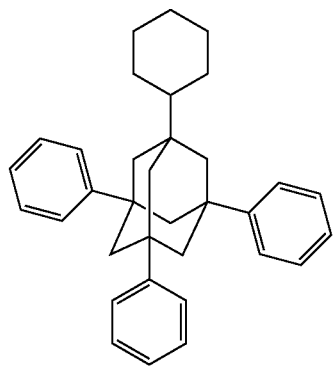
(1-9)

(1-10)
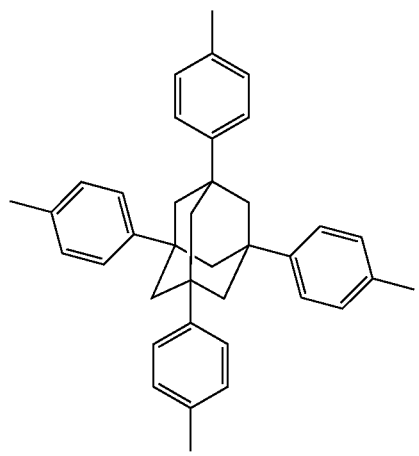
(1-11)
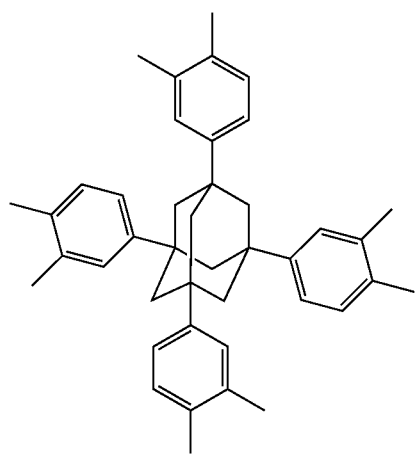
(1-12)
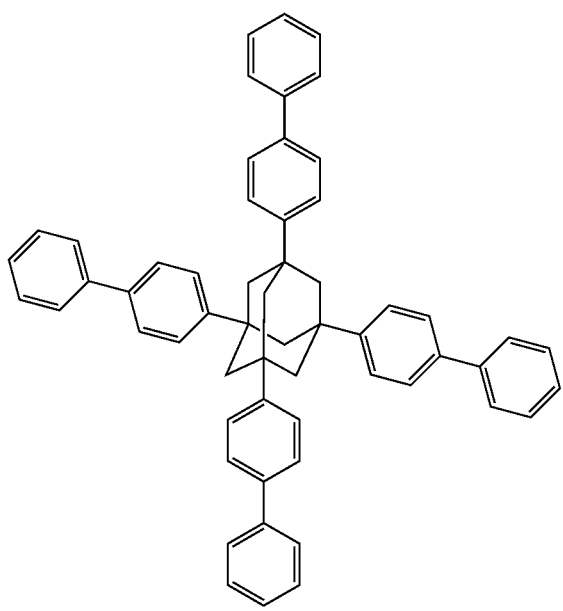
(1-13)
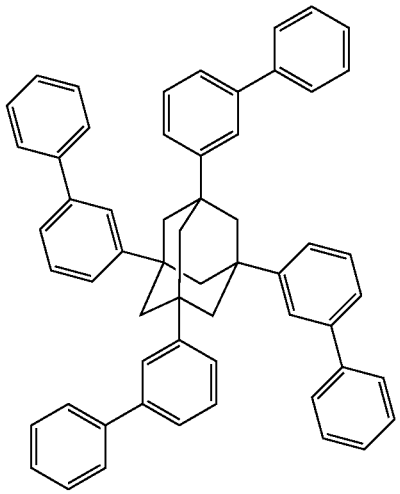
(1-14)
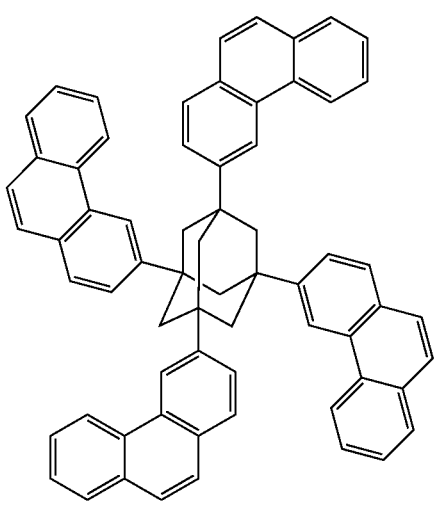
(1-15)
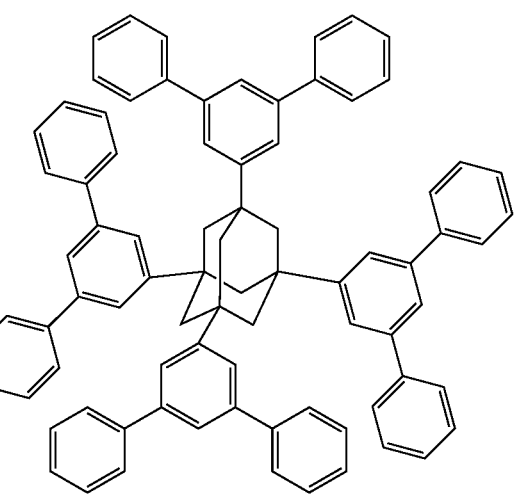

(1-16)
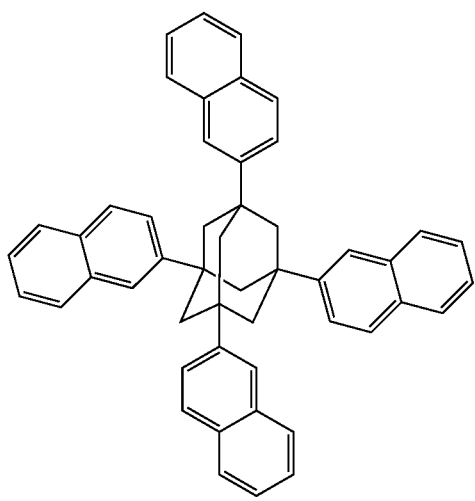
(1-17)
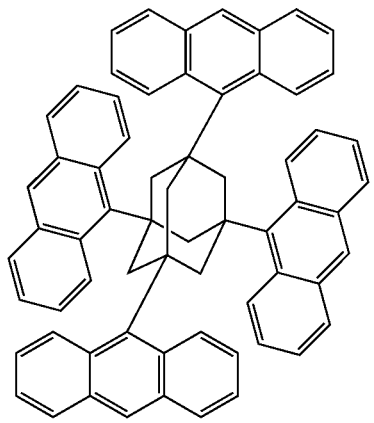
(1-18)
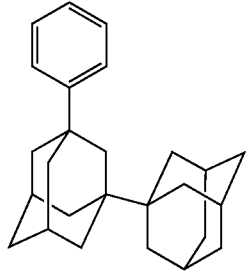
(1-19)
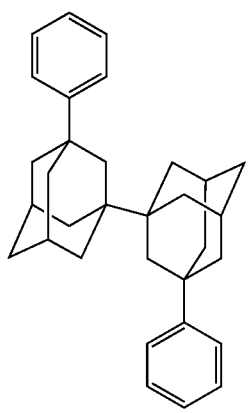
(1-20)
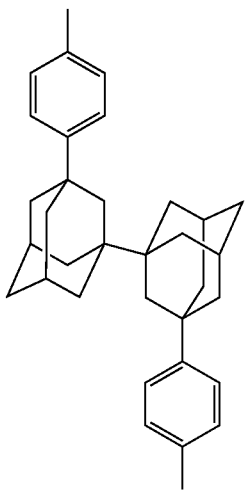
(1-21)
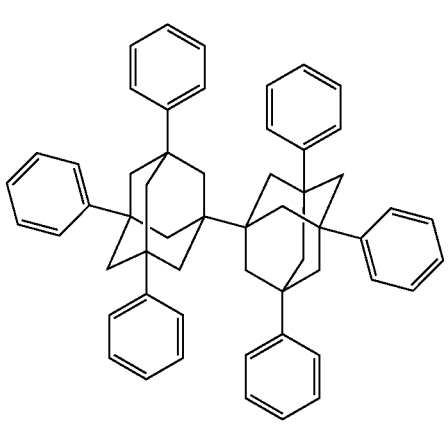
(1-22)
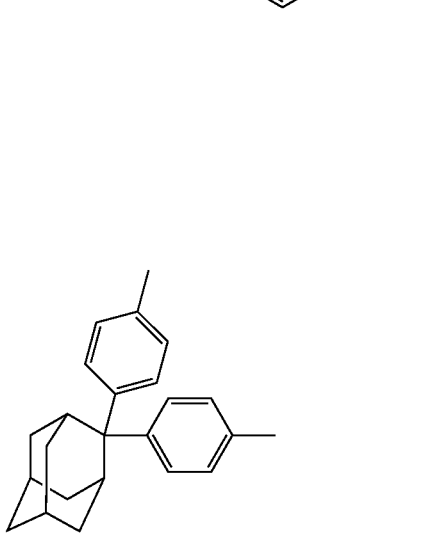

-continued
(1-23)
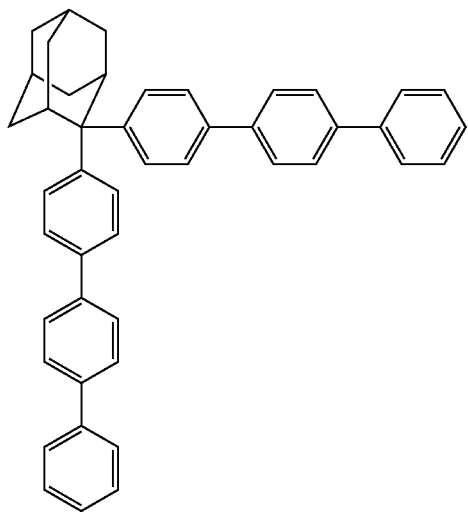
(1-24)
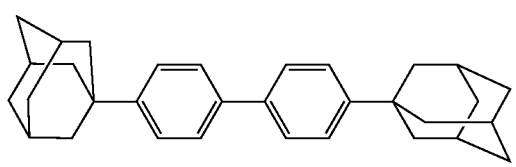
(1-25)
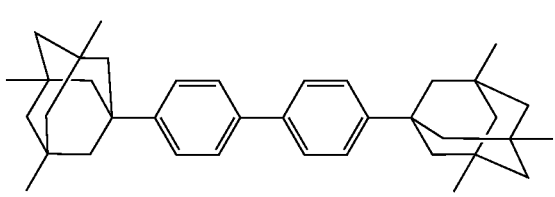
(1-26)
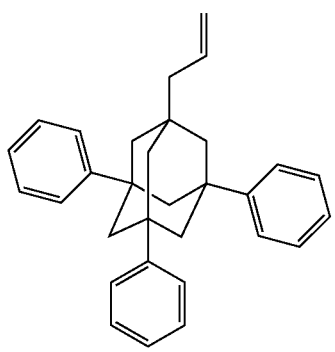
(1-27)
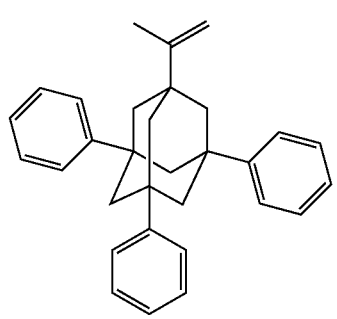
(1-28)
(1-29)
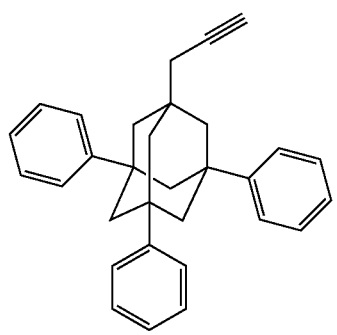
(1-30)
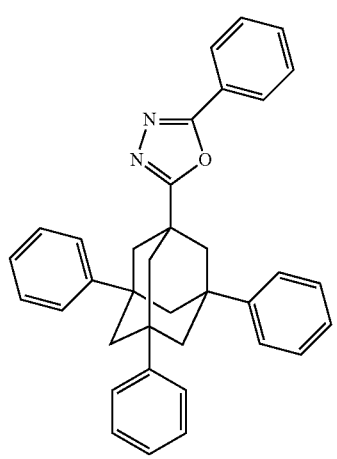

(1-31)
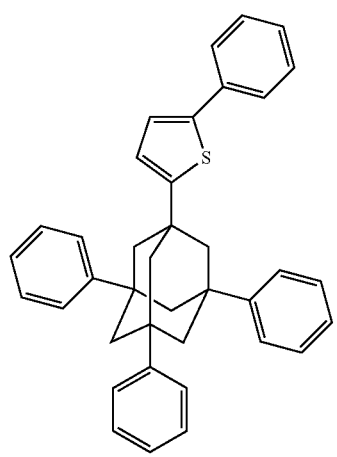
(1-32)
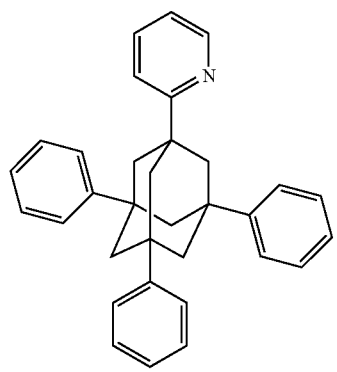
(1-33)
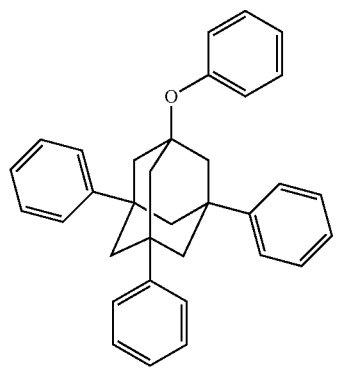
(1-34)
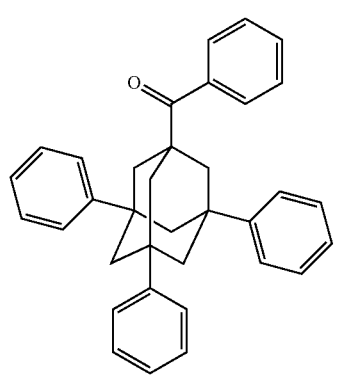
(1-35)
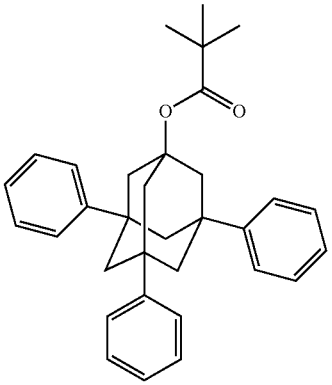
(1-36)
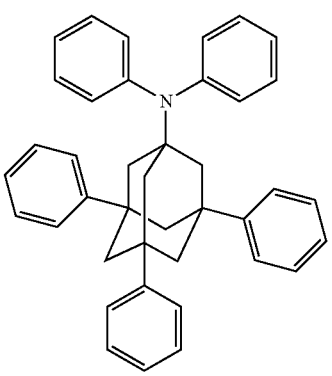
(1-37)
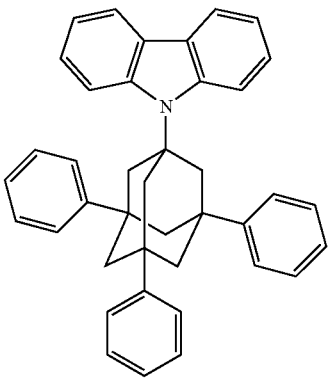
(1-38)
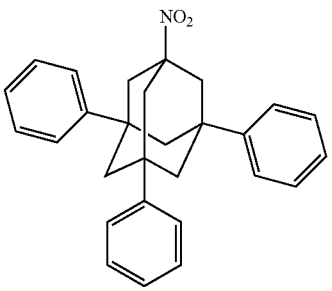

(1-39)
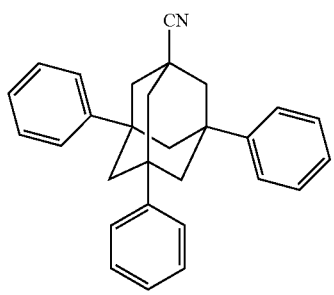
(1-40)
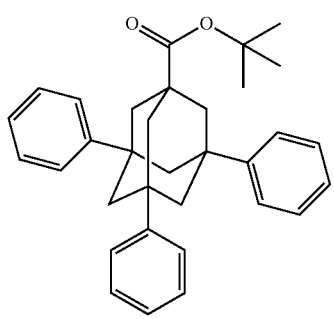
(1-41)
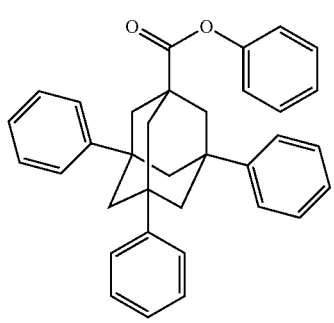
(1-42)
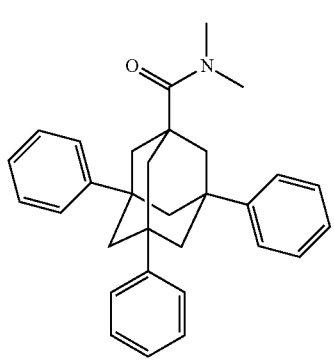
(1-43)
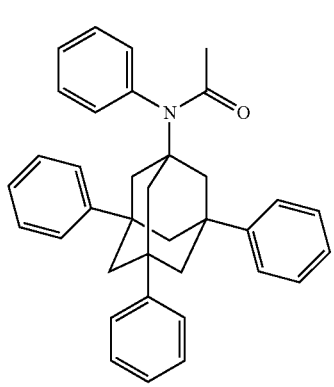
(1-44)
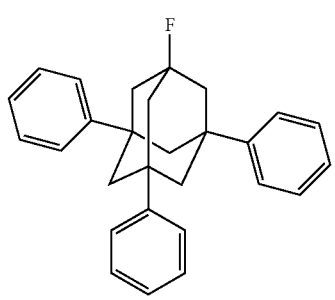
(1-45)
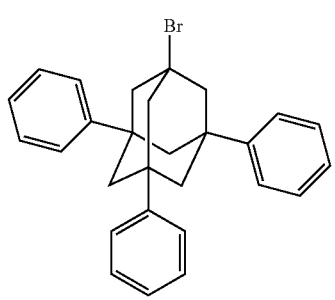
(1-46)
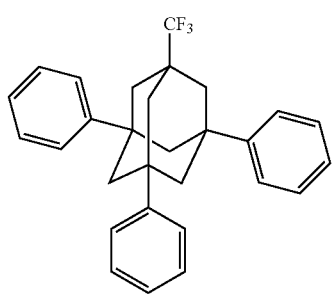
(1-47)
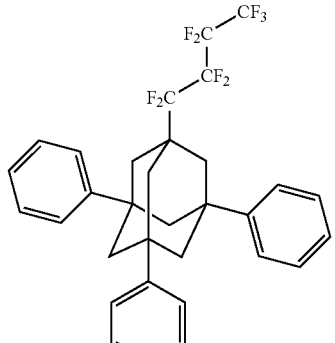
(1-48)
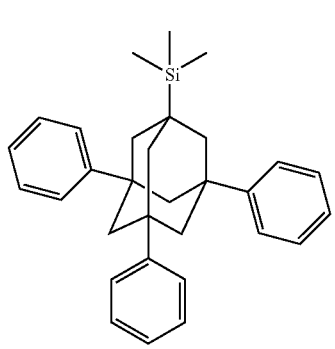

-continued (1-49)

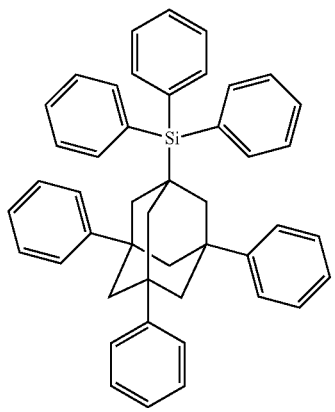

The compound represented by the formula (VI) can be synthesized by appropriately combining adamantane or haloadamantane with haloalkane or alkylmagnesium halide (Grignard reagent). For instance, it is possible to provide coupling between haloadamantane and haloalkane by use of indium (Reference 1). Alternatively, it is possible to convert haloalkane into an alkylcopper reagent and further to couple the reagent to Grignard reagent of an aromatic compound (Reference 2). Further, the coupling of haloalkane can also be performed using an appropriate arylboric acid and a palladium catalyst (Reference 3).

Reference 1: Tetrahedron Lett. 39, 1998, 9557-9558
Reference 2: Tetrahedron Lett. 39, 1998, 2095-2096
Reference 3: J. Am. Chem. Soc. 124, 2002, 13662-13663

The adamantane structure having an aryl group can be synthesized by appropriately combining adarnantane or haloadamantane with the corresponding arene or haloarene.

Additionally, even when defined substituents undergo changes under certain synthesis conditions in those production methods or they are unsuitable for carrying out those methods, the intended compounds can be produced with ease by adopting e.g. methods for protecting and deprotecting functional groups (T. W. Greene, Protective Groups in Organic Synthesis, John Wiley & Sons Inc. (1981)). Further, it is also possible to change the order of reaction steps, including a substituent introduction step, as appropriate, if needed.

In general the thickness of the light emitting layer, though not particularly limited, is preferably from 1 nm to 500 nm, far preferably from 5 nm to 200 nm, further preferably from 10 nm to 100 nm.

—Hole Injection Layer, Hole Transporting Layer—

A hole injection layer and a hole transporting layer are layers having a function of receiving holes from an anode or anode side and transporting them to a cathode side.

In the invention, the organic layers preferably include a hole injection layer or hole transporting layer containing an electron accepting dopant.

—Electron Injection Layer, Electron Transporting Layer—

An electron injection layer and an electron transporting layer are layers having a function of receiving electrons from a cathode or a cathode side and transporting them to an anode side. At least one of the electron injection layer and the electron transporting layer in the invention contains the compound represented by the formula (1). The content of the compound represented by the formula (1) in the electron injection layer or electron transporting layer is preferably from 30% to than 100%, more preferably from 50% to 100%, still more preferably 70% to 100%.

By using the light emitting layer containing the phosphorescent metal complex having a ligand represented by the formulas (A1) to (A4) according to the invention in combination with an electron transporting layer containing the compound represented by the formula (1), diffusion of an excitation energy generated in the light emitting layer can be prevented due to a high level of the lowest triplet excited state energy ($T_1$ energy) which the compound represented by the formula (1) has, leading to improvement in luminous efficiency. Further, the light emitting layer containing the phosphorescent metal complex having a ligand represented by the formulas (A1) to (A4) is presumed to have a good balance between holes and electrons when electrons are injected from a certain energy level. The conduction level of electrons of a layer adjacent to the light emitting layer into which the electrons are injected therefore becomes important for controlling the carrier balance. On the other hand, the emission spectrum of the device tends to greatly depend on the carrier balance because the wavelength of the emission spectrum enhanced by interference differs, depending on the light emission position. It is therefore known that a change in spectrum occurs with a change in the film thickness of the electron transporting layer. The energy level of the compound represented by the formula (1) for effectively injecting electrons is presumed to reach the level capable of controlling the carrier balance of the light emitting layer of the invention. As a result, almost no change in the spectrum occurs even by changing the film thickness of the electron transporting layer.

The description in the paragraphs from to of Japanese Patent Laid-Open No. 2008-270736 can be applied to the hole injection layer, hole transporting layer, hole injection layer, and hole transporting layer of the invention.

—Hole Blocking Layer—

The hole blocking layer is a layer having a function of blocking the holes transported from an anode side to the light emitting layer from passing on through to the cathode side. In the invention, the hole blocking layer can be provided as an organic layer adjacent to the light emitting layer in the cathode side.

Examples of organic compounds constituting the hole blocking layer include, in addition to the compounds represented by the formula (1) according to the invention, aluminum complexes such as aluminum(III) bis(2-methyl-8-quinolinato) 4-phenylphenolate (abbreviated to BAlq), triazole derivatives, and phenanthroline derivatives such as 2,9-dimethyl-4,7-diphenyl-1,10-phenanthroline (abbreviated to BCP).

The thickness of the hole blocking layer is preferably from 1 nm to 500 nm, far preferably from 5 nm to 200 nm, further preferably from 10 nm to 100 nm.

The hole blocking layer may have either a single-layer structure made up of one or more than one material as recited above or a multiple-layer structure made up of two or more layers which are identical or different in composition.

—Electron Blocking Layer—

The electron blocking layer is a layer having a function of preventing the electrons transported from the cathode side to the light emitting layer from passing through to the anode side. In the invention, the electron blocking layer can be provided as an organic layer adjacent to the light emitting layer on the anode side.

As the examples of the compounds constituting the electron blocking layer, for instance, the hole transporting materials described above can be applied.

The thickness of the electron blocking layer is preferably from 1 nm to 500 nm, more preferably from 5 nm to 200 nm, still more preferably from 10 nm to 100 nm.

The electron blocking layer may have a single layer structure composed of one or more of the above materials or may be a multilayer structure composed of two or more layers having the same composition or different compositions.

<Protective Layer>

In the invention, the whole of the organic EL device may be coated with a protective layer.

With respect to the protective layer, the matters described in JP-A-2008-270736, paragraph numbers to, are applicable in the invention.

<Sealing Container>

The present devices may be sealed in their entirety through the use of sealing enclosure.

With respect to the sealing enclosure, the matters described in JP-A-2008-270736 are applicable in the invention.

(Drive)

The present organic electroluminescence devices each can produce luminescence when direct-current (which may include an alternating current component as required) voltage (ranging usually from 2 to 15 volts) or direct current is applied between the anode and the cathode.

To a driving method for the present organic electroluminescence devices, the driving methods as disclosed in JP-A-2-148687, JP-A-6-301355, JP-A-5-29080, JP-A-7-134558, JP-A-8-234685, JP-A-8-241047, Japanese Patent No. 2784615, U.S. Pat. Nos. 5,828,429 and 6,023,308 can be applied.

The present organic electroluminescence devices can be heightened in light extraction efficiency by utilizing various publicly-known improvements. For instance, it is possible to improve light extraction efficiency and increase external quantum efficiency by working on the substrate's surface profile (e.g. forming a pattern of microscopic asperities on the substrate's surface), or by controlling refractive indices of the substrate, the ITO layer and the organic layers, or by controlling thicknesses of the substrate, the ITO layer and the organic layers, or so on.

The present luminescence devices may adopt a mode of extracting luminescence from the anode side, or the so-called top luminous mode.

The present organic EL devices may have resonator structure. For instance, each device has on a transparent substrate a multilayer film mirror made up of a plurality of laminated films that have different refractive indices, a transparent or translucent electrode, a light emitting layer and a metal electrode which are superposed on top of each other. Reflections of light produced in the light emitting layer occur repeatedly between the multilayer film mirror and the metal electrode which function as reflector plates, thereby producing resonance.

In another aspect, the transparent or translucent electrode and the metal electrode function as reflector plates, respectively, on the transparent substrate, and reflections of light produced in the light emitting layer occur repeatedly between the reflector plates, thereby producing resonance.

In order to form a resonance structure, the optical distance determined from effective refractive indices of the two reflector plates, and refractive indices and thicknesses of each layers sandwiched between the two reflector plates are adjusted to have optimum values for achieving the desired resonance wavelength. The calculating formula in the first aspect case is described in JP-A-9-180883, and that in the second aspect case is described in JP-A-2004-127795.

The external quantum efficiency of the organic electroluminescence device of the invention is preferably 5% or greater, more preferably 7% or greater. As the external quantum efficiency, the maximum external quantum efficiency when the device is driven at 20° C. or the external quantum efficiency near 100 to 300 cd/m$^2$ when the device is driven at 20° C. can be used.

The internal quantum efficiency of the organic electroluminescence device of the invention is preferably 30% or greater, more preferably 50% or greater, still more preferably 70% or greater. The internal quantum efficiency of the device is determined by dividing an external quantum efficiency with a light extraction efficiency. Although the light extraction efficiency of the ordinary organic EL device is about 20%, the light extraction efficiency can be increased to 20% or greater by devising the shape of substrate, the shape of electrode, the thickness of the organic layer, the thickness of an inorganic layer, the refractive index of the organic layer, the refractive index of the inorganic layer or the like.

The organic electroluminescence device of the invention has a maximum emission wavelength (maximum intensity wavelength of emission spectrum) of preferably from 350 nm to 700 nm, more preferably from 350 nm to 600 nm, still more preferably from 400 nm to 520 nm, especially preferably from 400 nm to 465 nm.

(Intended Use of the Luminescence Device of the Invention)

The present luminescence devices can be used suitably for light luminous apparatus, pixels, indication devices, displays, backlights, electrophotographic devices, illumination light sources, recording light sources, exposure light sources, readout light sources, sign, billboards, interior decorations or optical communications, especially preferably for devices driven in a region of high-intensity luminescence, such as illumination apparatus and display apparatus.

Next the present light luminous apparatus is explained by reference to FIG. 2.

The present light luminous apparatus incorporates any one of the present organic electroluminescence devices.

Figure 2:
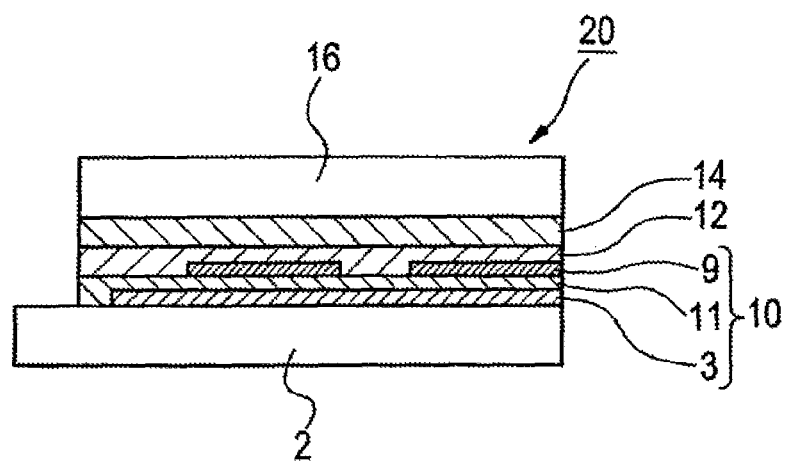
FIG. 2 is a schematic diagram showing an example of light luminous apparatus relating to a second embodiment of the invention.

FIG. 2 is a cross-sectional diagram schematically showing one example of the present light luminous apparatus.

The light luminous apparatus 20 in FIG. 2 includes a transparent substrate 2 (supporting substrate), an organic electroluminescence device 10, a sealing enclosure 16 and so on.

The organic electroluminescence device 10 is formed by stacking on the substrate 2 an anode 3 (first electrode), an organic layer 11 and a cathode 9 (second electrode) in the order of mention. In addition, a protective layer 12 is superposed on the cathode 9, and on the protective layer 12 a sealing enclosure 16 is further provided via an adhesive layer 14. Incidentally, part of each of the electrodes 3 and 9, a diaphragm and an insulating layer are omitted in FIG. 2.

Herein, a light cure adhesive such as epoxy resin, or a thermosetting adhesive can be used for the adhesive layer 14. Alternatively, a thermosetting adhesive sheet may be used as the adhesive layer 14.

The present light luminous apparatus has no particular restrictions as to its uses, and specifically, it can be utilized e.g. as not only illumination apparatus but also display apparatus of a television set, a personal computer, a mobile phone, an electronic paper or the like.

(Illumination Apparatus)

Then, illumination apparatus relating to an embodiment of the invention is explained by reference to FIG. 3.

Figure 3:
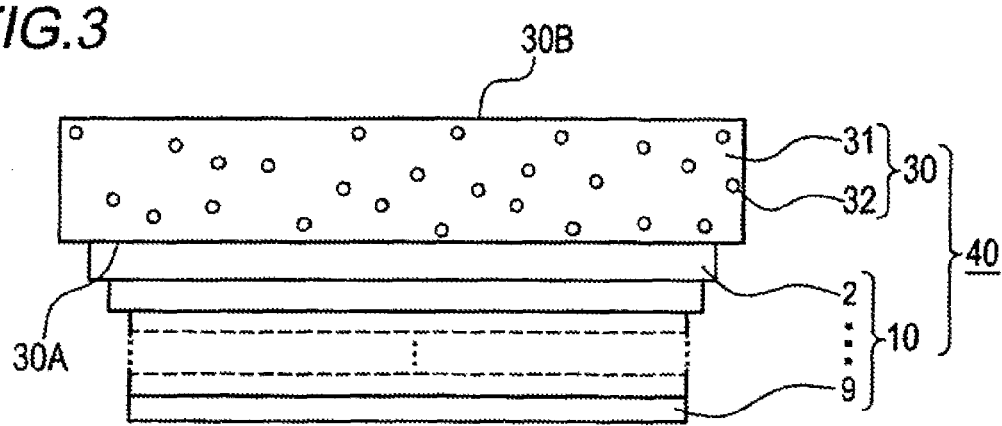
FIG. 3 is a schematic diagram showing an example of illumination apparatus relating to a third embodiment of the invention.

FIG. 3 is a cross-sectional diagram schematically showing one example of the illumination apparatus relating to an embodiment of the invention.

As shown in FIG. 3, the illumination apparatus 40 relating to an embodiment of the invention is equipped with the organic electroluminescence device 10 and a light scattering member 30. More specifically, the illumination apparatus 40 is configured to bring the substrate 2 of the organic electroluminescence device 10 into a contact with the light scattering member 30.

The light scattering member 30 has no particular restriction so long as it can scatter light. In FIG. 3, it is illustrated as a member obtained by dispersing fine particles 32 in a transparent substrate 21. Preferred examples of the transparent substrate 31 include a glass substrate. And fine particles of transparent resin can be given as a suitable example of fine particles 32. In such illumination apparatus 40, light emitted from the organic electroluminescence device 10 enters the light scattering member 30 at the light incidence plane 30A, the entering light is scattered by the light scattering member, and the light scattered emerges from the light exit plane 30B as light for illumination.

The invention will now be illustrated in more detail by reference to the following examples, but these examples should not be construed as limiting the scope of the invention.

Exemplified compound 4 and Exemplified compound 43 were synthesized by reference to WO 03/080760, WO 03/078541, WO 05/085387, and WO 05/022962. For instance, Exemplified compound 4 can be synthesized using the process described in paragraphs to (from page 45, line 11 to page 46, line 18) in WO 05/085387, while using m-bromobenzaldehyde as a starting raw material. Exemplified compound 45 can be synthesized by using the process described on page 46, line 9 to page 46, line 12 in WO 03/080760, while using 3,5-dibromobenzaldehyde as a starting material. Exemplified compound 77 can be synthesized by using the process described on page 137, line 10 to page 139, line 9 in WO 05/022962, while using N-phenylcarbazole as a starting raw material.

XM-64 and XM-63 were synthesized by using various processes such as those described in, for instance, US2007/0190359 and US 2008/0297033.

More specifically, XM-64 can be synthesized by using a process described in paragraphs to of US2007/0190359 while using 7-methylimidazophenanthridine as a starting raw material, while XM-63 can be synthesized in a process described in paragraphs to of US2008/0297033.

All the organic materials used in Examples herein were provided after purification by sublimation.

EXAMPLE 1

A 0.5-mm thick and 2.5-cm square glass substrate (product of Geomatec Corp., surface resistance: 10 Ω/□) having an indium tin oxide (ITO) film was placed in a washing container. After ultrasonic washing in 2-propanol, the substrate was subjected to UV-ozone treatment for 30 minutes. The following organic layers were deposited successively on the resulting transparent anode (ITO film) by vapor deposition.

First layer: ITO/CuPc (copper phthalocyanine), film thickness: 10 nm
Second layer: NPD (N,N'-di-α-naphthyl-N,N'-diphenyl)-benzidine), film thickness: 30 nm
Third layer: dopant (10 mass %), host material (mCBP) (90 mass %), film thickness: 30 nm
Fourth layer: first electron transporting material (BAlq), film thickness: 40 nm
Fifth layer: second electron transporting material (Alq (tris(8-hydroxyquinoline)aluminum complex)), film thickness: 0 nm Then, lithium fluoride and metal aluminum were deposited on the fifth layer to give their thicknesses of 0.2 nm and 70 nm, respectively, to form a cathode.

The resulting laminate was placed in a glove box purged with an argon gas without bringing it into contact with air and then sealed by using a sealing can made of stainless and an ultraviolet curable adhesive ("XNR5516HV, product of Nagase Chiba) to obtain the device 1 of the invention.

EXAMPLES 2 TO 33 AND COMPARATIVE EXAMPLES 1 TO 47

Each of the devices of Examples 2 to 33 and Comparative Examples 1 to 47 was manufactured in a manner similar to that employed in Example 1 except that the constituent materials used in Example 1 were changed as described in the following Tables 1 to 4. In these tables, the unit of the film thickness is nm.

TABLE 1

| Device | Host | Dopant (concentration) | First electron transporting material (film thickness) | Second electron transporting material (film thickness) | $\lambda$max (nm) | External quantum efficiency |
|---|---|---|---|---|---|---|
| Comp. Ex. 1 | mCBP | Firpic (10%) | BAlq (40) | None | 471 | 5.3% |
| Comp. Ex. 2 | mCBP | Firpic (10%) | Exemplified compound 4 (40) | None | 470 | 3.8% |
| Comp. Ex. 3 | mCBP | XM-64 (10%) | BAlq (40) | None | 464 | 5.9% |
| Ex. 1 | mCBP | XM-64 (10%) | Exemplified compound 4 (40) | None | 463 | 8.0% |
| Comp. Ex 4 | mCBP | D-A4 | Exemplified compound 4 | None | 486 | 5.2% |
| Comp. Ex. 5 | mCBP | D-A5 | Exemplified compound 4 | None | 485 | 5.4% |
| Comp. Ex. 6 | mCBP | Firpic (10%) | BAlq (60) | None | 470 | 2.7% |
| Comp. Ex. 7 | mCBP | Firpic (10%) | Exemplified compound 4 (60) | None | 470 | 3.0% |
| Comp. Ex. 8 | mCBP | XM-64 (10%) | BAlq (60) | None | 465 | 5.0% |
| Ex. 2 | mCBP | XM-64 (10%) | Exemplified compound 4 (60) | None | 463 | 8.0% |
| Comp. Ex. 9 | mCBP | Firpic (10%) | BAlq (20) | None | 470 | 3.1% |
| Comp. Ex. 10 | mCBP | Firpic (10%) | Exemplified compound 4 (20) | None | 471 | 3.7% |

TABLE 1-continued

| Device | Host | Dopant (concentration) | First electron transporting material (film thickness) | Second electron transporting material (film thickness) | λmax (nm) | External quantum efficiency |
|---|---|---|---|---|---|---|
| Comp. Ex. 11 | mCBP | XM-64 (10%) | BAlq (20) | None | 464 | 5.3% |
| Ex. 3 | mCBP | XM-64 (10%) | Exemplified compound 4 (20) | None | 464 | 7.9% |
| Comp. Ex. 12 | mCBP | Firpic (10%) | BAlq (10) | Alq (30) | 471 | 5.0% |
| Comp. Ex. 13 | mCBP | Firpic (10%) | Exemplified compound 4 (10) | Alq (30) | 471 | 4.7% |
| Comp. Ex. 14 | mCBP | XM-64 (10%) | BAlq (10) | Alq (30) | 463 | 5.5% |
| Ex. 4 | mCBP | XM-64 (10%) | Exemplified compound 4 (10) | Alq (30) | 463 | 8.4% |
| Comp. Ex. 15 | mCBP | Firpic (10%) | BAlq (10) | BAlq (30) | 470 | 5.0% |
| Comp. Ex. 16 | mCBP | Firpic (10%) | Exemplified compound 4 (10) | BAlq (30) | 470 | 4.7% |
| Comp. Ex. 17 | mCBP | XM-64 (10%) | BAlq (10) | BAlq (30) | 462 | 5.5% |
| Ex. 5 | mCBP | XM-64 (10%) | Exemplified compound 4 (10) | BAlq (30) | 462 | 8.3% |

TABLE 2

| Device | Host | Dopant (concentration) | First electron transporting material (film thickness) | Second electron transporting material (film thickness) | λmax (nm) | External quantum efficiency |
|---|---|---|---|---|---|---|
| Comp. Ex. 18 | mCBP | Firpic (10%) | BAlq (40) | None | 471 | 5.2% |
| Comp. Ex 19 | mCBP | Firpic (10%) | Exemplified compound 38 (40) | None | 471 | 3.5% |
| Comp. Ex 20 | mCBP | XM-64 (10%) | BAlq (40) | None | 464 | 5.9% |
| Ex. 6 | mCBP | XM-64 (10%) | Exemplified compound 38 (40) | None | 464 | 8.1% |
| Comp. Ex 21 | mCBP | Firpic (10%) | BAlq (60) | None | 471 | 2.6% |
| Comp. Ex. 22 | mCBP | Firpic (10%) | Exemplified compound 38 (60) | None | 471 | 3.1% |
| Comp. Ex. 23 | mCBP | XM-64 (10%) | BAlq (60) | None | 463 | 5.1% |
| Ex. 7 | mCBP | XM-64 (10%) | Exemplified compound 38 (60) | None | 462 | 8.2% |
| Comp. Ex. 24 | mCBP | Firpic (10%) | BAlq (20) | None | 470 | 3.3% |
| Comp. Ex. 25 | mCBP | Firpic (10%) | Exemplified compound 38 (20) | None | 470 | 3.5% |
| Comp. Ex. 26 | mCBP | XM-64 (10%) | BAlq (20) | None | 464 | 5.4% |
| Ex. 8 | mCBP | XM-64 (10%) | Exemplified compound 38 (20) | None | 463 | 8.2% |
| Comp. Ex. 27 | mCBP | Firpic (10%) | BAlq (10) | Alq (30) | 471 | 4.5% |
| Comp. Ex. 28 | mCBP | Firpic (10%) | Exemplified compound 38 (10) | Alq (30) | 470 | 4.3% |
| Comp. Ex. 29 | mCBP | XM-64 (10%) | BAlq (10) | Alq (30) | 462 | 4.5% |
| Ex. 9 | mCBP | XM-64 (10%) | Exemplified compound 38 (10) | Alq (30) | 463 | 8.1% |
| Comp. Ex. 30 | mCBP | Firpic (10%) | BAlq (10) | BAlq (30) | 471 | 3.5% |
| Comp. Ex. 31 | mCBP | Firpic (10%) | Exemplified compound 38 (10) | BAlq (30) | 472 | 3.9% |
| Comp. Ex. 32 | mCBP | XM-64 (10%) | BAlq (10) | BAlq (30) | 463 | 5.6% |
| Ex. 10 | mCBP | XM-64 (10%) | Exemplified compound 38 (10) | BAlq (30) | 463 | 8.3% |

TABLE 3

| Device | Host | Dopant (concentration) | First electron transporting material (film thickness) | Second electron transporting material (film thickness) | λmax (nm) | External quantum efficiency |
|---|---|---|---|---|---|---|
| Comp. Ex. 33 | mCBP | Firpic (10%) | BAlq (40) | None | 471 | 4.7% |
| Comp. Ex. 34 | mCBP | Firpic (10%) | Exemplified compound 4 (40) | None | 471 | 3.9% |
| Comp. Ex. 35 | mCBP | XM-63 (10%) | BAlq (40) | None | 462 | 3.6% |
| Ex. 11 | mCBP | XM-63 (10%) | Exemplified compound 4 (40) | None | 462 | 7.5% |
| Comp. Ex. 36 | mCBP | Firpic (10%) | BAlq (60) | None | 471 | 3.3% |
| Comp. Ex. 37 | mCBP | Firpic (10%) | Exemplified compound 4 (60) | None | 472 | 3.3% |
| Comp. Ex. 38 | mCBP | XM-63 (10%) | BAlq (60) | None | 463 | 4.0% |
| Ex. 12 | mCBP | XM-63 (10%) | Exemplified compound 4 (60) | None | 462 | 7.5% |
| Comp. Ex. 39 | mCBP | Firpic (10%) | BAlq (20) | None | 470 | 3.1% |
| Comp. Ex. 40 | mCBP | Firpic (10%) | Exemplified compound 4 (20) | None | 470 | 3.6% |
| Comp. Ex. 41 | mCBP | XM-63 (10%) | BAlq (20) | None | 462 | 5.2% |
| Ex. 13 | mCBP | XM-63 (10%) | Exemplified compound 4 (20) | None | 462 | 7.9% |
| Comp. Ex. 42 | mCBP | Firpic (10%) | BAlq (10) | Alq (30) | 471 | 5.1% |
| Comp. Ex. 43 | mCBP | Firpic (10%) | Exemplified compound 4 (10) | Alq (30) | 470 | 4.8% |
| Comp. Ex. 44 | mCBP | XM-63 (10%) | BAlq (10) | Alq (30) | 462 | 5.2% |
| Ex. 14 | mCBP | XM-63 (10%) | Exemplified compound 4 (10) | Alq (30) | 462 | 8.2% |
| Comp. Ex. 45 | mCBP | Firpic (10%) | BAlq (10) | BAlq (30) | 471 | 4.5% |
| Comp. Ex. 46 | mCBP | Firpic (10%) | Exemplified compound 4 (10) | BAlq (30) | 470 | 4.7% |
| Comp. Ex. 47 | mCBP | XM-63 (10%) | BAlq (10) | BAlq (30) | 462 | 5.5% |
| Ex. 15 | mCBP | XM-63 (10%) | Exemplified compound 4 (10) | BAlq (30) | 462 | 8.2% |

TABLE 4

| Device | Host | Dopant (concentration) | First electron transporting material (film thickness) | Second electron transporting material (film thickness) | λmax (nm) | External quantum efficiency |
|---|---|---|---|---|---|---|
| Ex. 1 | mCBP | XM-64 (10%) | Exemplified compound 4 (40) | None | 463 | 8.0% |
| Ex. 16 | mCBP | XM-64 (10%) | Exemplified compound 104 (40) | None | 463 | 7.8% |
| Ex. 17 | mCBP | XM-63 (10%) | Exemplified compound 40 (40) | None | 463 | 7.7% |
| Ex. 18 | mCBP | XM-64 (10%) | Exemplified compound 69 (10) | BAlq (30) | 463 | 7.8% |
| Ex. 19 | mCBP | XM-66 (10%) | Exemplified compound 4 (40) | None | 462 | 6.9% |
| Ex. 20 | mCBP | XM-67 (10%) | Exemplified compound 4 (40) | None | 460 | 6.5% |
| Ex. 21 | mCBP | XM-68 (10%) | Exemplified compound 4 (40) | None | 460 | 6.1% |
| Ex. 22 | mCBP | XM-65 (10%) | Exemplified compound 4 (30) | BAlq (30) | 462 | 7.1% |
| Ex. 23 | H-1 | XM-64 (10%) | Exemplified compound 4 (40) | None | 463 | 7.7% |
| Ex. 24 | H-2 | XM-63 (10%) | Exemplified compound 40 (30) | Alq (10) | 462 | 7.8% |
| Ex. 25 | H-2 | XM-63 (10%) | Exemplified compound 40 (20) | Alq (20) | 462 | 7.8% |
| Ex. 26 | H-2 | XM-63 (10%) | Exemplified compound 101 (30) | Alq (10) | 462 | 7.8% |
| Ex. 27 | H-2 | XM-63 (10%) | Exemplified compound 101 (20) | Alq (20) | 462 | 7.9% |

TABLE 4-continued

| Device | Host | Dopant (concentration) | First electron transporting material (film thickness) | Second electron transporting material (film thickness) | λmax (nm) | External quantum efficiency |
|---|---|---|---|---|---|---|
| Ex. 28 | H-2 | XM-63 (10%) | Exemplified compound 102 ( 30) | Alq (10) | 462 | 7.9% |
| Ex. 29 | H-2 | XM-63 (10%) | Exemplified compound 102 (20) | Alq (20) | 462 | 8.0% |
| Ex. 30 | H-2 | XM-63 (10%) | Exemplified compound 112 (30) | Alq (10) | 462 | 7.2% |
| Ex. 31 | H-2 | XM-63 (10%) | Exemplified compound 112 (20) | BAlq (20) | 462 | 7.3% |
| Ex. 32 | H-2 | XM-63 (10%) | Exemplified compound 114 (30) | BAlq (10) | 461 | 7.4% |
| Ex. 33 | H-2 | XM-63 (10%) | Exemplified compound 114 ( 20) | BAlq (20) | 462 | 7.5% |

(Evaluation of Performance of Organic Electroluminescence Device)

The performance of each of the devices thus obtained was evaluated.

(a) External Quantum Efficiency

Each device is made to emit light through the application of a direct-current voltage by means of Source Measure Unit 2400 made by TOYO Corporation, and the intensity of the light is measured with a luminance meter BM-8 made by TOPCON CORPORATION. And the luminous spectrum and the luminous wavelength are measured with a Spectral Analyzer PMA-11 made by Hamamatsu Photonics K.K. On the basis of these data, the external quantum efficiency at a luminance of about 1,000 cd/m$^2$ is calculated according to a luminance conversion method.

It has been found from the results in Tables 1 to 4 that the devices of the invention having an electron transporting layer containing the compound represented by the formula (1) and a light emitting layer using the specified phosphorescent complex materials are excellent in external quantum efficiency and have less dependence on the thickness of the electron transporting layer, compared with the devices of Comparative Examples.

In the case of light emission apparatuses, display apparatuses, and illumination apparatuses, each pixel portion is required to instantaneously emit high-intensity light by applying a high current density. The electroluminescence device of the invention is designed to have a high luminous efficiency in such a case so that it can be used advantageously.

In addition, since the device of the invention is excellent in luminous efficiency and durability even when used under high temperature environments such as use for vehicles, it is suited for light emission apparatuses, display apparatuses, and illumination apparatuses.

The structures of the compounds used in Examples and Comparative Examples are shown below.

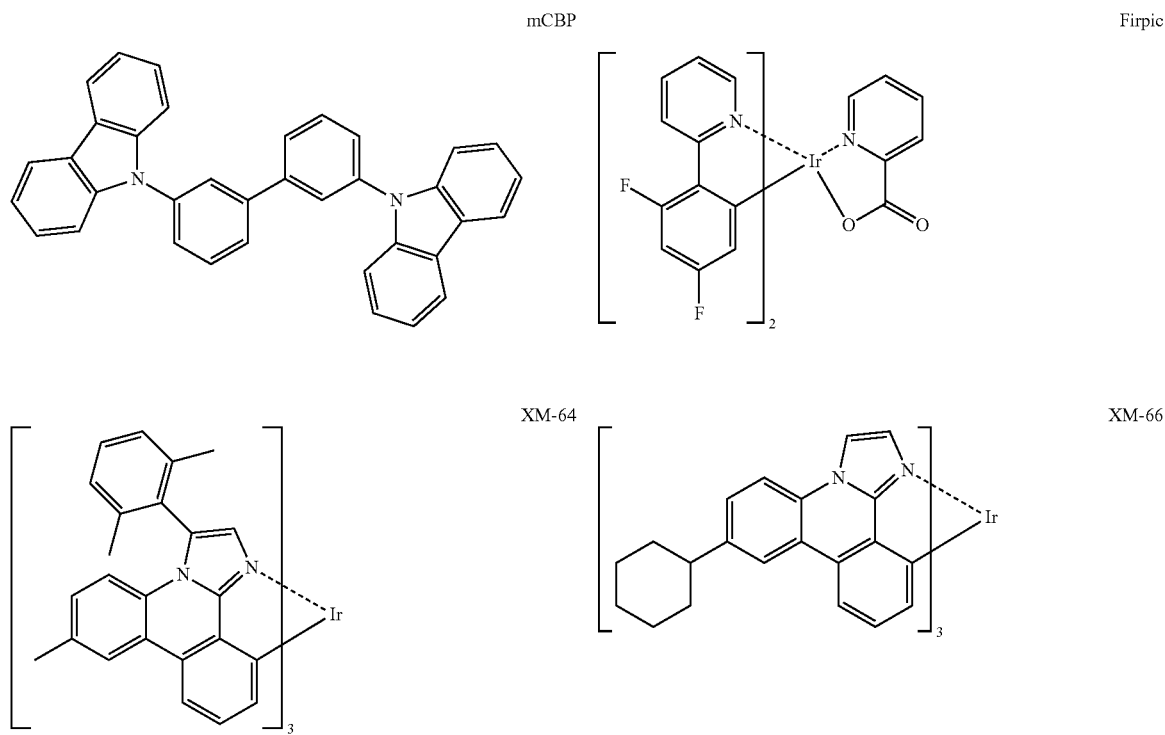

-continued
XM-63
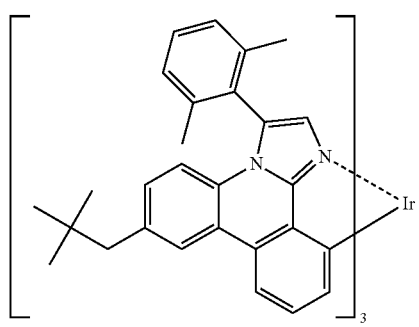
XM-65
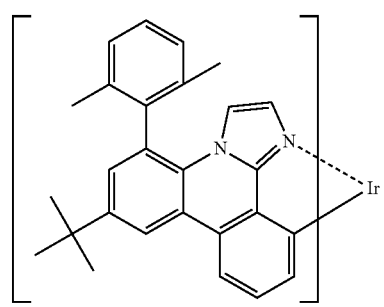
XM-67
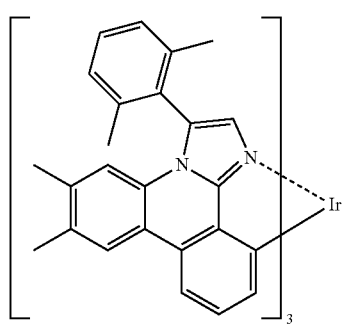
XM-68
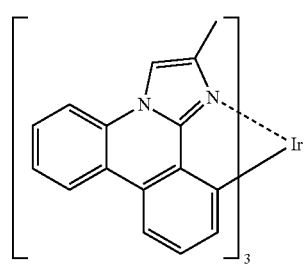
D-A4
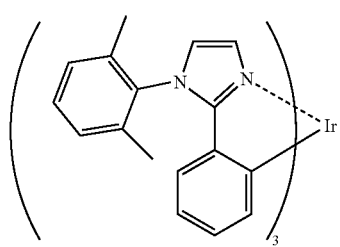
D-A5
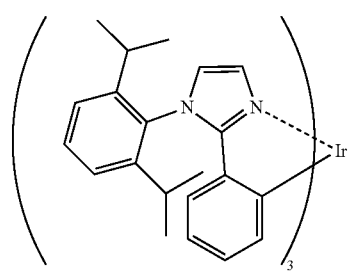
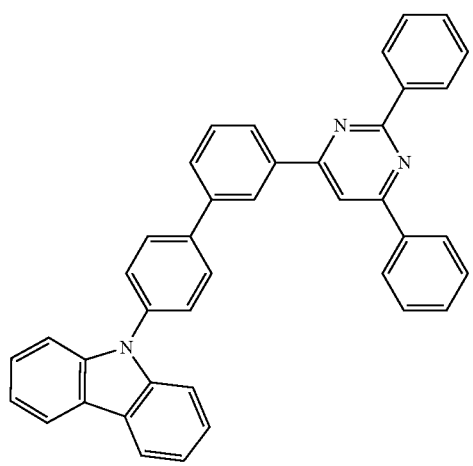

-continued
111
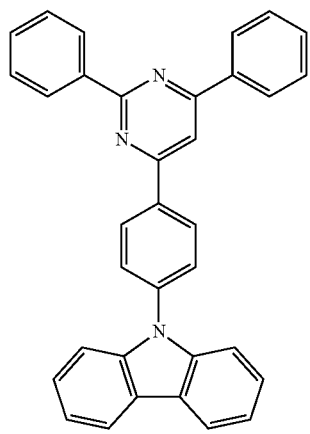
38
112
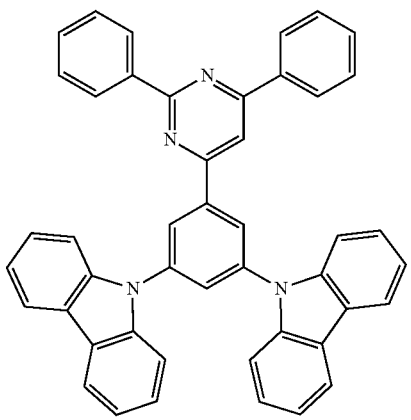
40
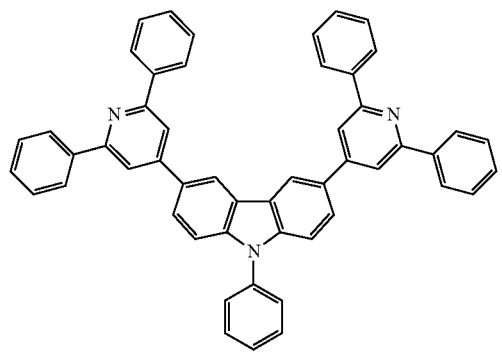
69
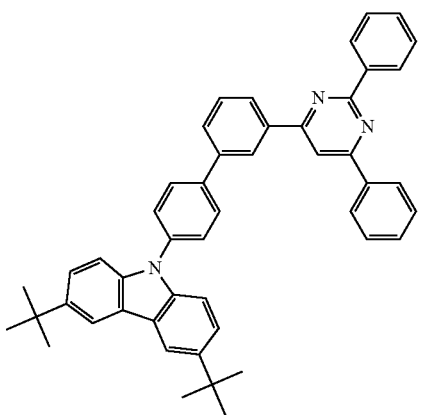
101
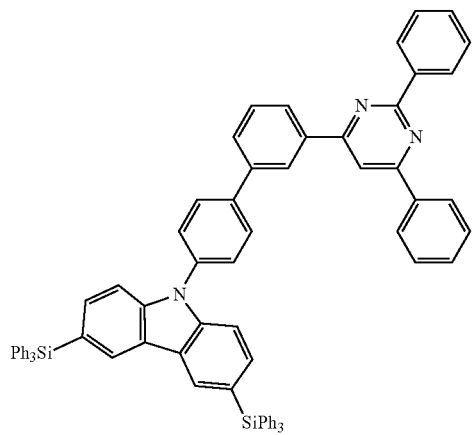
102
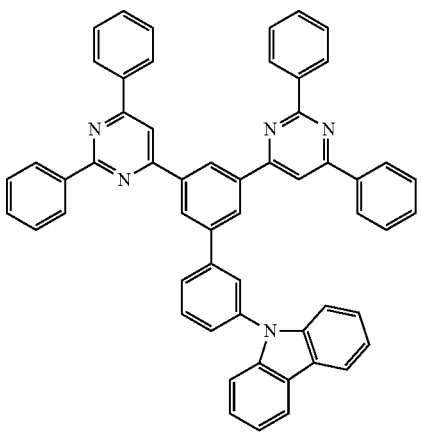
104

112
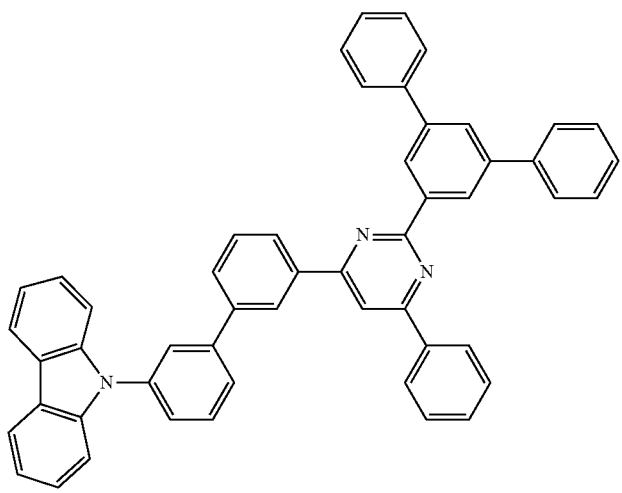
114
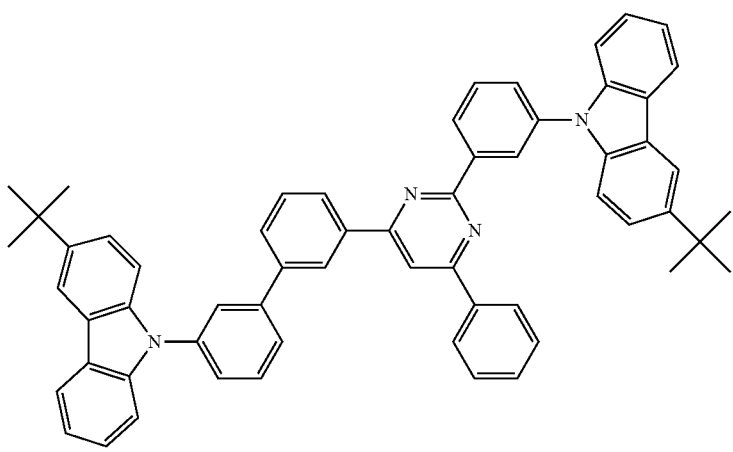
CuPc
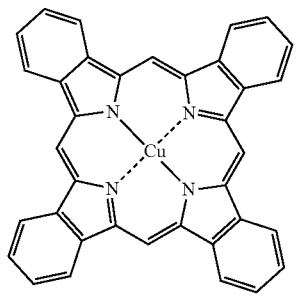
NPD
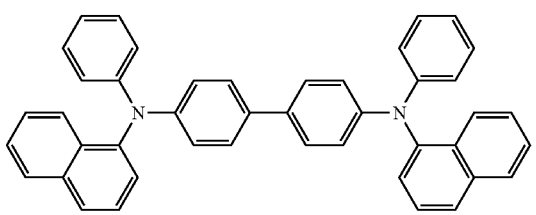
Alq
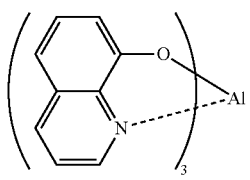
BAlq
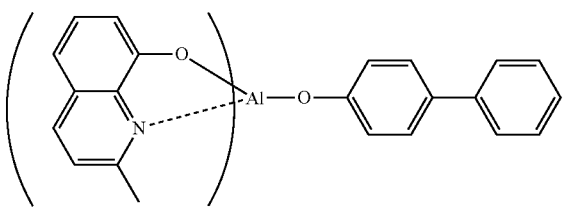

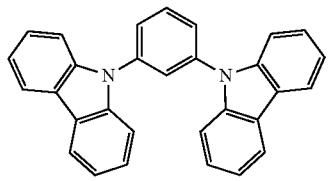

H-1

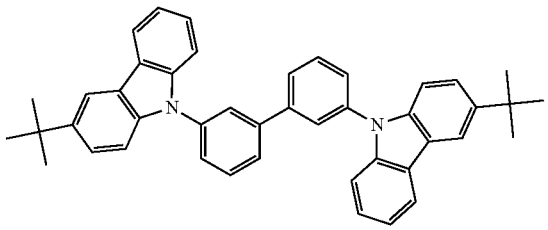

H-2

INDUSTRIAL APPLICABILITY

According to the present invention, an organic electroluminescence device having an excellent luminous efficiency and has a small dependence of the luminous efficiency on the thickness of the electron transporting layer, and a light luminous apparatus having such an organic electroluminescence device can be provided.

This application is based on Japanese patent application Nos. 2009-180225 filed on Jul. 31, 2009, and 2009-221664 filed on Sep. 25, 2009, the entire content of which is hereby incorporated by reference, the same as if set forth at length.

REFERENCE SIGNS LIST

2 . . . Substrate
3 . . . Anode
4 . . . Hole injection layer
5 . . . Hole transporting layer
6 . . . Light emitting layer
7 . . . Hole blocking layer
8 . . . Electron transporting layer
9 . . . Cathode
10 . . . Organic electroluminescence device (Organic EL device)
11 . . . Organic Layer
12 . . . Protective Layer
14 . . . Adhesive Layer
16 . . . Sealing enclosure
20 . . . Light luminous apparatus
30 . . . Light scattering member
30A . . . Light incidence plane
30B . . . Light exit plane
32 . . . Fine particles
40 . . . Illumination apparatus

The invention claimed is:

1. An organic electro luminescence device, comprising on a substrate: a pair of electrodes and at least one organic layer including a light emitting layer between the electrodes, wherein the light emitting layer includes an iridium complex selected from the group consisting of:

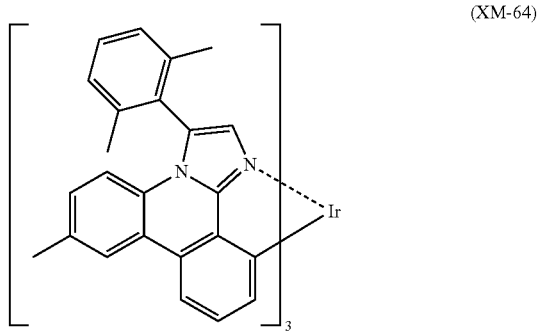

(XM-64)

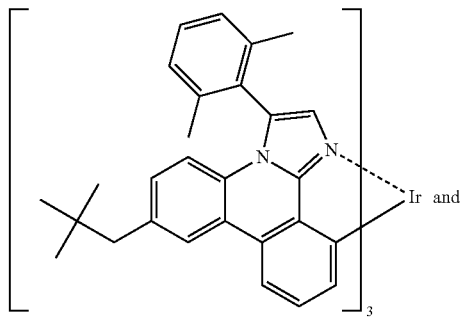

(XM-63)

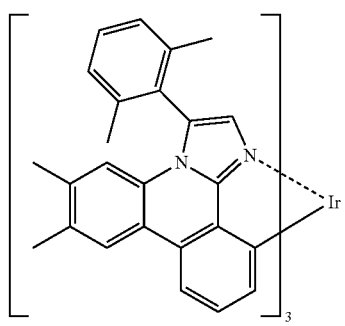

(XM-67)

and the organic electrolumineseenee device further comprises another organic layer between the light emitting layer and a cathode, the another organic layer containing a compound represented by the following formula (3):

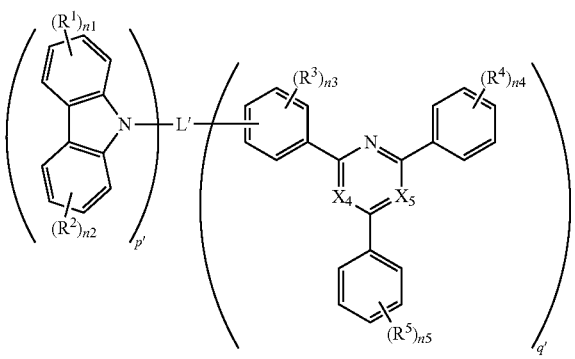

(3)

wherein each of $X_4$ and $X_5$ independently represents a nitrogen atom or a carbon atom, and a ring containing $X_4$ and $X_5$ is a pyridine or a pyrimidine; L' represents a phenylene or a biphenylene; each of $R^1$ to $R^5$ independently represents a fluorine atom, a t-butyl group, a phenyl group, a cyano group, a triphenylsilyl group, or a carbazolyl group; $R^4$ represents a fluorine atom, a t-butyl group, or a triphenylsilyl group; each of n1 to n5 independently represents an integer 0 or 1; and each of p' and q' independently represents an integer 1 or 2.

2. The organic electro luminescence device according to claim 1, wherein the compound represented by the formula (3) is composed only of a carbon atom, a hydrogen atom, and a nitrogen atom.

3. The organic electro luminescence device according to claim 1, wherein a molecular weight of the compound represented by the formula (3) is from 450 to 800.

4. The organic electro luminescence device according to claim 1, wherein the compound represented by the formula (3) has the lowest triplet excited state $t_1$ energy of from 2.61 ev to 3.51 ev in a film state.

5. The organic electro luminescence device according to claim 1, wherein the compound represented by the formula (3) is contained in a layer adjacent to the light emitting layer.

6. The organic electro luminescence device according to claim 1, having a maximum emission wavelength of from 400 nm to 465 nm.

7. The organic electro luminescence device according to claim 1, wherein the content of a light emitting material in the light emitting layer is from 10 to 30% by mass.

8. A light emission apparatus using the organic electro luminescence device according to claim 1.

9. A display apparatus using the organic electro luminescence device according to claim 1.

10. An illumination apparatus using the organic electroluminescence device according to claim 1.

* * * * *